(12) United States Patent
Yoda et al.

(10) Patent No.: US 11,990,168 B2
(45) Date of Patent: May 21, 2024

(54) MAGNETIC DEVICE AND ARITHMETIC DEVICE

(71) Applicant: YODA-S, Inc., Tsukuba (JP)

(72) Inventors: Hiroaki Yoda, Tsukuba (JP); Yuichi Ohsawa, Tsukuba (JP); Yushi Kato, Tsukuba (JP); Tomomi Yoda, Tsukuba (JP)

(73) Assignee: SP-AITH LIMITED, Sheung Wan (HK)

( * ) Notice: Subject to any disclaimer, the term of this patent is extended or adjusted under 35 U.S.C. 154(b) by 42 days.

(21) Appl. No.: 17/721,683

(22) PCT Filed: Oct. 8, 2020

(86) PCT No.: PCT/JP2020/038094
§ 371 (c)(1),
(2) Date: Apr. 15, 2022

(87) PCT Pub. No.: WO2021/075343
PCT Pub. Date: Apr. 22, 2021

(65) Prior Publication Data
US 2022/0399048 A1    Dec. 15, 2022

(30) Foreign Application Priority Data

Oct. 17, 2019  (JP) ................................. 2019-190364
Mar. 11, 2020  (JP) ................................. 2020-041778
Mar. 26, 2020  (JP) ................................. 2020-056604

(51) Int. Cl.
*G11C 11/16* (2006.01)

(52) U.S. Cl.
CPC .......... *G11C 11/165* (2013.01); *G11C 11/161* (2013.01)

(58) Field of Classification Search
CPC .............................. G11C 11/165; G11C 11/16
(Continued)

(56) References Cited

U.S. PATENT DOCUMENTS

2014/0056060 A1   2/2014 Khvalkovskiy et al.
2018/0145691 A1*  5/2018 Manipatruni ....... G11C 11/1673
(Continued)

FOREIGN PATENT DOCUMENTS

| JP | 2014-45196 A | 3/2014 |
|---|---|---|
| JP | 6545853 B1 | 7/2019 |
| JP | 2019-164870 A | 9/2019 |

*Primary Examiner* — Muna A Techane
(74) *Attorney, Agent, or Firm* — Finnegan, Henderson, Farabow, Garrett & Dunner, LLP

(57) ABSTRACT

According to one embodiment, a magnetic device includes first and second conductive portions, first and second stacked bodies, and a controller. The first conductive portion includes first to third region. The third region is between the first and second regions. The first stacked body includes first and second magnetic layers. The second magnetic layer is between the third region and the first magnetic layer. The second conductive portion includes fourth to sixth regions. The sixth region is between the fourth and fifth regions. The second stacked body includes third and fourth magnetic layers. The fourth magnetic layer is between the sixth region and the third magnetic layer. The first stacked body is configured to be in a first low or high electrical resistance state. The second stacked body is configured to be in a second low high electrical resistance state.

20 Claims, 56 Drawing Sheets

(58) Field of Classification Search
USPC .......................................................... 365/158
See application file for complete search history.

(56) References Cited

U.S. PATENT DOCUMENTS

| | | | | |
|---|---|---|---|---|
| 2018/0174635 A1* | 6/2018 | Yoda | ................... | G11C 11/1673 |
| 2019/0051820 A1* | 2/2019 | Sugiyama | .............. | H10B 61/22 |
| 2019/0295619 A1* | 9/2019 | Inokuchi | ............. | G11C 11/1675 |
| 2020/0168790 A1* | 5/2020 | Oikawa | .................. | H10N 50/80 |

* cited by examiner

| Input 1 | Input 2 | Output |
|---|---|---|
| 0 | 0 | 0 |
| 0 | 1 | 0 |
| 1 | 0 | 0 |
| 1 | 1 | 1 |

FIG. 4A

| Input 1 | Input 2 | Output |
|---|---|---|
| 0 | 0 | 1 |
| 0 | 1 | 0 |
| 1 | 0 | 0 |
| 1 | 1 | 0 |

FIG. 4B

| Input 1 | Input 2 | Output |
|---|---|---|
| 0 | 0 | 1 |
| 0 | 1 | 0 |
| 1 | 0 | 0 |
| 1 | 1 | 1 |

FIG. 4C

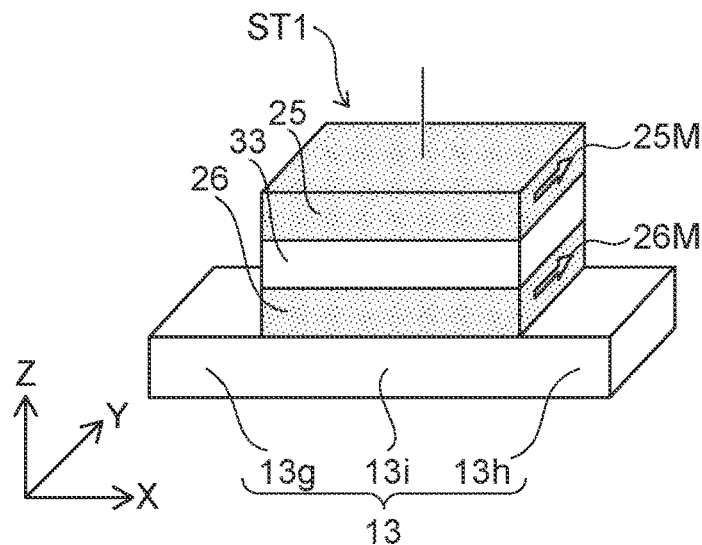
FIG. 6A
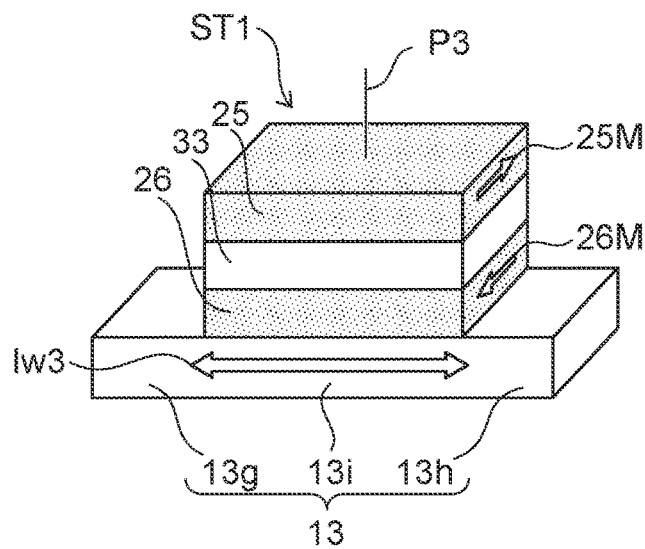
FIG. 6B
| Value 1 | Value 2 | Output |
|---------|---------|--------|
| 0 | 0 | 0 |
| 0 | 1 | 1 |
| 1 | 0 | 1 |
| 1 | 1 | 1 |
FIG. 6C

411

|  | "0" | | "1" | |
|---|---|---|---|---|
|  | MGD | | | |
|  | SB1 | SB2 | SB1 | SB2 |
|  | P (L) | P (L) | P (L) | AP (H) |
|  | AP (H) | AP (H) | | |
| INPUT1 | Iw | | | |
|  | I12 | I45 | I21 | I54 |
| INPUT2 | VSB | | | |
|  | + (Vd1) | - (Va4) | - (Va2) | + (Vd3) |

FIG. 22A

| MG0 | |
|---|---|
| SB1 | SB2 |
| P (L) | AP (H) |

| INPUT1 | MG1 | | INPUT2 | MGR | |
|---|---|---|---|---|---|
|  | SB1 | SB2 |  | SB1 | SB2 |
| 0 | P | AP | 0 | P | AP |
| 0 | P | AP | 1 | AP | AP |
| 1 | P | AP | 0 | P | P |
| 1 | P | AP | 1 | P | AP |

| MGR | | RJ | |
|---|---|---|---|
| SB1 | SB2 | VD | |
| P | AP | ≠Va/2  0.25Va | 1 |
| AP | AP | Va/2 | 0 |
| P | P | Va/2 | 0 |
| P | AP | ≠Va/2  0.25Va | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I12 | I45 | I21 | I54 |
| INPUT2 | VSB | | | |
|  | - (Va2) | + (Vd3) | + (Vd1) | - (Va4) |

| MG0 | |
|---|---|
| SB1 | SB2 |
| P (L) | AP (H) |

| INPUT1 | MG1 | | INPUT2 | MGR | |
|---|---|---|---|---|---|
|  | SB1 | SB2 |  | SB1 | SB2 |
| 0 | P | AP | 0 | AP | AP |
| 0 | P | AP | 1 | P | AP |
| 1 | P | AP | 0 | P | AP |
| 1 | P | AP | 1 | P | P |

| MGR | | RJ | |  |
|---|---|---|---|---|
| SB1 | SB2 | VD | |  |
| AP | AP | Va/2 | | 1 |
| P | AP | ≠Va/2 | 0.25Va | 0 |
| P | AP | ≠Va/2 | 0.25Va | 0 |
| P | P | Va/2 | | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I21 | I54 | I12 | I45 |
| INPUT2 | VSB | | | |
|  | + (Vd1) | - (Va4) | - (Va2) | + (Vd3) |

FIG. 26A

| MG0 | |
|---|---|
| SB1 | SB2 |
| P (L) | AP (H) |

| INPUT1 | MG1 | | INPUT2 | MGR | |
|---|---|---|---|---|---|
|  | SB1 | SB2 |  | SB1 | SB2 |
| 0 | P | AP | 0 | P | P |
| 0 | P | AP | 1 | P | AP |
| 1 | P | AP | 0 | P | AP |
| 1 | P | AP | 1 | AP | AP |

| MGR | | RJ | |
|---|---|---|---|
| SB1 | SB2 | VD | |
| P | P | Va/2 | 1 |
| P | AP | ≠Va/2  0.25Va | 0 |
| P | AP | ≠Va/2  0.25Va | 0 |
| AP | AP | Va/2 | 1 |

|  | "0" | | "1" | |
|---|---|---|---|---|
| | MGD | | | |
| | SB1 | SB2 | SB1 | SB2 |
| | P (L) | AP (H) | P (L) | P (L) |
| | | | AP (H) | AP (H) |
| INPUT1 | Iw | | | |
| | I21 | I54 | I12 | I45 |
| INPUT2 | VSB | | | |
| | - (Va2) | + (Vd3) | + (Vd1) | - (Va4) |

FIG. 28A

| MG0 | |
|---|---|
| SB1 | SB2 |
| P (L) | AP (H) |

| INPUT1 | MG1 | | INPUT2 | MGR | |
|---|---|---|---|---|---|
| | SB1 | SB2 | | SB1 | SB2 |
| 0 | P | AP | 0 | P | AP |
| 0 | P | AP | 1 | P | P |
| 1 | P | AP | 0 | AP | AP |
| 1 | P | AP | 1 | P | AP |

| MGR | | RJ | | |
|---|---|---|---|---|
| SB1 | SB2 | VD | | |
| P | AP | ≠Va/2 | 0.25Va | 1 |
| P | P | Va/2 | | 0 |
| AP | AP | Va/2 | | 0 |
| P | AP | ≠Va/2 | 0.25Va | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I12 | I54 | I21 | I45 |
| INPUT2 | VSB | | | |
|  | + (Vd1) | - (Va4) | - (Va2) | + (Vd3) |

| MG0 | |
|---|---|
| SB1 | SB2 |
| P (L) | P (L) |

| INPUT1 | MG1 | | INPUT2 | MGR | |
|---|---|---|---|---|---|
|  | SB1 | SB2 |  | SB1 | SB2 |
| 0 | P | P | 0 | P | P |
| 0 | P | P | 1 | AP | P |
| 1 | P | P | 0 | P | AP |
| 1 | P | P | 1 | P | P |

| MGR | | RJ | |
|---|---|---|---|
| SB1 | SB2 | VD | |
| P | P | Va/2 | 1 |
| AP | P | ≠Va/2  0.75Va | 0 |
| P | AP | ≠Va/2  0.25Va | 0 |
| P | P | Va/2 | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I12 | I54 | I21 | I45 |
| INPUT2 | VSB | | | |
|  | + (Vd1) | - (Va4) | - (Va2) | + (Vd3) |

FIG. 32A

| MG0 | |
|---|---|
| SB1 | SB2 |
| AP (H) | AP (H) |

| INPUT1 | MG1 | | INPUT2 | MGR | |
|---|---|---|---|---|---|
|  | SB1 | SB2 |  | SB1 | SB2 |
| 0 | AP | AP | 0 | AP | P |
| 0 | AP | AP | 1 | AP | AP |
| 1 | AP | AP | 0 | AP | AP |
| 1 | AP | AP | 1 | P | AP |

| MGR | | RJ | |  |
|---|---|---|---|---|
| SB1 | SB2 | VD | |  |
| AP | P | ≠Va/2 | 0.75Va | 1 |
| AP | AP | Va/2 | | 0 |
| AP | AP | Va/2 | | 0 |
| P | AP | ≠Va/2 | 0.25Va | 1 |

| | "0" | | "1" | |
|---|---|---|---|---|
| | MGD | | | |
| | SB1 | SB2 | SB1 | SB2 |
| | P (L) | AP (H) | P (L) | P (L) |
| | | | AP (H) | AP (H) |
| INPUT1 | Iw | | | |
| | I12 | I54 | I21 | I45 |
| INPUT2 | VSB | | | |
| | - (Va2) | + (Vd3) | + (Vd1) | - (Va4) |

| MG0 | |
|---|---|
| SB1 | SB2 |
| AP (H) | AP (H) |

| INPUT1 | MG1 | | INPUT2 | MGR | |
|---|---|---|---|---|---|
| | SB1 | SB2 | | SB1 | SB2 |
| 0 | P | P | 0 | P | P |
| 0 | P | P | 1 | AP | P |
| 1 | P | P | 0 | P | AP |
| 1 | P | P | 1 | P | P |

| MGR | | RJ | |
|---|---|---|---|
| SB1 | SB2 | VD | |
| P | P | Va/2 | 1 |
| AP | P | ≠Va/2  0.75Va | 0 |
| P | AP | ≠Va/2  0.25Va | 0 |
| P | P | Va/2 | 1 |

|  | "0" | | "1" | |
|---|---|---|---|---|
|  | MGD | | | |
|  | SB1 | SB2 | SB1 | SB2 |
|  | P (L) | P (L) | AP (H) | P (L) |
|  |  |  | P (L) | AP (H) |
| INPUT1 | Iw | | | |
|  | I12 | I54 | I21 | I45 |
| INPUT2 | VSB | | | |
|  | −(Va2) | +(Vd3) | +(Vd1) | −(Va4) |

| MG0 | |
|---|---|
| SB1 | SB2 |
| P (L) | P (L) |

| INPUT1 | MG1 | | INPUT2 | MGR | |
|---|---|---|---|---|---|
|  | SB1 | SB2 |  | SB1 | SB2 |
| 0 | P | P | 0 | AP | P |
| 0 | P | P | 1 | P | P |
| 1 | P | P | 0 | P | P |
| 1 | P | P | 1 | P | AP |

| MGR | | RJ | |
|---|---|---|---|
| SB1 | SB2 | VD | |
| AP | P | ≠Va/2  0.75Va | 1 |
| P | P | Va/2 | 0 |
| P | P | Va/2 | 0 |
| P | AP | ≠Va/2  0.25Va | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I12 | I45 | I21 | I54 |
| INPUT2 | VSB | | | |
|  | + (Vd1) | - (Va4) | - (Va2) | + (Vd3) |

FIG. 38A

| MG0 | |
|---|---|
| SB1 | SB2 |
| AP (H) | P (L) |

| INPUT1 | MG1 | | INPUT2 | MGR | |
|---|---|---|---|---|---|
|  | SB1 | SB2 |  | SB1 | SB2 |
| 0 | AP | P | 0 | P | P |
| 0 | AP | P | 1 | P | AP |
| 1 | AP | P | 0 | P | AP |
| 1 | AP | P | 1 | AP | AP |

| MGR | | RJ | |
|---|---|---|---|
| SB1 | SB2 | VD | |
| P | P | Va/2 | 1 |
| P | AP | ≠Va/2  0.25Va | 0 |
| P | AP | ≠Va/2  0.25Va | 0 |
| AP | AP | Va/2 | 1 |

|  | "0" | | "1" | |
|---|---|---|---|---|
|  | MGD | | | |
|  | SB1 | SB2 | SB1 | SB2 |
|  | P (L) | P (L) | P (L) | AP (H) |
|  | AP (H) | AP (H) | | |
| INPUT1 | Iw | | | |
|  | I21 | I54 | I12 | I45 |
| INPUT2 | VSB | | | |
|  | - (Va2) | + (Vd3) | + (Vd1) | - (Va4) |

FIG. 40A

| MG0 | |
|---|---|
| SB1 | SB2 |
| P (L) | AP (H) |

| INPUT1 | MG1 | | INPUT2 | MGR | |
|---|---|---|---|---|---|
|  | SB1 | SB2 |  | SB1 | SB2 |
| 0 | P | AP | 0 | P | AP |
| 0 | P | AP | 1 | P | P |
| 1 | P | AP | 0 | AP | AP |
| 1 | P | AP | 1 | P | AP |

| MGR | | RJ | |
|---|---|---|---|
| SB1 | SB2 | VD | |
| P | AP | ≠Va/2  0.25Va | 1 |
| P | P | Va/2 | 0 |
| AP | AP | Va/2 | 0 |
| P | AP | ≠Va/2  0.25Va | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I12 | I54 | I21 | I45 |
| INPUT2 | VSB | | | |
|  | + (Vd1) | − (Va4) | − (Va2) | + (Vd3) |

FIG. 42A

| MG0 | |
|---|---|
| SB1 | SB2 |
| P (L) | AP (H) |

| INPUT1 | MG1 | | INPUT2 | MGR | |
|---|---|---|---|---|---|
|  | SB1 | SB2 |  | SB1 | SB2 |
| 0 | P | AP | 0 | P | P |
| 0 | P | AP | 1 | AP | P |
| 1 | P | AP | 0 | P | AP |
| 1 | P | AP | 1 | P | P |

| MGR | | RJ | |
|---|---|---|---|
| SB1 | SB2 | VD | |
| P | P | Va/2 | 1 |
| AP | P | ≠Va/2  0.75Va | 0 |
| P | AP | ≠Va/2  0.25Va | 0 |
| P | P | Va/2 | 1 |

|  | "0" | | "1" | |
|---|---|---|---|---|
|  | MGD | | | |
|  | SB1 | SB2 | SB1 | SB2 |
|  | AP (H) | AP (H) | AP (H) | P (L) |
|  |  |  | P (L) | AP (H) |
| INPUT1 | Iw | | | |
|  | I12 | I54 | I21 | I45 |
| INPUT2 | VSB | | | |
|  | + (Vd1) | - (Va4) | - (Va2) | + (Vd3) |

| MG0 | |
|---|---|
| SB1 | SB2 |
| AP (H) | AP (H) |

| INPUT1 | MG1 | | INPUT2 | MGR | |
|---|---|---|---|---|---|
|  | SB1 | SB2 |  | SB1 | SB2 |
| 0 | AP | AP | 0 | AP | P |
| 0 | AP | AP | 1 | AP | AP |
| 1 | AP | AP | 0 | AP | AP |
| 1 | AP | AP | 1 | P | AP |

| MGR | | RJ | |
|---|---|---|---|
| SB1 | SB2 | VD | |
| AP | P | ≠Va/2  0.75Va | 1 |
| AP | AP | Va/2 | 0 |
| AP | AP | Va/2 | 0 |
| P | AP | ≠Va/2  0.25Va | 1 |

|  | "0" | | "1" | |
|---|---|---|---|---|
|  | MGD | | | |
|  | SB1 | SB2 | SB1 | SB2 |
|  | P (L) | P (L) | P (L) | AP (H) |
|  |  |  | AP (H) | P (L) |
| INPUT1 | Iw | | | |
|  | I21 | I45 | I12 | I54 |
| INPUT2 | VSB | | | |
|  | + (Vd1) | - (Va4) | - (Va2) | + (Vd3) |

| MG0 | |
|---|---|
| SB1 | SB2 |
| P (L) | P (L) |

| INPUT1 | MG1 | | INPUT2 | MGR | |
|---|---|---|---|---|---|
|  | SB1 | SB2 |  | SB1 | SB2 |
| 0 | P | P | 0 | P | AP |
| 0 | P | P | 1 | P | P |
| 1 | P | P | 0 | P | P |
| 1 | P | P | 1 | AP | P |

| MGR | | RJ | |
|---|---|---|---|
| SB1 | SB2 | VD | |
| P | AP | ≠Va/2  0.25Va | 1 |
| P | P | Va/2 | 0 |
| P | P | Va/2 | 0 |
| AP | P | ≠Va/2  0.75Va | 1 |

| | "0" | | "1" | |
|---|---|---|---|---|
| | MGD | | | |
| | SB1 | SB2 | SB1 | SB2 |
| | P (L) | AP (H) | AP (H) | AP (H) |
| | AP (H) | P (L) | | |
| INPUT1 | Iw | | | |
| | I21 | I45 | I12 | I54 |
| INPUT2 | VSB | | | |
| | + (Vd1) | - (Va4) | - (Va2) | + (Vd3) |

FIG. 48A

| MG0 | |
|---|---|
| SB1 | SB2 |
| AP (H) | AP (H) |

| INPUT1 | MG1 | | INPUT2 | MGR | |
|---|---|---|---|---|---|
| | SB1 | SB2 | | SB1 | SB2 |
| 0 | AP | AP | 0 | AP | AP |
| 0 | AP | AP | 1 | P | AP |
| 1 | AP | AP | 0 | AP | P |
| 1 | AP | AP | 1 | AP | AP |

| MGR | | RJ | |
|---|---|---|---|
| SB1 | SB2 | VD | |
| AP | AP | Va/2 | 1 |
| P | AP | ≠Va/2  0.25Va | 0 |
| AP | P | ≠Va/2  0.75Va | 0 |
| AP | AP | Va/2 | 1 |

| | "0" | | "1" | |
|---|---|---|---|---|
| | MGD | | | |
| | SB1 | SB2 | SB1 | SB2 |
| | P (L) | AP (H) | P (L) | P (L) |
| | | | AP (H) | AP (H) |
| INPUT1 | Iw | | | |
| | I12 | I54 | I21 | I45 |
| INPUT2 | VSB | | | |
| | + (Vd1) | − (Va4) | − (Va2) | + (Vd3) |

| MG0 | |
|---|---|
| SB1 | SB2 |
| AP (H) | AP (H) |

| INPUT1 | MG1 | | INPUT2 | MGR | |
|---|---|---|---|---|---|
| | SB1 | SB2 | | SB1 | SB2 |
| 0 | AP | AP | 0 | P | P |
| 0 | AP | AP | 1 | P | AP |
| 1 | AP | AP | 0 | P | AP |
| 1 | AP | AP | 1 | AP | AP |

| MGR | | RJ | |
|---|---|---|---|
| SB1 | SB2 | VD | |
| P | P | Va/2 | 1 |
| P | AP | ≠Va/2  0.25Va | 0 |
| P | AP | ≠Va/2  0.25Va | 0 |
| AP | AP | Va/2 | 1 |

|  | "0" | | "1" | |
|---|---|---|---|---|
|  | MGD | | | |
|  | SB1 | SB2 | SB1 | SB2 |
|  | P (L) | AP (H) | P (L) | P (L) |
|  |  |  | AP (H) | AP (H) |
| INPUT1 | Iw | | | |
|  | I21 | I45 | I12 | I54 |
| INPUT2 | VSB | | | |
|  | + (Vd1) | - (Va4) | - (Va2) | + (Vd3) |

FIG. 52A

| MG0 | |
|---|---|
| SB1 | SB2 |
| P (L) | P (L) |

| INPUT1 | MG1 | | INPUT2 | MGR | |
|---|---|---|---|---|---|
|  | SB1 | SB2 |  | SB1 | SB2 |
| 0 | P | P | 0 | P | P |
| 0 | P | P | 1 | P | AP |
| 1 | P | P | 0 | P | AP |
| 1 | P | P | 1 | AP | AP |

FIG. 52C

| MGR | | RJ | |
|---|---|---|---|
| SB1 | SB2 | VD | |
| P | P | Va/2 | 1 |
| P | AP | ≠Va/2  0.25Va | 0 |
| P | AP | ≠Va/2  0.25Va | 0 |
| AP | AP | Va/2 | 1 |

|  | "0" | | "1" | |
|---|---|---|---|---|
|  | MGD | | | |
|  | SB1 | SB2 | SB1 | SB2 |
|  | P (L) | P (L) | P (L) | AP (H) |
|  | AP (H) | AP (H) | | |
| INPUT1 | Iw | | | |
|  | I12 | I54 | I21 | I45 |
| INPUT2 | VSB | | | |
|  | - (Va2) | + (Vd3) | + (Vd1) | - (Va4) |

| MG0 | |
|---|---|
| SB1 | SB2 |
| AP (H) | AP (H) |

| INPUT1 | MG1 | | INPUT2 | MGR | |
|---|---|---|---|---|---|
|  | SB1 | SB2 |  | SB1 | SB2 |
| 0 | AP | AP | 0 | P | AP |
| 0 | AP | AP | 1 | P | P |
| 1 | AP | AP | 0 | AP | AP |
| 1 | AP | AP | 1 | P | AP |

| MGR | | RJ | | |
|---|---|---|---|---|
| SB1 | SB2 | VD | | |
| P | AP | ≠Va/2 | 0.25Va | 1 |
| P | P | Va/2 | | 0 |
| AP | AP | Va/2 | | 0 |
| P | AP | ≠Va/2 | 0.25Va | 1 |

|  | "0" | | "1" | |
|---|---|---|---|---|
|  | MGD | | | |
|  | SB1 | SB2 | SB1 | SB2 |
|  | P (L) | P (L) | P (L) | AP (H) |
|  | AP (H) | AP (H) | | |
| INPUT1 | Iw | | | |
|  | I21 | I45 | I12 | I54 |
| INPUT2 | VSB | | | |
|  | − (Va2) | + (Vd3) | + (Vd1) | − (Va4) |

FIG. 56A

| MG0 | |
|---|---|
| SB1 | SB2 |
| P (L) | P (L) |

| INPUT1 | MG1 | | INPUT2 | MGR | |
|---|---|---|---|---|---|
|  | SB1 | SB2 |  | SB1 | SB2 |
| 0 | P | P | 0 | P | AP |
| 0 | P | P | 1 | P | P |
| 1 | P | P | 0 | AP | AP |
| 1 | P | P | 1 | P | AP |

| MGR | | RJ | |
|---|---|---|---|
| SB1 | SB2 | VD | |
| P | AP | Va/2 | 1 |
| P | P | ≠Va/2  0.75Va | 0 |
| AP | AP | ≠Va/2  0.25Va | 0 |
| P | AP | Va/2 | 1 |

FIG. 56D

MAGNETIC DEVICE AND ARITHMETIC DEVICE

CROSS-REFERENCE TO RELATED APPLICATIONS

This is a continuation application of International Application PCT/JP2020/038094, filed on Oct. 8, 2020; the entire contents of which are incorporated herein by reference.

FIELD

Embodiments of the invention described herein relate generally to

BACKGROUND

A magnetic device including a magnetic layer is applied to an arithmetic circuit. A simpler configuration is desired in the arithmetic circuit.

BRIEF DESCRIPTION OF THE DRAWINGS

FIGS. 4A to 4C are tables showing operation results by the magnetic device according to the first embodiment;

FIGS. 6A and 68 are schematic views showing a structure used for OR operation, and FIG. 6C is a table showing the OR operation;

FIGS. 22A to 22D are schematic views illustrating the magnetic device according to the fourth embodiment;

FIGS. 24A to 24D are schematic views illustrating the magnetic device according to the fourth embodiment;

FIGS. 26A to 26D are schematic views illustrating the magnetic device according to the fourth embodiment;

FIGS. 28A to 28D are schematic views illustrating the magnetic device according to the fourth embodiment;

FIGS. 30A to 30D are schematic views illustrating the magnetic device according to the fourth embodiment;

FIGS. 32A to 32D are schematic views illustrating the magnetic device according to the fourth embodiment;

FIGS. 34A to 34D are schematic views illustrating the magnetic device according to the fourth embodiment;

FIGS. 36A to 36D are schematic views illustrating the magnetic device according to the fourth embodiment;

FIGS. 38A to 38D are schematic views illustrating the magnetic device according to the fifth embodiment;

FIGS. 40A to 40D are schematic views illustrating the magnetic device according to the fifth embodiment;

FIGS. 42A to 42D are schematic views illustrating the magnetic device according to the fifth embodiment;

FIGS. 44A to 44D are schematic views illustrating the magnetic device according to the fifth embodiment;

FIGS. 46A to 46D are schematic views illustrating the magnetic device according to the fifth embodiment;

FIGS. 48A to 48D are schematic views illustrating the magnetic device according to the fifth embodiment;

FIGS. 50A to 50D are schematic views illustrating the magnetic device according to the fifth embodiment;

FIGS. 52A to 52D are schematic views illustrating the magnetic device according to the fifth embodiment;

FIGS. 54A to 54D are schematic views illustrating the magnetic device according to the fifth embodiment;

FIGS. 56A to 56D are schematic views illustrating the magnetic device according to the fifth embodiment;

DETAILED DESCRIPTION

Figure 1:
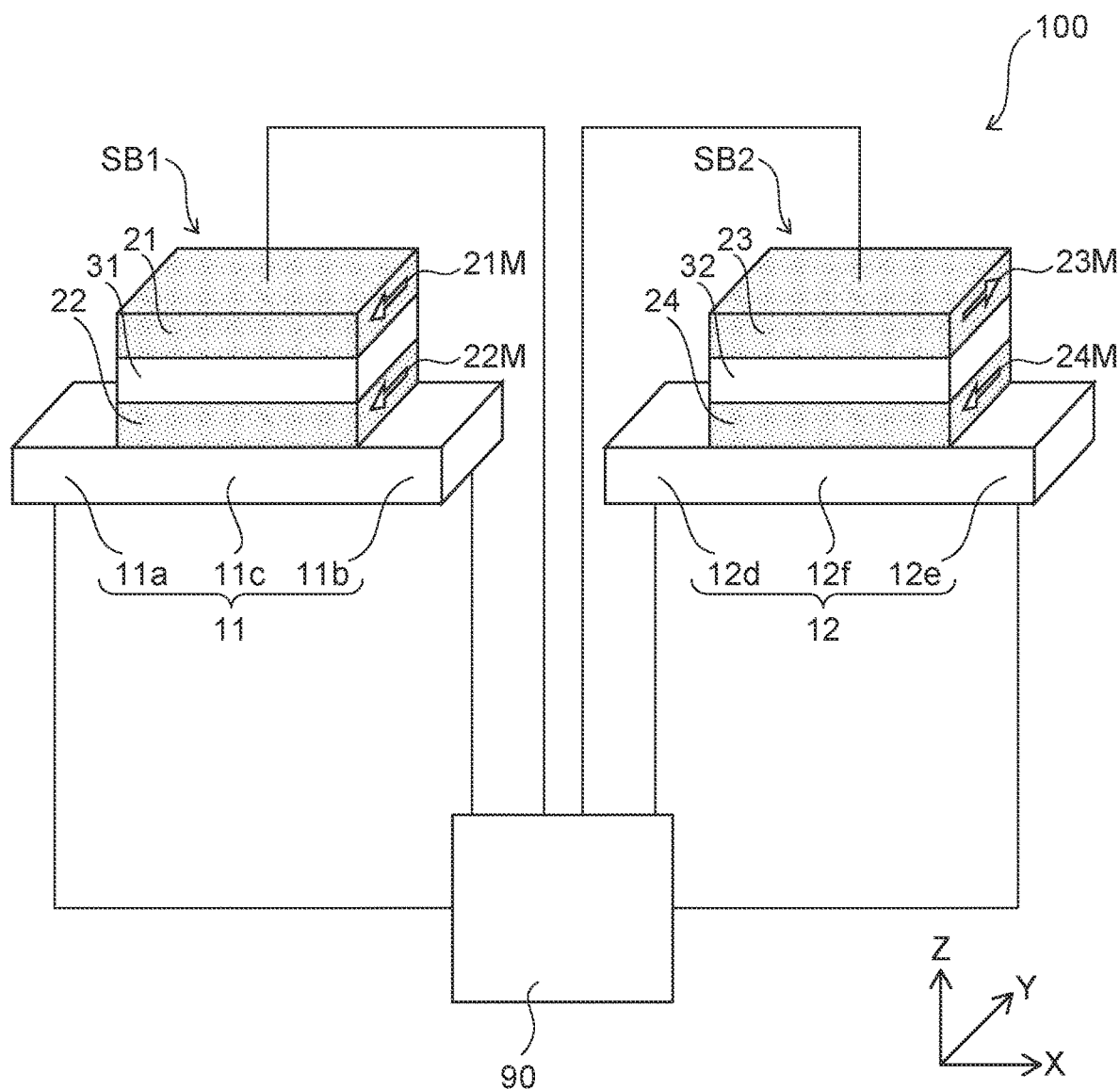
FIG. 1 is a schematic view illustrating a magnetic device according to a first embodiment.

According to one embodiment, a magnetic device includes a first conductive portion, a first stacked body, a second conductive portion, a second stacked body, and a controller. The first conductive portion includes a first region, a second region, a third region between the first region and the second region. A direction from the first region to the second region is along a first direction. The first stacked body includes a first magnetic layer and a second magnetic layer. The second magnetic layer is between the third region and the first magnetic layer in a second direction crossing the first direction. The second conductive portion includes a fourth region, a fifth region, and a sixth region between the fourth region and the fifth region. A direction from the fourth region to the fifth region is along a third direction. The second stacked body includes a third magnetic layer and a fourth magnetic layer. The fourth magnetic layer is between the sixth region and the third magnetic layer in a fourth direction crossing the third direction. The first stacked body is configured to be in a first low electrical resistance state or in a first high electrical resistance state higher than the first low electrical resistance state. The second stacked body is configured to be in a second low electrical resistance state or in a second high electrical resistance state higher than the second low electrical resistance state. The controller is configured to implement an initialization operation, a first operation, and a second operation, and implement an XNOR operation of a first input and a second input. The controller is configured to set the first stacked body in a first resistance state of the first low electrical resistance state or the first high electrical resistance state, and set the second stacked body in a second resistance state of the second low electrical resistance state or the second high electrical resistance state in the first initialization operation. The controller is configured to supply a first current to the first conductive portion while setting a potential of the first magnetic layer to a first set potential, and supply a second current to the second conductive portion while setting a potential of the third magnetic layer to a second set potential in the first operation. When the first input is "0", in the first operation, the first current has an orientation from the first region to the second region, and the second current has an orientation from the fourth region to the fifth region. When the first input is "1", in the first operation, the first current has an orientation from the second region to the first region, and the second current has an orientation from the fifth region to the fourth region. When the second input is "0", in the first operation, a potential of the first magnetic layer is set to the first potential, and a potential of the third magnetic layer is set to the fourth potential. When the second input is "1", in the first operation, a potential of the first magnetic layer is set to the second potential, and a potential of the third magnetic layer is set to the third potential. The controller is configured to measure values corresponding to an electrical resistance of the first stacked body after the first operation and an electrical resistance of the second stacked body after the first operation in the second operation.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic view illustrating a magnetic device according to a first embodiment.

As shown in FIG. 1, a magnetic device 100 according to the first embodiment includes a first conductive portion 11, a second conductive portion 12, a first magnetic layer 21, a second magnetic layer 22, a third magnetic layer 23, and a fourth magnetic layer 24, a first non-magnetic layer 31, a second non-magnetic layer 32, and a controller 90.

The first conductive portion 11 includes a first region 11a, a second region 11b, and a third region 11c. The third region 11c is located between the first region 11a and the second region 11b. For example, the third region 11c is continuous with the first region 11a and the second region 11b.

The first magnetic layer 21 is separated from the third region 11c in a second direction crossing a first direction connecting the first region 11a and the second region 11b. The first non-magnetic layer 31 is provided between the third region 11c and the first magnetic layer 21 in the second direction. The second magnetic layer 22 is provided between the third region 11c and the first non-magnetic layer 31 in the second direction. Another layer may be provided between the first conductive portion 11 and the second magnetic layer 22. Another layer may be provided between the second magnetic layer 22 and the first non-magnetic layer 31. Another layer may be provided between the first non-magnetic layer 31 and the first magnetic layer 21.

The second conductive portion 12 includes a fourth region 12d, a fifth region 12e, and a sixth region 12f. The sixth region 12f is located between the fourth region 12d and the fifth region 12e. For example, the sixth region 12f is continuous with the fourth region 12d and the fifth region 12e. The second conductive portion 12 may be electrically connected with the first conductive portion 11 or may be electrically separated from the first conductive portion 11.

The third magnetic layer 23 is separated from the sixth region 12f in a fourth direction crossing a third direction connecting the fourth region 12d and the fifth region 12e. The second non-magnetic layer 32 is provided between the sixth region 12f and the third magnetic layer 23 in the fourth direction. The fourth magnetic layer 24 is provided between the sixth region 12f and the second non-magnetic layer 32 in the fourth direction. Another layer may be provided between the second conductive portion 12 and the fourth magnetic layer 24. Another layer may be provided between the fourth magnetic layer 24 and the second non-magnetic layer 32. Another layer may be provided between the second non-magnetic layer 32 and the third magnetic layer 23.

The third direction may be parallel to the first direction or may cross the first direction. The fourth direction may be parallel to the second direction or may cross the second direction. In the example shown in FIG. 1, the first direction and the third direction are parallel to an X-axis direction. The second and fourth directions are parallel to a Z-axis direction, which is perpendicular to the X-axis direction. Hereinafter, a case where the first direction and the third direction are parallel to the X-axis direction and the second direction and the fourth direction are parallel to the Z-axis direction will be described.

The first conductive portion 11 includes at least one metal selected from the first group consisting of, for example, Ta, W, Pt, Hf, Re, Os, Ir, Pd, Cu, Ag, and Au. The second conductive portion 12 includes, for example, at least one metal selected from the first group. The metal included in the second conductive portion 12 may be the same as the metal included in the first conductive portion 11, or may be different from the metal included in the first conductive portion 11.

The first magnetic layer 21, the second magnetic layer 22, the third magnetic layer 23, and the fourth magnetic layer 24 are, for example, conductive and ferromagnetic. The first magnetic layer 21 to the fourth magnetic layer 24 include, for example, at least one selected from the group consisting of Fe, Co, and Ni. For example, the first magnetic layer 21 and the third magnetic layer 23 are used as a reference layer. The second magnetic layer 22 and the fourth magnetic layer 24 are used as a storage layer.

The first non-magnetic layer 31 and the second non-magnetic layer 32 are, for example, insulative. The first non-magnetic layer 31 and the second non-magnetic layer 32 include at least one selected from the group consisting of MgO, CaO, SrO, TiO, VO, NbO and $Al_2O_3$. The first non-magnetic layer 31 and the second non-magnetic layer 32 may be conductive. The first non-magnetic layer 31 and the second non-magnetic layer 32 may include at least one selected from the group consisting of Ga, Al, and Cu.

A first stacked body SB1 including the first magnetic layer 21, the second magnetic layer 22, and the first non-magnetic layer 31 functions as, for example, a magnetic variable resistance element. A second stacked body SB2 including the third magnetic layer 23, the fourth magnetic layer 24, and the second non-magnetic layer 32 functions as, for example, a magnetic variable resistance element. A tunnel magnetoresistance (TMR) effect occurs in the first stacked body SB1 and the second stacked body SB2.

An orientation of magnetization 21M of the first magnetic layer 21 and an orientation of magnetization 22M of the second magnetic layer 22 cross a plane parallel to the first direction and the second direction. In the example shown in FIG. 1, the orientation of the magnetization 21M and the orientation of the magnetization 22M are parallel to a Y-axis direction. For example, an easy magnetization axis of the first magnetic layer 21 and an easy magnetization axis of the second magnetic layer 22 are parallel to the Y-axis direction.

An orientation of magnetization 23M of the third magnetic layer 23 and an orientation of magnetization 24M of the fourth magnetic layer 24 cross a plane including the third direction and the fourth directions. In the example shown in FIG. 1, the orientation of the magnetization 23M and the orientation of the magnetization 24M are parallel to the Y-axis direction. For example, an easy magnetization axis of the third magnetic layer 23 and an easy magnetization axis of the fourth magnetic layer 24 are parallel to the Y-axis direction.

In the example shown in FIG. 1, the orientation of the magnetization 21M and the orientation of the magnetization 23M are antiparallel. For example, assuming that the orientation of the magnetization 21M with respect to the direction from the first region 11a to the second region 11b is +90 degrees, the orientation of the magnetization 23M with respect to the direction from the fourth region 12d to the fifth region 12e is −90 degrees.

In the first stacked body SB1, an electrical resistance of a path including the first magnetic layer 21, the first non-magnetic layer 31, and the second magnetic layer 22 changes depending on a difference between the orientation of the magnetization 21M and the orientation of the magnetization 22M. In the second stacked body SB2, an electrical resistance of a path including the third magnetic layer 23, the second non-magnetic layer 32, and the fourth magnetic layer 24 changes depending on a difference between the orientation of the magnetization 23M and the orientation of the magnetization 24M.

When the orientation of the magnetization 22M and the orientation of the magnetization 21M are parallel, an electrical resistance of the first stacked body SB1 is lower than when the orientation of the magnetization 22M and the orientation of the magnetization 21M are antiparallel. When the orientation of the magnetization 24M and the orientation of the magnetization 23M are parallel, an electrical resistance of the second stacked body SB2 is lower than when the orientation of the magnetization 24M and the orientation of the magnetization 23M are antiparallel.

In the following, a state in which an angle between the orientation of the magnetization 22M and the orientation of the magnetization 21M is relatively small, or a state in which an angle between the orientation of the magnetization 24M and the orientation of the magnetization 23M is relatively small is referred to as a "parallel state". A state in which the angle between the orientation of the magnetization 22M and the orientation of the magnetization 21M is relatively large, or a state in which the angle between the orientation of the magnetization 24M and the orientation of the magnetization 23M is relatively large is referred to as an "antiparallel state". In the parallel state, the orientation of the magnetization 22M and the orientation of the magnetization 21M do not have to be completely parallel, and it is sufficient that the angle between the direction of the magnetization 22M and the orientation of the magnetization 21M is smaller than that in the antiparallel state. Similarly, in the antiparallel state, the orientation of the magnetization 22M and the orientation of the magnetization 21M do not have to be completely antiparallel, and the angle between the orientation of the magnetization 22M and the orientation of the magnetization 21M is larger than that in the parallel state.

For example, the first conductive portion 11 and the second conductive portion 12 are provided on an insulating base body. Wiring may be provided on the base body. The base body may be at least a part of the substrate. The first conductive portion 11 and the second conductive portion 12 may be provided on the same one substrate, or may be provided on different substrates.

The controller 90 is electrically connected to the first region 11a, the second region 11b, the fourth region 12d, the fifth region 12e, the first magnetic layer 21, and the third magnetic layer 23. The controller 90 is configured to supply a current to the first conductive portion 11, supply a current to the second conductive portion 12, control a potential of the first magnetic layer 21, and control a potential of the third magnetic layer 23.

Specifically, the controller 90 supplies a current flowing from the first region 11a to the second region 11b or a current flowing from the second region 11b to the first region 11a to the first conductive portion 11. The controller 90 supplies a current flowing from the fourth region 12d to the fifth region 12e or a current flowing from the fifth region 12e to the fourth region 12d to the second conductive portion 12.

The first conductive portion 11 and the second conductive portion 12 function as, for example, a Spin Orbit Layer (SOL). When a current flows through the first conductive portion 11, the spin-orbit torque generated between the first conductive portion 11 and the second magnetic layer 22 acts on the magnetization 22M. When a current flows through the second conductive portion 12, the spin-orbit torque generated between the second conductive portion 12 and the fourth magnetic layer 24 acts on the magnetization 24M.

For example, the controller 90 switches the potential of the first magnetic layer 21 between a first potential and a second potential. The second potential is different from the first potential. For example, when the potential of the first magnetic layer 21 is set to the first potential or the second potential, the controller 90 sets a potential of the first conductive portion 11 to a reference potential (for example, the ground potential). When the potential of the first magnetic layer 21 is the first potential, the orientation of the magnetization 22M is more likely to change than when the potential of the first magnetic layer 21 is the second potential. When the potential of the first magnetic layer 21 is the first potential, the orientation of the magnetization 22M can change depending on the orientation of the current flowing through the first conductive portion 11. When the potential of the first magnetic layer 21 is the second potential, the orientation of the magnetization 22M does not substantially change regardless of the orientation of the current flowing through the first conductive portion 11.

This phenomenon is due to an in-plane magnetic anisotropy energy of the second magnetic layer 22. When the potential of the first magnetic layer 21 is the first potential, the in-plane magnetic anisotropy energy of the second magnetic layer 22 is relatively reduced. When the in-plane magnetic anisotropy energy decreases, the spin-orbit torque acts on the magnetization 22M, so that the magnetization 22M follows the orientation corresponding to the spin-orbit torque. When the potential of the first magnetic layer 21 is the second potential, the in-plane magnetic anisotropy energy of the second magnetic layer 22 increases relatively. Even if the spin-orbit torque acts on the magnetization 22M when the in-plane magnetic anisotropy energy increases, the orientation of the magnetization 22M does not substantially change. The easiness of change in the orientation of the magnetization 22M is switched according to the in-plane magnetic anisotropy energy of the second magnetic layer 22.

Similarly, the controller 90 switches the potential of the third magnetic layer 23 between a third potential and a fourth potential. The third potential is different from the fourth potential. For example, when the potential of the third magnetic layer 23 is set to the third potential or the fourth potential, the controller 90 sets the potential of the second conductive portion 12 to the reference potential (for example, the ground potential). The third potential is, for example, the same as the first potential. The fourth potential is, for example, the same as the second potential. When the potential of the third magnetic layer 23 is the third potential, the orientation of the magnetization 24M is more likely to change than when the potential of the third magnetic layer 23 is the fourth potential. When the potential of the third magnetic layer 23 is the third potential, the orientation of the magnetization 24M can change depending on the orientation of the current flowing through the second conductive portion 12. When the potential of the third magnetic layer 23 is the fourth potential, the orientation of the magnetization 24M does not substantially change regardless of the orientation of the current flowing through the second conductive portion 12.

This phenomenon is due to an in-plane magnetic anisotropy energy of the fourth magnetic layer 24. When the potential of the third magnetic layer 23 is the third potential, the in-plane magnetic anisotropy energy of the fourth magnetic layer 24 is relatively reduced. When the in-plane magnetic anisotropy energy decreases, the spin-orbit torque acts on the magnetization 24M, so that the magnetization 24M follows the orientation corresponding to the spin-orbit torque. When the potential of the third magnetic layer 23 is the fourth potential, the in-plane magnetic anisotropy energy of the fourth magnetic layer 24 relatively increases. Even if the spin-orbit torque acts on the magnetization 24M when the in-plane magnetic anisotropy energy increases, the orientation of the magnetization 24M does not substantially change. The easiness of change in the orientation of the magnetization 24M is switched according to the in-plane magnetic anisotropy energy of the fourth magnetic layer 24.

The first potential and the second potential can be set according to materials of the first conductive portion 11 and the second magnetic layer 22. The third potential and the fourth potential can be set according to materials of the second conductive portion 12 and the fourth magnetic layer 24. For example, the first conductive portion 11 and the second conductive portion 12 include Ta, and the second magnetic layer 22 and the fourth magnetic layer 24 include CoFeB. In this case, the first potential and the third potential are set to less than 0V. The second potential and the fourth potential are set to be larger than 0V.

FIG. 2A to 2C and FIGS. 3A to 3D are schematic views illustrating operations of the magnetic device according to the first embodiment.

FIGS. 4A to 4C are tables showing operation results by the magnetic device according to the first embodiment.

The magnetic device 100 is configured to perform at least a part of the operations required for XNOR (negation of exclusive OR) by supplying the current and controlling the potential described above. The controller 90 performs following an initialization operation, a first operation, a second operation, and a third operation.

Figure 2A:
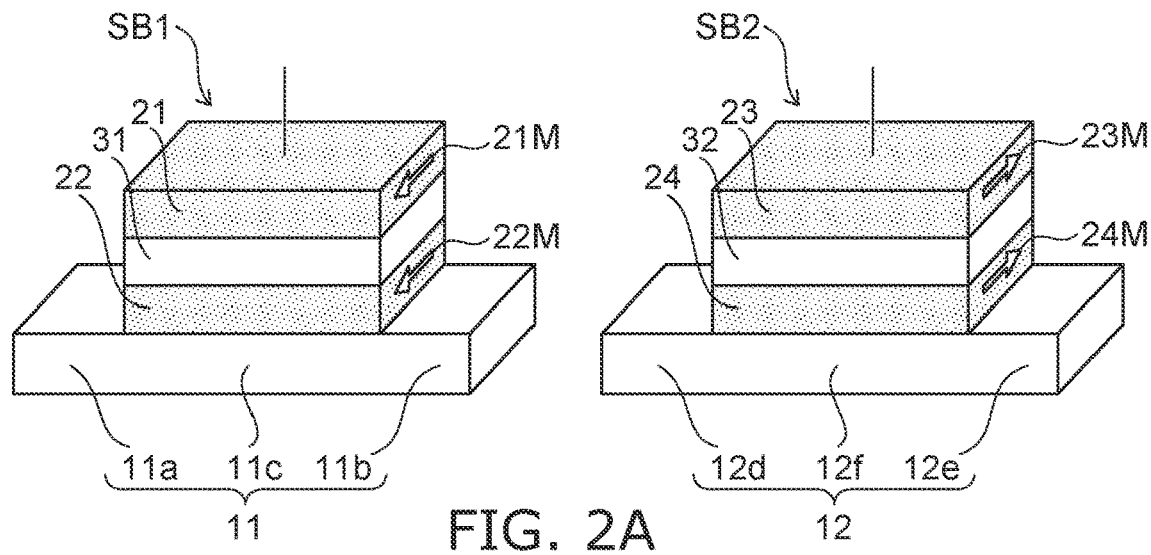
FIGS. 2A to 2C are schematic views illustrating operations of the magnetic device according to the first embodiment.

As shown in FIG. 2A, in the initialization operation, the controller 90 makes the magnetization 22M parallel to the magnetization 21M and the magnetization 24M parallel to the magnetization 23M. For example, in this example, the orientation of the magnetization 23M is opposite to the orientation of the magnetization 21M.

Figure 2B:
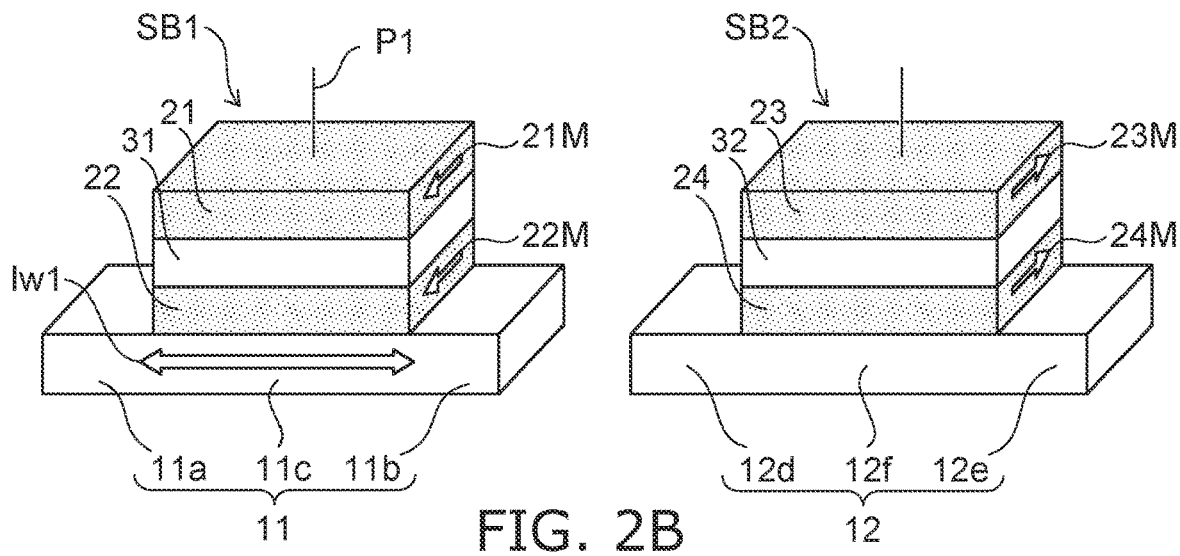

As shown in FIG. 2B, the controller 90 controls an orientation of a current Iw1 and a potential P1 according to an input value in the first operation. For example, when a first input value is "1", the controller 90 supplies the current Iw1 directed from the first region 11a toward the second region 11b to the first conductive portion 11. When the first input value is "0", the controller 90 supplies the current Iw1 directed from the second region 11b toward the first region 11a to the first conductive portion 11. When a second input value is "1", the controller 90 sets the potential P1 of the first magnetic layer 21 to the first potential. When the second input value is "0", the controller 90 sets the potential P1 of the first magnetic layer 21 to the second potential.

After setting the potential P1 and supplying the current Iw1, the controller 90 detects an electrical resistance (first electrical resistance) between the first conductive portion 11 and the first magnetic layer 21. For example, when the potential of the first magnetic layer 21 is set to the first potential and a current flows from the first region 11*a* to the second region 11*b*, the orientation of the magnetization 21M and the orientation of the magnetization 22M become antiparallel. When an electrical resistance corresponding to the antiparallel state is detected, the controller 90 determines that the output due to the first operation is "1". When the potential of the first magnetic layer 21 is set to the second potential, or when a current flows from the second region 11*b* to the first region 11*a*, the orientation of the magnetization 22M does not change from the initialization operation. The orientation of the magnetization 21M and the orientation of the magnetization 22M are in a parallel state. When an electrical resistance corresponding to the parallel state is detected, the controller 90 determines that the output due to the first operation is "0".

FIGS. 3A to 3D show the relationship between the input and the output in the first operation and the second operation. In FIGS. 3A to 3D, for convenience, the first potential or the third potential is indicated by "+", and the second potential or the fourth potential is indicated by "−". FIG. 4A shows the relationship between the input and the output in the first operation. In the first operation, as shown in FIGS. 3A to 3D and FIG. 4A, when both the first input value (INPUT1) and the second input value (INPUT2) are "1", an output value is "1". When at least one of the first input value and the second input value is "0", the output value is "0".

Figure 2C:
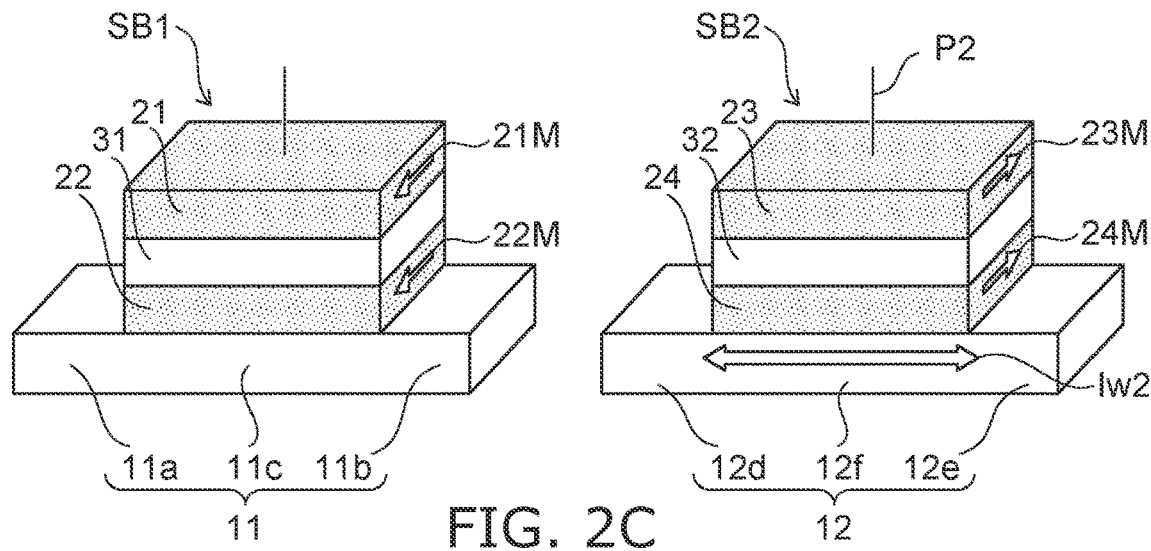
Figure 3A:
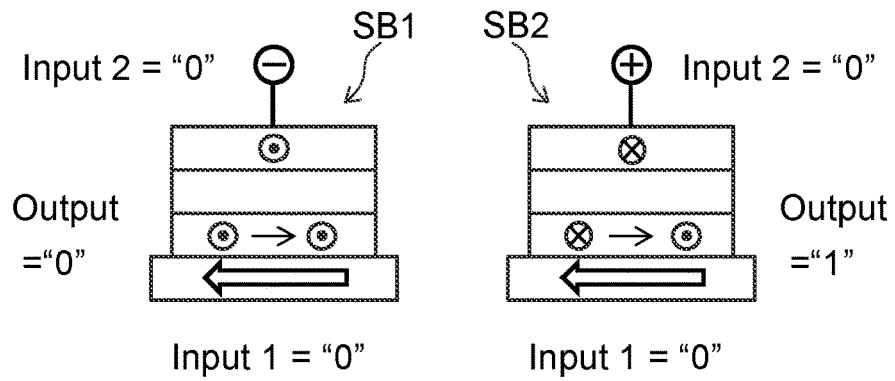
FIGS. 3A to 3D are schematic views illustrating operations of the magnetic device according to the first embodiment.
Figure 3B:
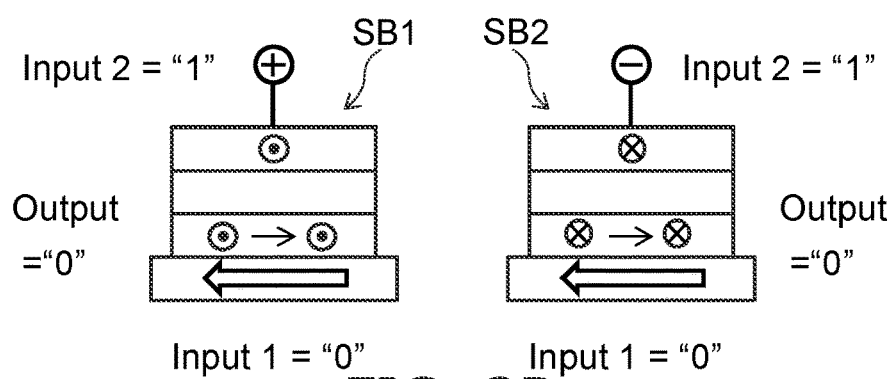
Figure 3C:
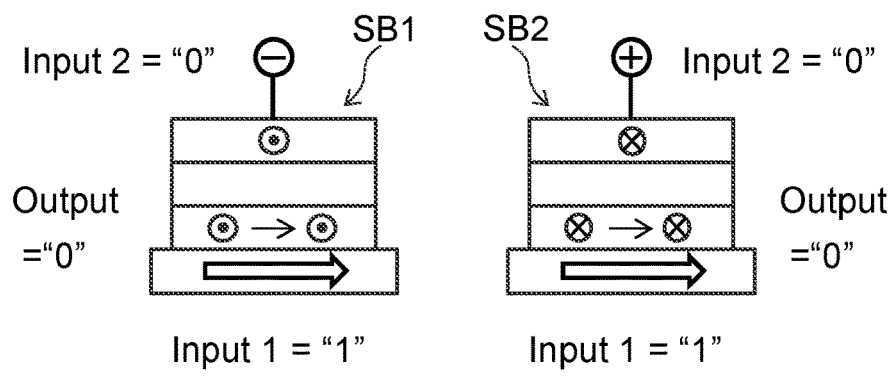
Figure 3D:
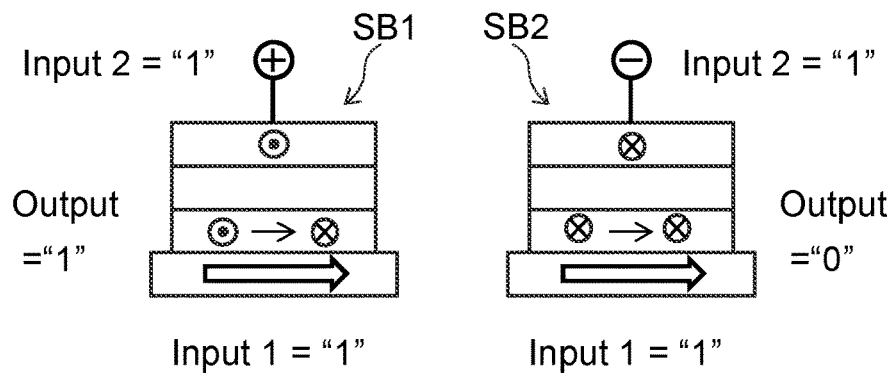

As shown in FIG. 2C, in the second operation, the controller 90 controls an orientation of a current Iw2 and a potential P2 according to the input value. For example, when the first input value is "1", the controller 90 supplies the current Iw2 directed from the fourth region 12*d* toward the fifth region 12*e* to the second conductive portion 12. When the first input value is "0", the controller 90 supplies the current Iw2 directed from the fifth region 12*e* toward the fourth region 12*d* to the second conductive portion 12. When the second input value is "1", the controller 90 sets the potential P2 of the third magnetic layer 23 to the fourth potential. When the second input value is "0", the controller 90 sets the potential P2 of the third magnetic layer 23 to the third potential.

That is, in the first operation, when the second input value is "1", the potential of the first magnetic layer 21 is set so that the magnetization 22M becomes variable. On the other hand, in the second operation, when the second input value is "0", the potential of the third magnetic layer 23 is set so that the magnetization 24M becomes variable. Further, in this example, the orientation of the magnetization 23M is opposite to the orientation of the magnetization 21M. That is, in the first operation, when the first input value is "1", a current is supplied to the first conductive portion 11 so that the orientation of the magnetization 22M changes. On the other hand, in the second operation, when the first input value is "0", a current is supplied to the second conductive portion 12 so that the orientation of the magnetization 24M changes.

After setting the potential P2 and supplying the current Iw2, the controller 90 detects an electrical resistance between the second conductive portion 12 and the third magnetic layer 23. For example, when the potential of the third magnetic layer 23 is set to the third potential and a current flows from the fifth region 12*e* to the fourth region 12*d*, the orientation of the magnetization 23M and the orientation of the magnetization 24M become antiparallel. When the electrical resistance corresponding to the antiparallel state is detected, the controller 90 determines that the output due to the second operation is "1". When the potential of the third magnetic layer 23 is set to the fourth potential, or when a current flows from the fourth region 12*d* to the fifth region 12*e*, the orientation of the magnetization 24M does not change from the initialization operation. The orientation of the magnetization 23M and the orientation of the magnetization 24M are in a parallel state. When the electrical resistance corresponding to the parallel state is detected, the controller 90 determines that the output due to the second operation is "0".

FIG. 4B shows the relationship between the input and the output in the second operation. In the second operation, as shown in FIGS. 3A to 3D and FIG. 4B, when both the first input value and the second input value are "0", the output is "1". When at least one of the first input value and the second input value is "1", the output is "0".

In the third operation, the controller 90 derives logical sum of a first value corresponding to a first electrical resistance between the first conductive portion 11 and the first magnetic layer 21 due to the first operation, and a second value corresponding to a second electrical resistance between the second conductive portion 12 and the third magnetic layer 23 due to the second operation. FIG. 4C shows the relationship between the first input value, the second input value, and the output value of the logical sum. As shown in FIG. 4C, when the first input value and the second input value are the same, "1" is output. When the first input value and the second input value are different, "0" is output. That is, the magnetic device 100 functions as an XNOR logic gate that performs an XNOR operation.

According to the first embodiment, a part of the XNOR operation is performed using the two stacked bodies SB1 and SB2. Operation using these stacked bodies is performed by controlling the orientation of the current and the potential of the reference layer. According to the first embodiment, the structure and sequence of the device required for the XNOR operation can be further simplified. For example, power consumption of the XNOR logic gate can be reduced by simplifying the structure and sequence.

Figure 5A:
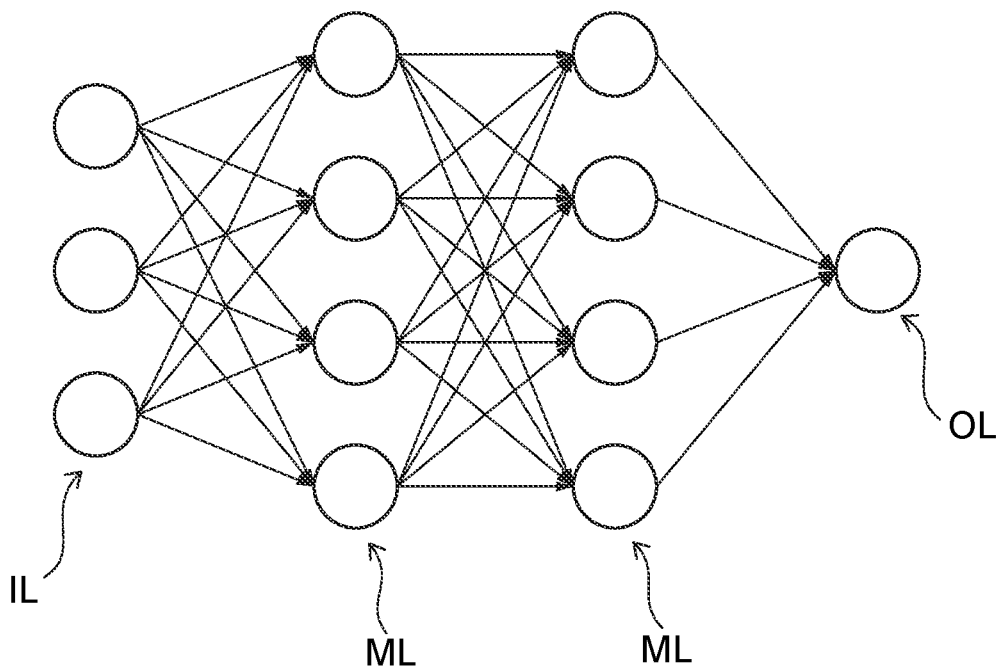
FIGS. 5A and 5B are schematic views illustrating a neural network.
Figure 5B:
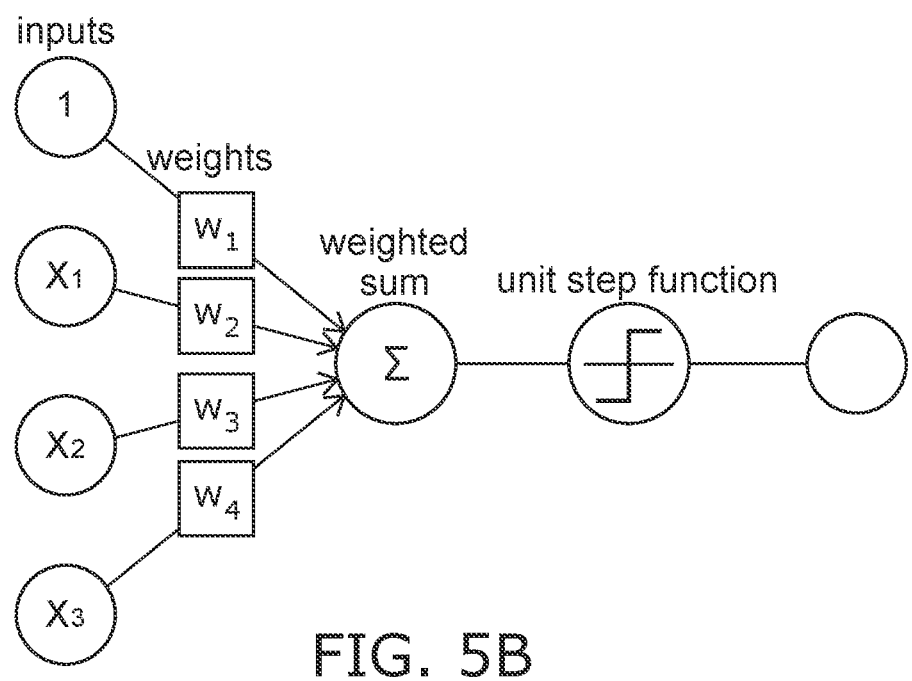

FIGS. 5A and 5B are schematic views illustrating a neural network.

The magnetic device 100 is preferably used for the neural network (particularly BNN). FIG. 5A is a schematic view showing a schematic configuration of BNN. FIG. 5B is an enlarged schematic view of a part of FIG. 5A.

As shown in FIG. 5A, the neural network includes an input layer IL, multiple intermediate layers ML, and an output layer OL. In the neural network, as shown in FIG. 5B, each input is weighted at the time of learning and inference, and the operation result is input to the next layer. The sum of each product is derived and the output is determined based on the sum. The XNOR logic gate is used to derive these products and sums.

At the time of learning and inference, information is repeatedly stored in the logic gate. Therefore, the device used as a logic gate is required to have high endurance for programing. Further, it is desirable that the logic gate is non-volatile so that the operation result can be held. Since the operation result is non-volatile, it is not necessary to store the operation result in another storage part, and the power consumption can be reduced. Further, since the logic gate operates repeatedly during learning and inference, it is desirable that the power consumption of the logic gate is small.

In the magnetic device 100, information is stored as the orientation of magnetization of the second magnetic layer 22 and the fourth magnetic layer 24, respectively. Therefore, deterioration of the characteristics due to programming of information is unlikely to occur, and high endurance for programing can be realized. Further, as described above, the magnetic device 100 is non-volatile because the result of the operation process is stored in the second magnetic layer 22 and the fourth magnetic layer 24. Further, the information of the second magnetic layer 22 and the fourth magnetic layer 24 is reprogrammed by supplying the electric current to the first conductive portion 11 and the second conductive portion 12. Therefore, the information can be programmed and derived with a smaller current than, for example, a method of energizing through an insulating layer or the like.

Hereinafter, the magnetic device 100 of the first embodiment will be described more specifically.

OR Operation

FIGS. 6A and 68 are schematic views showing a structure used for OR operation, FIG. 6C is a table showing the OR operation.

Figure 7A:
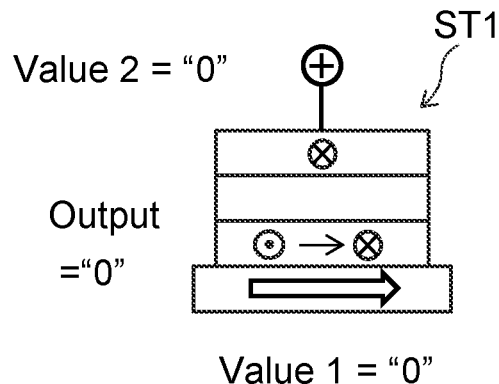
FIGS. 7A to 7C are schematic views showing the operations of the OR operation.
Figure 7B:
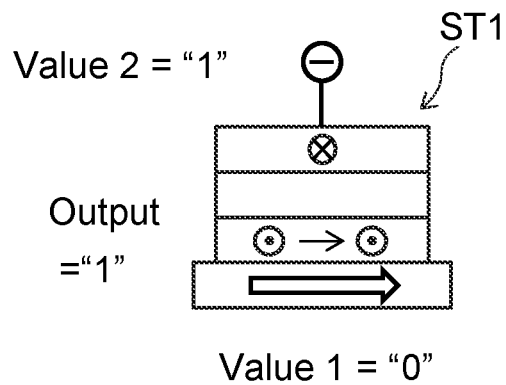
Figure 7C:
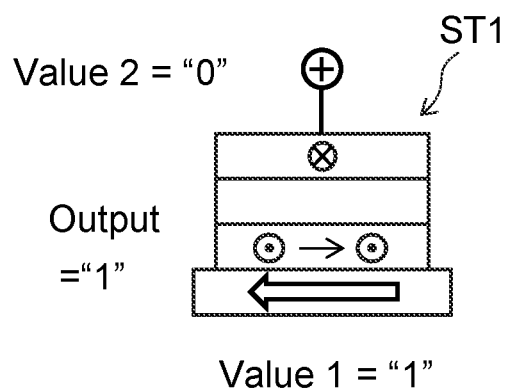

FIGS. 7A to 7C are schematic views showing the operations of the OR operation.

For example, the controller 90 performs the OR operation using a structure ST1 shown in FIG. 6A. The structure ST1 includes a third conductive portion 13, a fifth magnetic layer 25, a sixth magnetic layer 26, and a third non-magnetic layer 33.

The third conductive portion 13 includes a seventh region 13g, an eighth region 13h, and a ninth region 13i. The ninth region 13i is located between the seventh region 13g and the eighth region 13h. For example, the 9th region 13i is continuous with the 7th region 13g and the 8th region 13h.

The fifth magnetic layer 25 is separated from the ninth region 13i in a sixth direction crossing a fifth direction connecting the seventh region 13g and the eighth region 13h. The third non-magnetic layer 33 is provided between the ninth region 13i and the fifth magnetic layer 25 in the sixth direction. The sixth magnetic layer 26 is provided between the ninth region 13i and the third non-magnetic layer 33 in the sixth direction. Another layer may be provided between the third conductive portion 13 and the sixth magnetic layer 26. Another layer may be provided between the sixth magnetic layer 26 and the third non-magnetic layer 33. Another layer may be provided between the third non-magnetic layer 33 and the fifth magnetic layer 25.

The fifth direction may be parallel to the first or third direction, or may cross the first or third direction. The sixth direction may be parallel to the second or fourth direction, or may cross the second or fourth direction. The same configuration as that of the first conductive portion 11 can be applied to the third conductive portion 13. The same configuration as that of the first magnetic layer 21 can be applied to the fifth magnetic layer 25. The same configuration as that of the second magnetic layer 22 can be applied to the sixth magnetic layer 26. The same configuration as that of the first non-magnetic layer 31 can be applied to the third non-magnetic layer 33.

The controller 90 is electrically connected with the seventh region 13g, the eighth region 13h, and the fifth magnetic layer 25. The controller 90 switches a potential of the fifth magnetic layer 25 between a fifth potential and a sixth potential. The fifth potential is different from the sixth potential. When the potential of the fifth magnetic layer 25 is the fifth potential, an orientation of magnetization 26M can change depending on an orientation of a current flowing through the third conductive portion 13. When the potential of the fifth magnetic layer 25 is the sixth potential, the orientation of the magnetization 26M does not substantially change regardless of the orientation of the current flowing through the third conductive portion 13.

First, as shown in FIG. 6B, the controller 90 makes the orientation of the magnetization 25M and the orientation of the magnetization 26M antiparallel. Next, the controller 90 controls an orientation of a current Iw3 and a potential P3 according to the input value. The input values are the output value (first value) by the first operation and the output value (second value) by the second operation described above.

For example, when the first value is "1", the controller 90 supplies the current Iw3 directed from the eighth region 13h toward the seventh region 13g to the third conductive portion 13. When the first value is "0", the controller 90 supplies the current Iw3 directed from the 7th region 13g toward the 8th region 13h to the third conductive portion 13. When the second value is "1", the controller 90 sets the potential P3 of the fifth magnetic layer 25 to the sixth potential. When the second value is "0", the controller 90 sets the potential P3 of the fifth magnetic layer 25 to the fifth potential.

After supplying the current Iw3 and setting the potential P3, the controller 90 detects an electrical resistance between the third conductive portion 13 and the fifth magnetic layer 25. When the electrical resistance corresponding to the antiparallel state is detected, the controller 90 determines that the output due to the first operation is "1". When the electrical resistance corresponding to the parallel state is detected, the controller 90 determines that the output due to the first operation is "0".

FIGS. 7A to 7C show the relationship between the input and the output in the OR operation. In FIGS. 7A to 7C, for convenience, the fifth potential is indicated by "+" and the sixth potential is indicated by "−". As shown in FIG. 6C and FIGS. 7A to 7C, when both the first value (Value 1) and the second value (Value 2) are "0", the output is "0". When one of the first value and the second value is "1", the output is "1". In this way, the controller 90 performs the OR operation using the structure ST1 shown in FIG. 6A.

FIGS. 8A to 8C and FIGS. 9A to 9C are schematic views showing the operations of the OR operation.

In the examples of FIG. 6B and FIGS. 7A to 7C, the orientation of the current flowing through the third conductive portion 13 and the potential of the fifth magnetic layer 25 are changed according to the first value and the second value, respectively. The specific method of OR operation is not limited to this example. The relationship between the orientation of the magnetization 25M and the orientation of the magnetization 26M may be changed according to the first value or the second value.

Figure 8A:
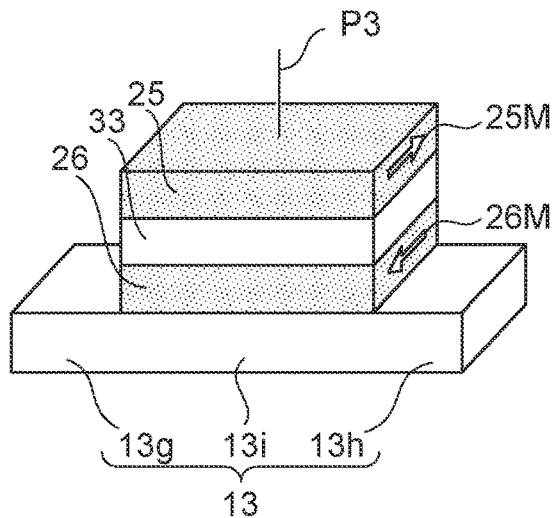
FIGS. 8A to 8C are schematic views showing operations of the OR operation.
Figure 8B:
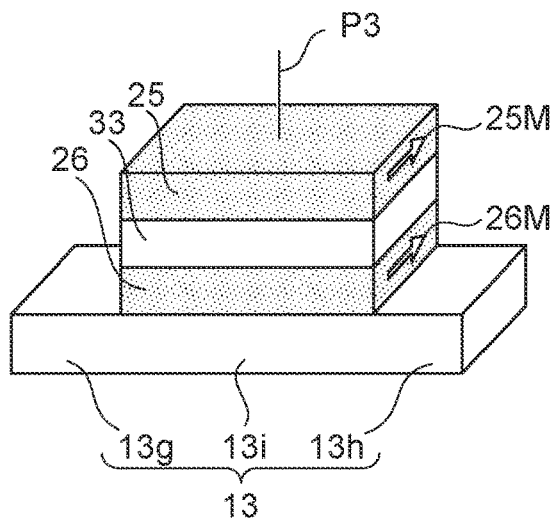

For example, when the first value is "1", the controller 90 makes the orientation of the magnetization 26M and the orientation of the magnetization 25M antiparallel as shown in FIG. 8A. When the first value is "0", the controller 90 makes the orientation of the magnetization 26M and the orientation of the magnetization 25M parallel as shown in FIG. 88.

Figure 8C:
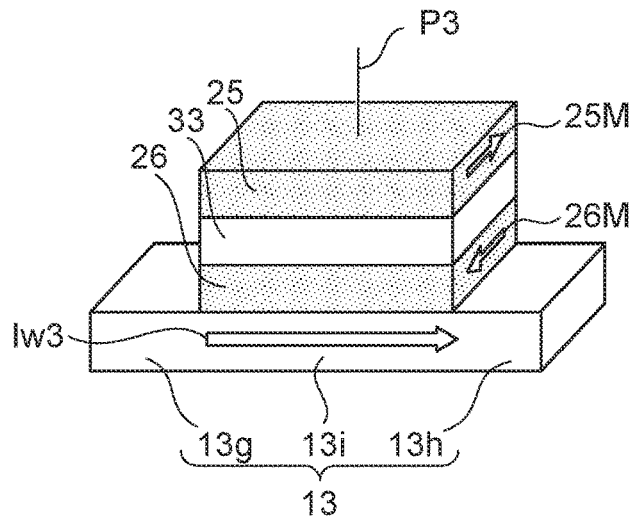

Next, when the second value is "1", the controller 90 sets the potential P3 of the fifth magnetic layer 25 to the fifth potential. When the second value is "0", the controller 90 sets the potential P3 of the fifth magnetic layer 25 to the sixth potential. During the setting of the potential P3, the controller 90 supplies the current Iw3 directed from the seventh region 13g toward the eighth region 13h to the third conductive portion 13, as shown in FIG. 8C. When the potential P3 of the fifth magnetic layer 25 is the fifth potential, the orientation of the magnetization 25M and the orientation of the magnetization 26M are in an antiparallel state after the current Iw3 is supplied.

After supplying the current Iw3, the controller 90 detects the electrical resistance between the third conductive portion 13 and the fifth magnetic layer 25. When the electrical resistance corresponding to the antiparallel state is detected, the controller 90 determines that the output value is "1". When the electrical resistance corresponding to the parallel state is detected, the controller 90 determines that the output value is "0".

Figure 9A:
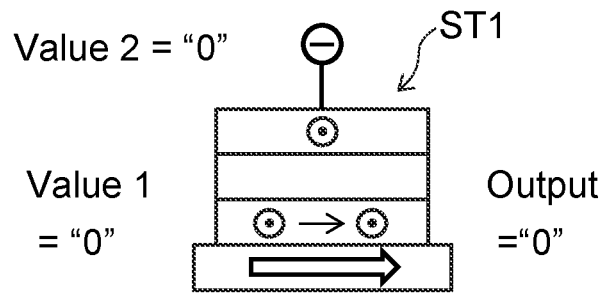
FIGS. 9A to 9C are schematic views showing operations of the OR operation.
Figure 9B:
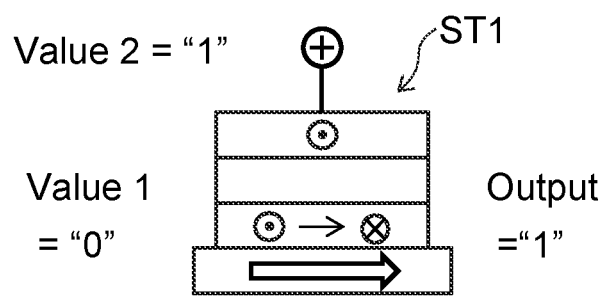
Figure 9C:
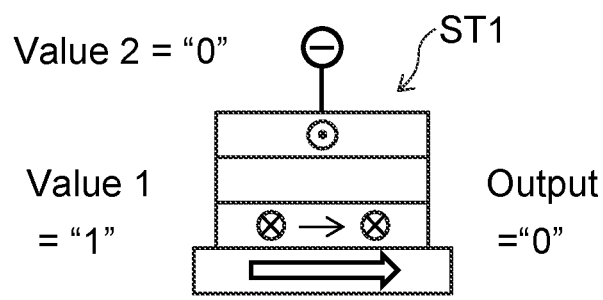

FIGS. 9A to 9C show the relationship between the input and the output in the OR operation. In FIGS. 9A to 9C, for convenience, the fifth potential is indicated by "+" and the sixth potential is indicated by "−". As shown in FIGS. 9A to 9C, the orientation of the magnetization 25M and the orientation of the magnetization 26M are parallel only when the first value is "0" and the second value is "0". In other cases, the orientation of the magnetization 25M and the orientation of the magnetization 26M are antiparallel. That is, the OR operation is performed.

The controller 90 may perform the OR operation using a typical volatile OR logic gate instead of the OR operation using the above-mentioned structure.

Controller

Figure 10:
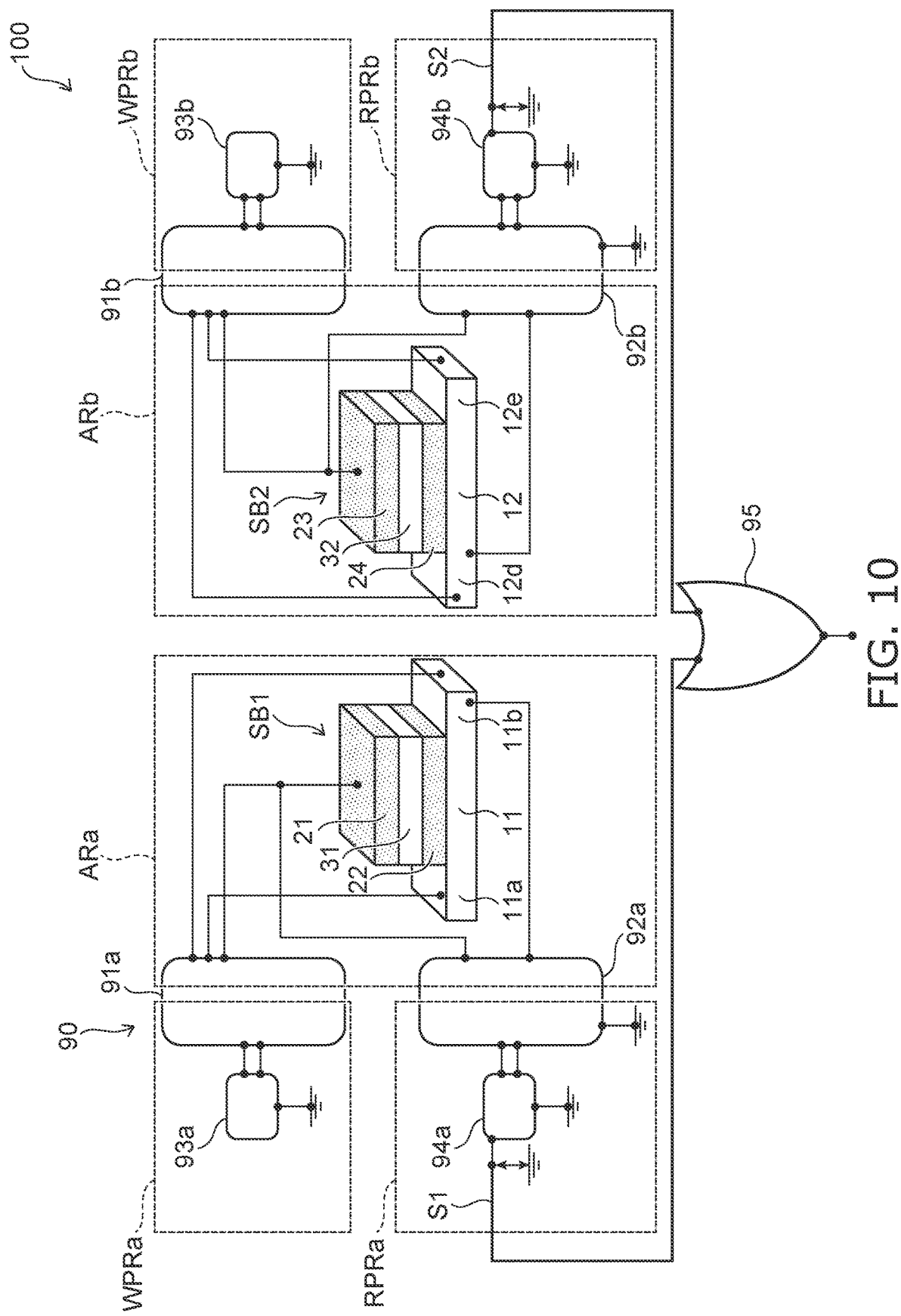
FIG. 10 is a schematic view showing a specific example of the magnetic device according to the first embodiment.

FIG. 10 is a schematic view showing a specific example of the magnetic device according to the first embodiment.

The controller 90 includes, for example, program selectors 91a and 91b, read selectors 92a and 92b, program drivers 93a and 93b, and sense amplifiers 94a and 94b, as shown in FIG. 10.

The program selector 91a is electrically connected with the first region 11a, the second region 11b, and the first magnetic layer 21. The program selector 91a selects the first conductive portion 11 from the multiple conductive portions. Further, the program selector 91a selects the first stacked body SB1 from the multiple stacked bodies. The program driver 93a performs the supply of the current to the selected first conductive portion 11 and the setting of the potential of the selected first magnetic layer 21. The program driver 93a controls the orientation of the current flowing through the first conductive portion 11 and the potential of the first magnetic layer 21 according to the first input value and the second input value.

The read selector 92a is electrically connected with the second region 11b and the first magnetic layer 21. The read selector 92a selects the first stacked body SB1 from the multiple stacked bodies, and applies a predetermined voltage between the first conductive portion 11 (second region 11b) and the first magnetic layer 21. As a result, a signal (current) corresponding to the electrical resistance between the first conductive portion 11 and the first magnetic layer 21 flows. The sense amplifier 94a amplifies and outputs a flowed signal S1. The amplified signal S1 is input to an OR logic gate 95 as one input value.

As the OR logic gate 95, the structure ST1 shown in FIGS. 6A and 6B described above may be used, or the volatile OR logic gate may be used. From the viewpoint of reducing power consumption and improving endurance for programing, the structure ST1 is preferably used.

The program selector 91b is electrically connected with the fourth region 12d, the fifth region 12e, and the third magnetic layer 23. The program selector 91b selects the second conductive portion 12 from the multiple conductive portions. Further, the program selector 91b selects the second stacked body S82 from the multiple stacked bodies. The program driver 93b performs the supply of the current to the selected second conductive portion 12 and the setting of the potential of the selected third magnetic layer 23. The program driver 93b controls the orientation of the current flowing through the second conductive portion 12 and the potential of the third magnetic layer 23 according to the first input value and the second input value.

The read selector 92b is electrically connected with the fifth region 12e and the third magnetic layer 23. The read selector 92b selects the first stacked body SB1 from the multiple stacked bodies, and applies a predetermined voltage between the second conductive portion 12 (fifth region 12e) and the third magnetic layer 23. As a result, a signal (current) corresponding to the electrical resistance between the second conductive portion 12 and the third magnetic layer 23 flows. The sense amplifier 94b amplifies a flowed signal S2. The amplified signal S2 is input to the OR logic gate 95 as another input value.

As shown in FIG. 10, by selecting multiple conductive portions and multiple stacked bodies with a selector, a program driver and a sense amplifier can be shared by the multiple conductive portions and the multiple stacked bodies. As a result, an area occupied by the controller 90 on the substrate can be reduced, and the power consumption of the magnetic device 100 can be further reduced.

For example, the first conductive portion 11, the first stacked body SB1, the program selector 91a, the read selector 92a, the program driver 93a, and the sense amplifier 94a are provided on one substrate. The first conductive portion 11 and the first stacked body SB1 are provided in an array region ARa in which the multiple conductive portions and the multiple stacked bodies are arranged. The program driver 93a is provided in a program peripheral circuit region WPRa. The sense amplifier 94a is provided in a read peripheral circuit region RPMa. For example, the program selector 91a is provided so as to straddle the array area ARa and the program peripheral circuit region WPRa. The read selector 92a is provided so as to straddle the array region ARa and the read peripheral circuit region RPRa.

Similarly, the second conductive portion 12, the second stacked body SB2, the program selector 91b, the read selector 92b, the program driver 93b, and the sense amplifier 94b are provided on another substrate. The second conductive portion 12 and the second stacked body SB2 are provided in an array region ARb in which the multiple conductive portions and the multiple stacked bodies are arranged. The program driver 93b is provided in a program peripheral circuit region WPRb. The sense amplifier 94b is provided in the read peripheral circuit region RPRb. For example, the program selector 91b is provided so as to straddle the array region ARb and the program peripheral circuit region WPRb. The read selector 92b is provided so as to straddle the array region ARb and the read peripheral circuit region RPRb.

Alternatively, the first conductive portion 11, the first stacked body SB1, the second conductive portion 12, the second stacked body SB2, and the controller 90 may be provided on the same one substrate. The specific configuration of the controller 90 is not limited to the illustrated example. If the initialization operation and the first to third operations described above can be performed, any configuration can be applied to the controller 90.

Modification

FIGS. 11A to 11C and FIGS. 12A to 12D are schematic views showing operations of the magnetic device according to the first embodiment.

The controller 90 may perform the following operations as the initialization operation and the second operation.

Figure 11A:
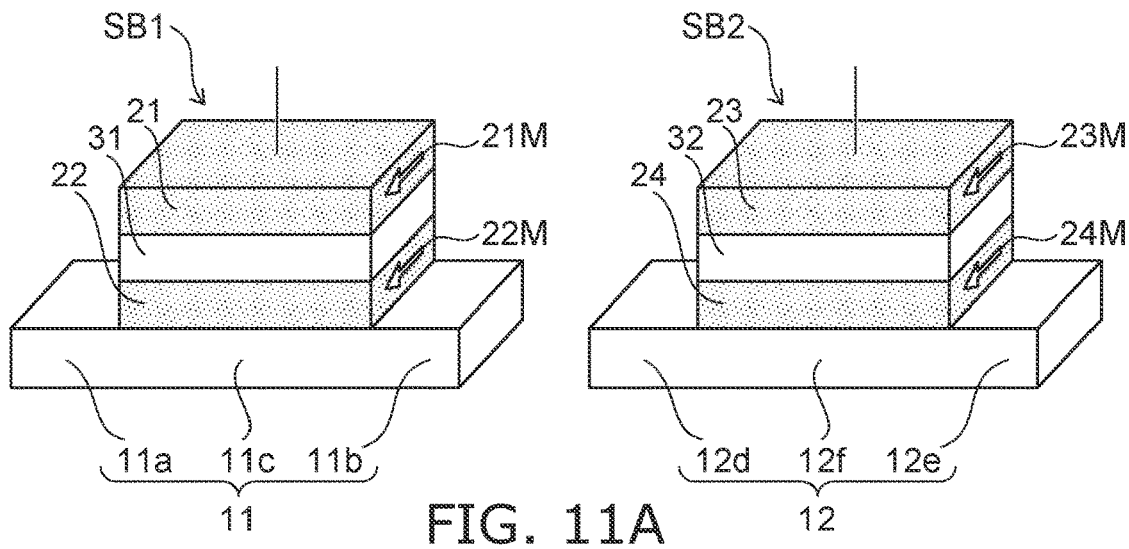
FIGS. 11A to 11C are schematic views showing operations of the magnetic device according to the first embodiment.

In the initialization operation, the controller 90 makes the magnetization 22M parallel to the magnetization 21M and the magnetization 24M parallel to the magnetization 23M, as shown in FIG. 11A. At this time, the orientation of the magnetization 23M is parallel to the orientation of the magnetization 21M. That is, the relationship between the orientation of the magnetization 21M and the orientation of the magnetization 23M is opposite to that of the initialization operation described above.

Figure 11B:
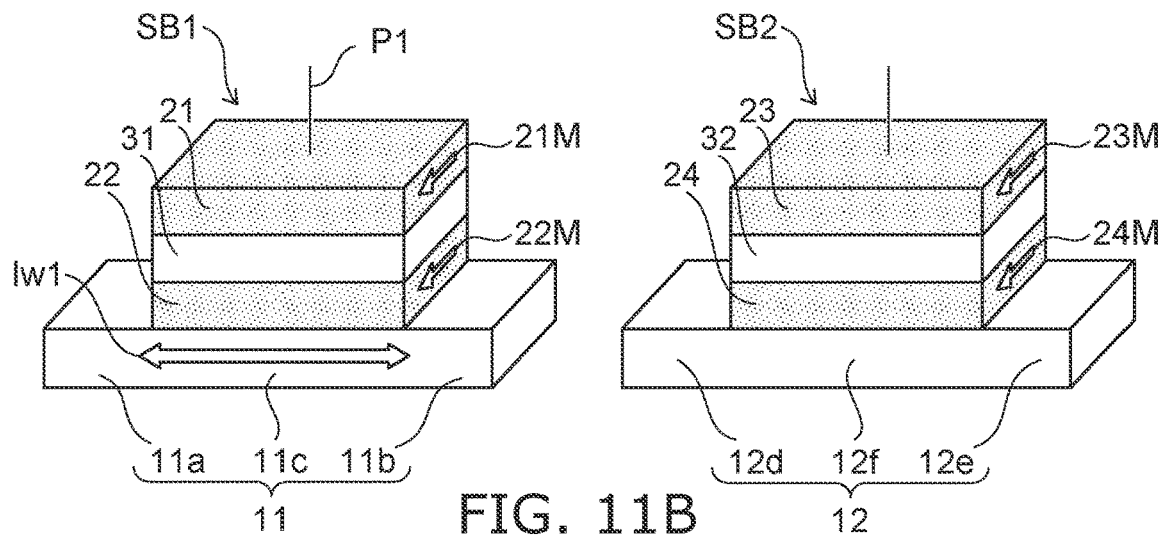

The first operation is performed in the same manner as in the above-mentioned example. As shown in FIG. 11B, in the first operation, the controller 90 controls the orientation of the current Iw1 and the potential P1 according to the input value.

Figure 11C:
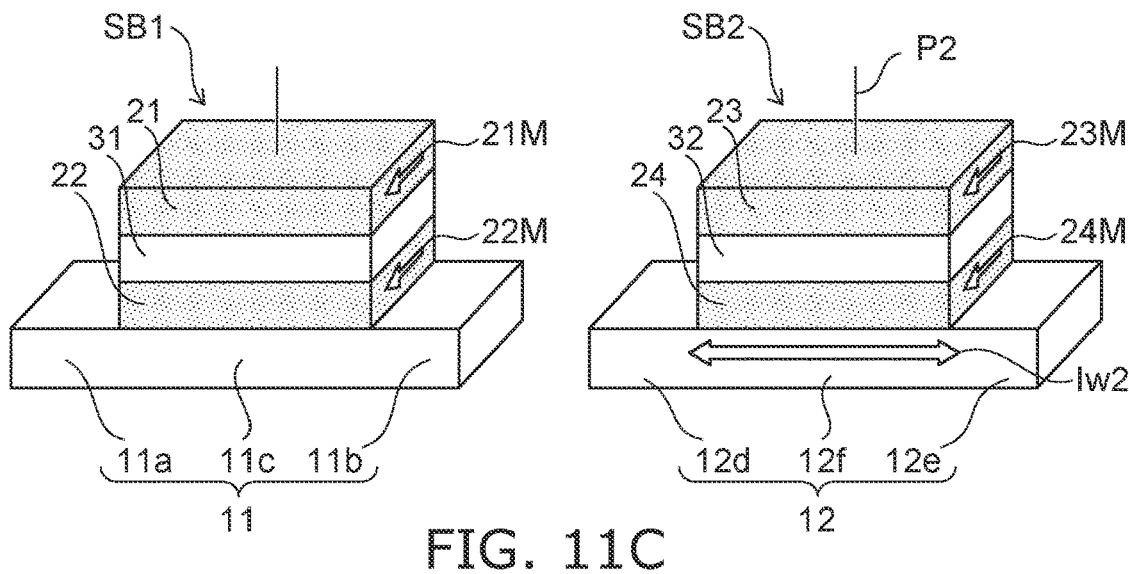
Figure 12A:
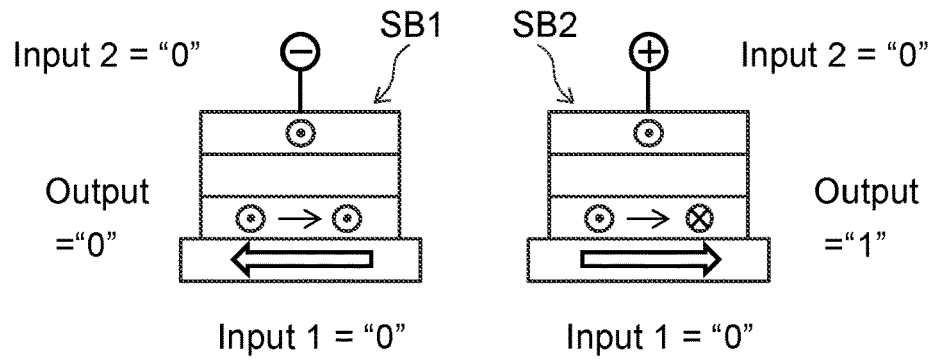
FIGS. 12A to 12D are schematic views showing operations of the magnetic device according to the first embodiment.
Figure 12B:
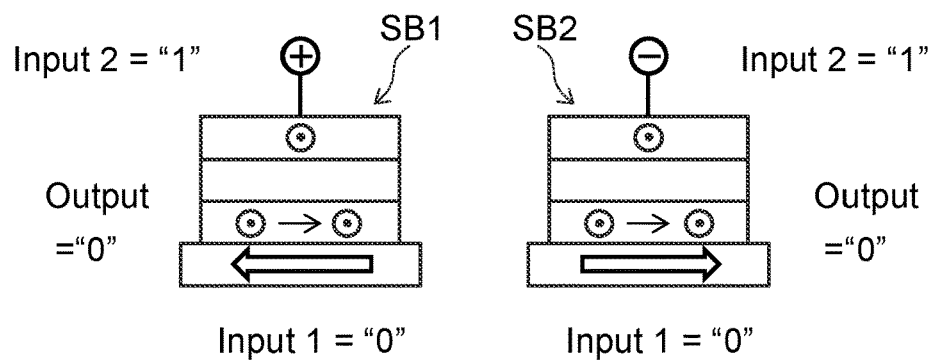
Figure 12C:
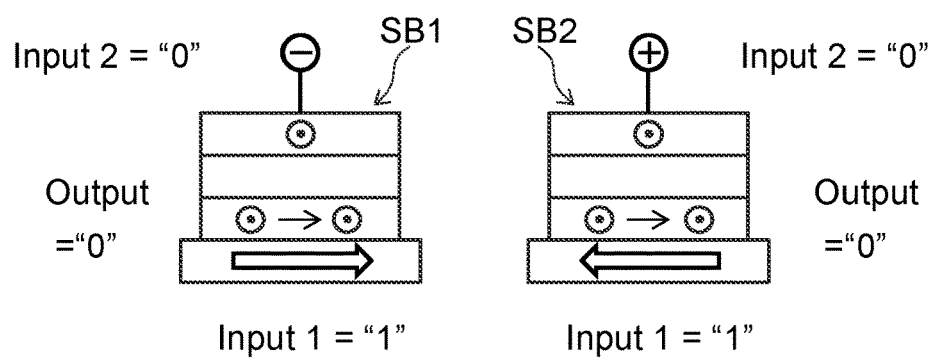
Figure 12D:
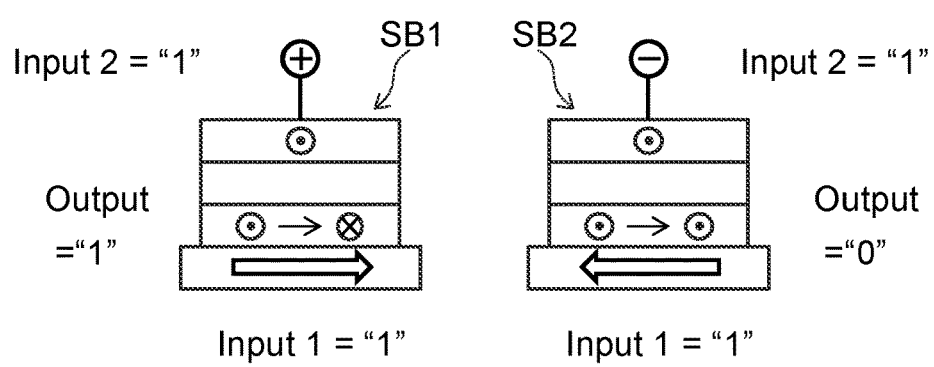

As shown in FIG. 11C, in the second operation, the controller 90 controls the orientation of the current Iw2 and the potential P2 according to the input value. For example, when the first input value is "1", the controller 90 supplies the current Iw2 directed from the fifth region 12e toward the fourth region 12d to the second conductive portion 12. When the first input value is "0", the controller 90 supplies the current Iw2 directed from the fourth region 12d toward the fifth region 12e to the second conductive portion 12. That is, the orientation in which the current Iw2 flows is opposite to that of the second operation described above. When the second input value is "1", the controller 90 sets the potential P2 of the third magnetic layer 23 to the fourth potential. When the second input value is "0", the controller 90 sets the potential P2 of the third magnetic layer 23 to the third potential.

In the first operation, when the first input value is "1", a current is supplied to the first conductive portion 11 so that the orientation of the magnetization 22M changes. On the other hand, in the second operation, when the first input value is "0", a current is supplied to the second conductive portion 12 so that the orientation of the magnetization 24M changes.

After supplying the current Iw2 and setting the potential P2, the controller 90 detects the electrical resistance between the second conductive portion 12 and the third magnetic layer 23. When the electrical resistance corresponding to the antiparallel is detected, the controller 90 determines that the output due to the second operation is "1". When the electrical resistance corresponding to the parallel is detected, the controller 90 determines that the output due to the second operation is "0".

The relationship between the input and the output by the first operation and the second operation described here is as shown in FIGS. 3A, 38, and FIGS. 12A to 12D. In FIGS. 12A to 12D, the first potential or the third potential is indicated by "+" and the second potential or the fourth potential is indicated by "−", for convenience.

In the third operation, an OR operation between the output by the first operation and the output by the second operation is performed. As described above, the OR operation can use the structure ST1 shown in FIG. 6A or the volatile OR logic gate. By the above operation, the XNOR operation is performed by the magnetic device 100.

Second Embodiment

Figure 13:
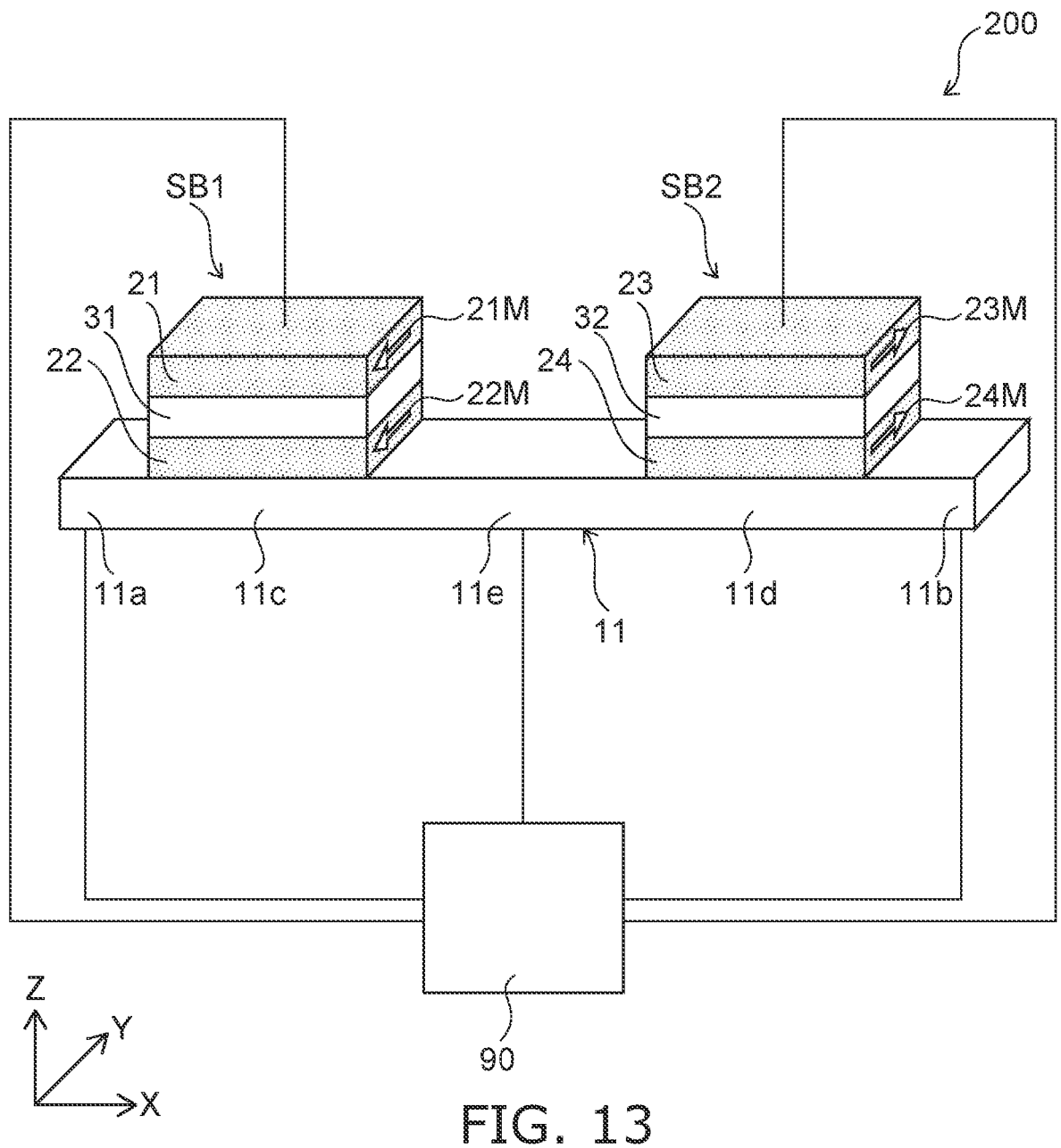
FIG. 13 is a schematic view illustrating a magnetic device according to a second embodiment.

FIG. 13 is a schematic view illustrating a magnetic device according to a second embodiment.

As shown in FIG. 13, a magnetic device 200 according to the second embodiment include the first conductive portion 11, the first magnetic layer 21, the second magnetic layer 22, the third magnetic layer 23, the fourth magnetic layer 24, the first non-magnetic layer 31, the second non-magnetic layer 32, and the controller 90.

The first conductive portion 11 includes the first region 11a, the second region 11b, the third region 11c, a fourth region 11d, and a fifth region 11e. The third region 11c is located between the first region 11a and the second region 11b. The fourth region 11d is located between the second region 11b and the third region 11c. The fifth region 11e is located between the third region 11c and the fourth region 11d. For example, the first region 11a to the fifth region 11e are continuous with each other.

The first magnetic layer 21 is separated from the third region 11c in the second direction crossing the first direction connecting the first region 11a and the second region 11b. In the example shown in FIG. 13, the first direction is parallel to the X-axis direction. The second direction is parallel to the Z-axis direction. The first non-magnetic layer 31 is provided between the third region 11c and the first magnetic layer 21 in the Z-axis direction. The second magnetic layer 22 is provided between the third region 11c and the first non-magnetic layer 31 in the Z-axis direction. Another layer may be provided between the first conductive portion 11 and the second magnetic layer 22. Another layer may be provided between the second magnetic layer 22 and the first non-magnetic layer 31. Another layer may be provided between the first non-magnetic layer 31 and the first magnetic layer 21.

The third magnetic layer 23 is separated from the fourth region 11d in the Z-axis direction. The second non-magnetic layer 32 is provided between the fourth region 11d and the third magnetic layer 23 in the Z-axis direction. The second magnetic layer 22 is provided between the fourth region 11d and the second non-magnetic layer 32 in the Z-axis direction. Another layer may be provided between the second conductive portion 12 and the fourth magnetic layer 24. Another layer may be provided between the fourth magnetic layer 24 and the second non-magnetic layer 32. Another layer may be provided between the second non-magnetic layer 32 and the third magnetic layer 23.

The controller 90 is electrically connected with the first region 11a, the second region 11b, the fifth region 11e, the first magnetic layer 21, and the third magnetic layer 23. The controller 90 is configured to supply the current to the first conductive portion 11, control the potential of the first magnetic layer 21, and control the potential of the third magnetic layer 23.

FIGS. 14A to 14C and FIGS. 15A to 15D are schematic views illustrating operations of the magnetic device according to the second embodiment.

The magnetic device 200 according to the second embodiment functions as the XNOR logic gate like the magnetic device 100 according to the first embodiment. The controller 90 performs the following initialization operation, the first operation, and a determination operation.

Figure 14A:
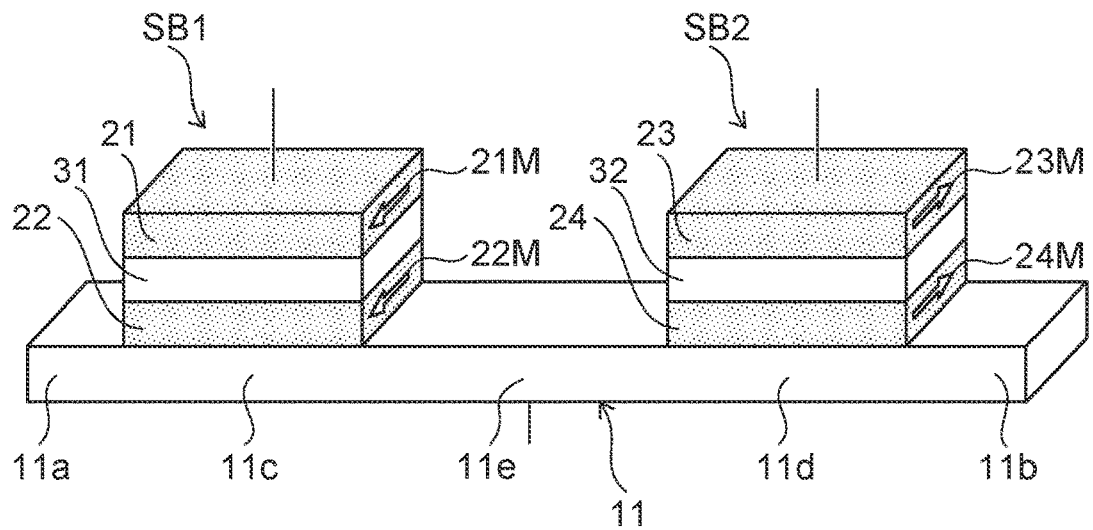
FIGS. 14A to 14C are schematic views illustrating operations of the magnetic device according to the second embodiment.

As shown in FIG. 14A, in the initialization operation, the controller 90 makes the orientation of the magnetization 21M and the orientation of the magnetization 21M parallel, and makes the orientation of the magnetization 23M and the orientation of the magnetization 24M parallel. For example, in this example, the orientation of the magnetization 23M is opposite to the orientation of the magnetization 21M.

Figure 14B:
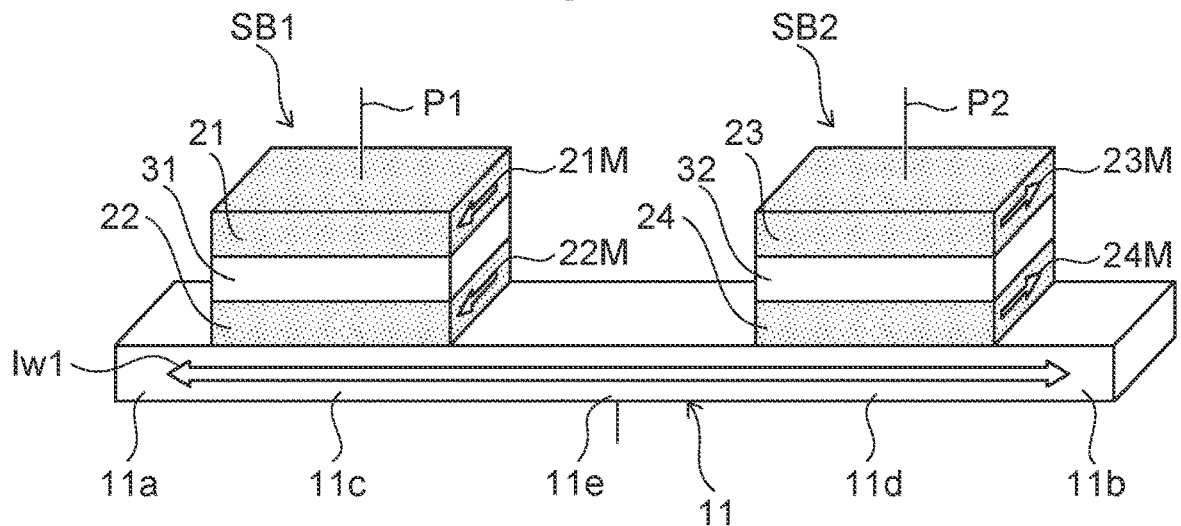
Figure 14C:
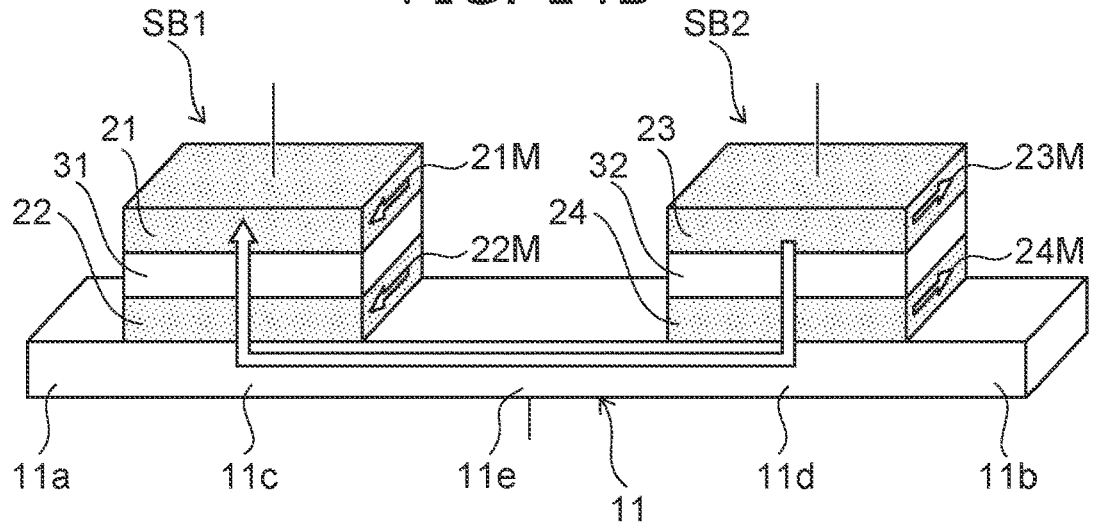

As shown in FIG. 14B, in the first operation, the controller 90 controls the orientation of the current Iw1, the potential P1, and the potential P2 according to the input value. For example, when the first input value is "1" the controller 90 supplies the current Iw1 directed from the first region 11a toward the second region 11b to the first conductive portion 11. When the first input value is "0", the controller 90 supplies the current Iw1 directed from the second region 11b toward the first region 11a to the first conductive portion 11.

When the second input value is "1", the controller 90 sets the potential P1 of the first magnetic layer 21 to the first potential and sets the potential P2 of the third magnetic layer 23 to the fourth potential. When the second input value is "0", the controller 90 sets the potential P1 of the first magnetic layer 21 to the second potential and sets the potential P2 of the third magnetic layer 23 to the third potential.

For example, when the first input value is "1" and the second input value is "1", the potential of the first magnetic layer 21 is set to the first potential, and the potential of the third magnetic layer 23 is set to the fourth potential, and a current flows from the first region 11a to the second region 11b. As a result, the orientation of the magnetization 21M and the orientation of the magnetization 22M are in the antiparallel state, and the orientation of the magnetization 24M does not change. When the first input value is "0" and the second input value is "0", the potential of the first magnetic layer 21 is set to the second potential, and the potential of the third magnetic layer 23 is set to the third potential. Then, a current flows from the second region 11b to the first region 11a. As a result, the orientation of the magnetization 22M does not change, and the orientation of the magnetization 23M and the orientation of the magnetization 24M become antiparallel.

After setting the potential P1, setting the potential P2, and supplying the current Iw1, the controller 90 outputs the output value from a reference value based on the first electrical resistance between the first conductive portion 11 and the first magnetic layer 21 and the second electrical resistance between the first conductive portion 11 and the third magnetic layer 23 in the determination operation. Specifically, a predetermined voltage is applied between the first magnetic layer 21 and the third magnetic layer 23, and a potential of the fifth region 11e is detected. The reference value is, for example, the potential of the fifth region 11e. The potential of the fifth region 11e changes according to the first electrical resistance and the second electrical resistance.

When the orientation of the magnetization 21M and the orientation of the magnetization 22M are parallel, and the orientation of the magnetization 23M and the orientation of the magnetization 24M are parallel, the potential of the fifth region 11e is an intermediate potential between the potential of the first magnetic layer 21 and the potential of the third magnetic layer 23. Similarly, when the orientation of the magnetization 21M and the orientation of the magnetization 22M are antiparallel, and the orientation of the magnetization 23M and the orientation of the magnetization 24M are antiparallel, the potential of the fifth region 11e is the intermediate potential. When the orientation of the magnetization 21M and the orientation of the magnetization 22M are one of the parallel state and the antiparallel state, and the orientation of the magnetization 23M and the orientation of the magnetization 24M are the other of the parallel state and the antiparallel state, the potential of the fifth region 11e is a value deviated from the intermediate potential.

The controller 90 compares the reference value with a preset range. For example, a range including the value of the intermediate potential is preset. The controller 90 compares the detected potential of the fifth region 11e with the range. When the potential of the fifth region 11e is within that range, the controller 90 determines that the output value is "0". When the potential of the fifth region 11e is outside the range, the controller 90 determines that the output value is "1".

Figure 15A:
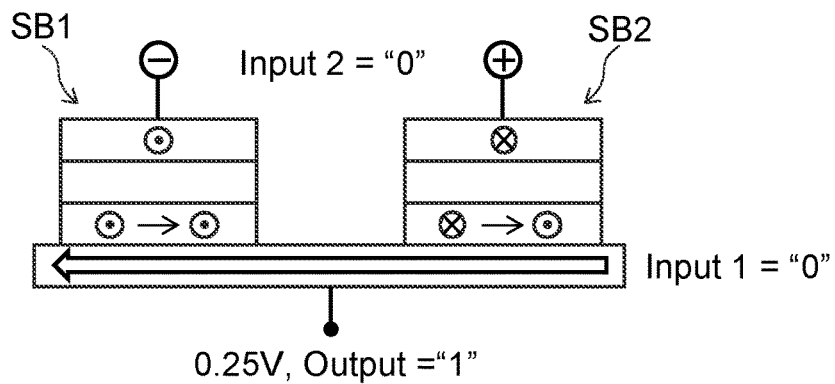
FIGS. 15A to 15D are schematic views illustrating operations of the magnetic device according to the second embodiment.
Figure 15B:
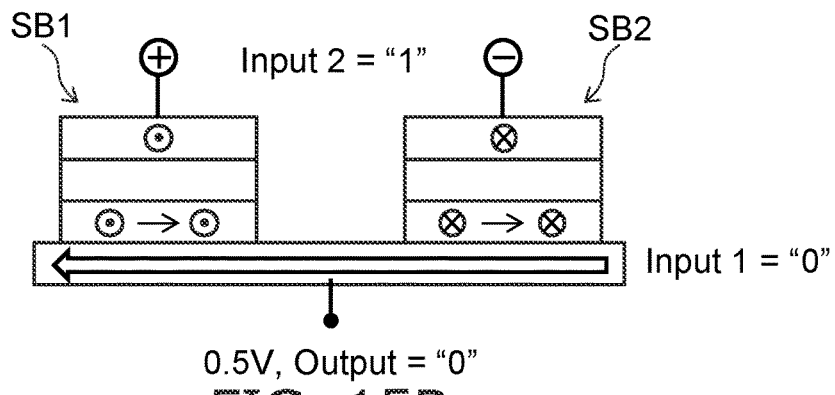
Figure 15C:
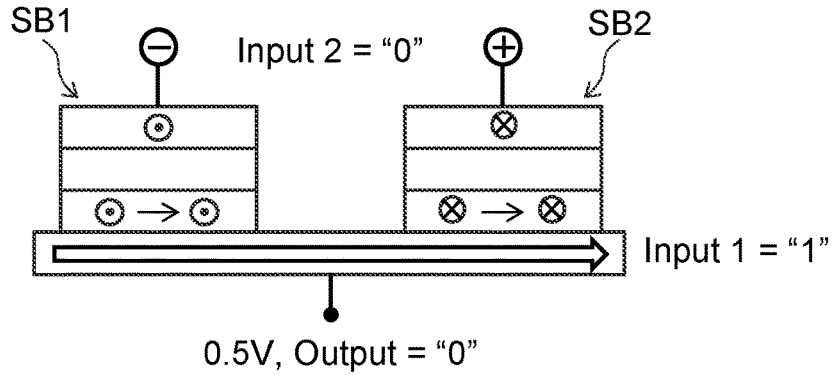
Figure 15D:
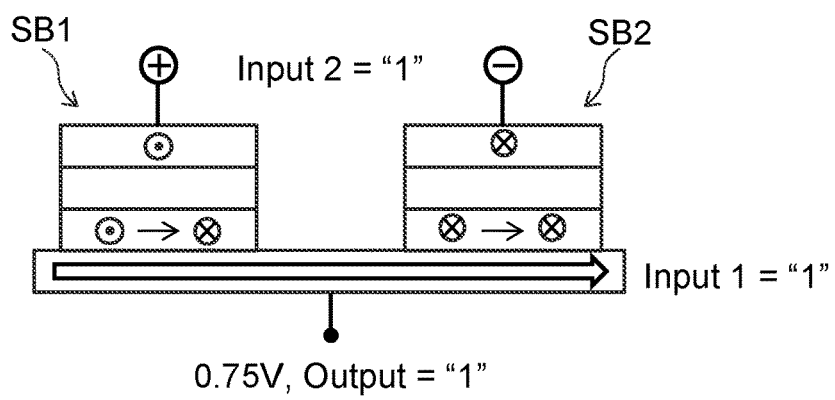

FIGS. 15A to 15D show the relationship between the input and the output. In FIGS. 15A to 15D, for convenience, the first potential or the third potential is indicated by "+", and the second potential or the fourth potential is indicated by "−". As an example, the controller 90 sets the potential of the first magnetic layer 21 to 0V and the potential of the third magnetic layer 23 to 1.0V. When the relationship between the orientation of the magnetization 21M and the orientation of the magnetization 22M is the same as the relationship between the orientation of the magnetization 23M and the orientation of the magnetization 24M, as shown in FIGS. 15B and 15C, the potential of the fifth regions 11e is 0.5 V. When the relationship between the orientation of the magnetization 21M and the orientation of the magnetization 22M is different from the relationship between the orientation of the magnetization 23M and the orientation of the magnetization 24M, as shown in FIGS. 15A and 15D, the potential of the fifth region 11e is a value deviating from 0.5V. The controller 90 compares the detected potential of the fifth region 11e with the preset range, and determines the output value.

As a result, the XNOR operation can be performed in the same manner as in the magnetic device 100 according to the first embodiment. Further, in the magnetic device 200 according to the second embodiment, the OR operation performed by the magnetic device 100 according to the first embodiment becomes unnecessary. By using the magnetic device 200 according to the second embodiment, it is not necessary to prepare the structure for the OR operation. Further, the XNOR operation can be performed with a simpler sequence as compared with the first embodiment.

Controller

Figure 16:
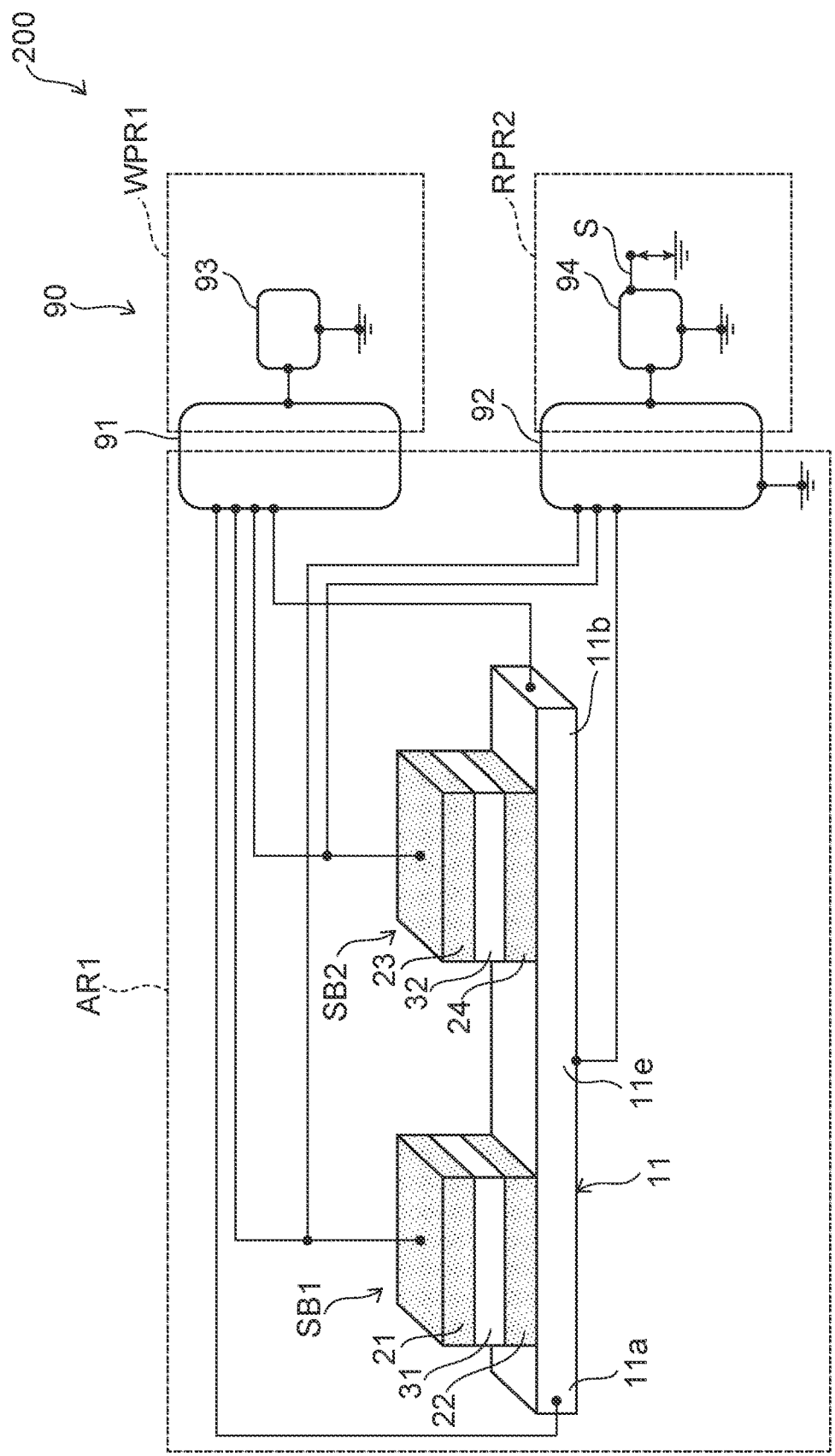
FIG. 16 is a specific example of the magnetic device according to the second embodiment.

FIG. 16 is a specific example of the magnetic device according to the second embodiment.

As shown in FIG. 16, for example, the controller 90 includes a program selector 91, a read selector 92, a program driver 93, and a sense amplifier 94. The program selector 91 is electrically connected with the first region 11a, the second region 11b, the first magnetic layer 21, and the third magnetic layer 23. The program selector 91 selects the first conductive portion 11 from the multiple conductive portions. Further, the program selector 91 selects the first stacked body SB1 and the second stacked body SB2 from the multiple stacked bodies. The program driver 93 supplies a current to the selected first conductive portion 11, sets the potential of the selected first magnetic layer 21, and sets the potential of the selected third magnetic layer 23. The program driver 93a controls the orientation of the current flowing through the first conductive portion 11, the potential of the first magnetic layer 21, and the potential of the third magnetic layer 23 according to the first input value and the second input value.

The read selector 92 is electrically connected with the fifth region 11e, the first magnetic layer 21, and the third magnetic layer 23. The read selector 92 selects the first stacked body SB1 and the second stacked body SB2 from the multiple stacked bodies. The read selector 92 applies a predetermined voltage between the first magnetic layer 21 and the third magnetic layer 23, and detects the potential of the fifth region 11e. The sense amplifier 94 amplifies and outputs a detected signal S.

For example, the first conductive portion 11, the first stacked body SB1, the second stacked body SB2, the program selector 91, the read selector 92, the program driver 93, and the sense amplifier 94 are provided on one substrate. The first conductive portion 11, the first stacked body SB1, and the second stacked body SB2 are provided in an array region AR1 in which the multiple conductive portions and the multiple stacked bodies are arranged. The program driver 93 is provided in a program peripheral circuit region WPR1. The sense amplifier 94 is provided in a read peripheral circuit region RPR1. For example, the program selector 91 is provided so as to straddle the array region AR1 and the program peripheral circuit region WPR1. The read selector 92 is provided so as to straddle the array region AR1 and the read peripheral circuit region RPR1.

The specific configuration of the controller 90 is not limited to the illustrated example. If the initialization operation, the first operation, and the determination operation described above can be performed, any configuration can be applied to the controller 90.

Modification

FIGS. 17A to 17C and FIGS. 18A to 18D are schematic views showing operations of the magnetic device according to the second embodiment.

The controller 90 may perform the following operations as the initialization operation and the first operation.

Figure 17A:
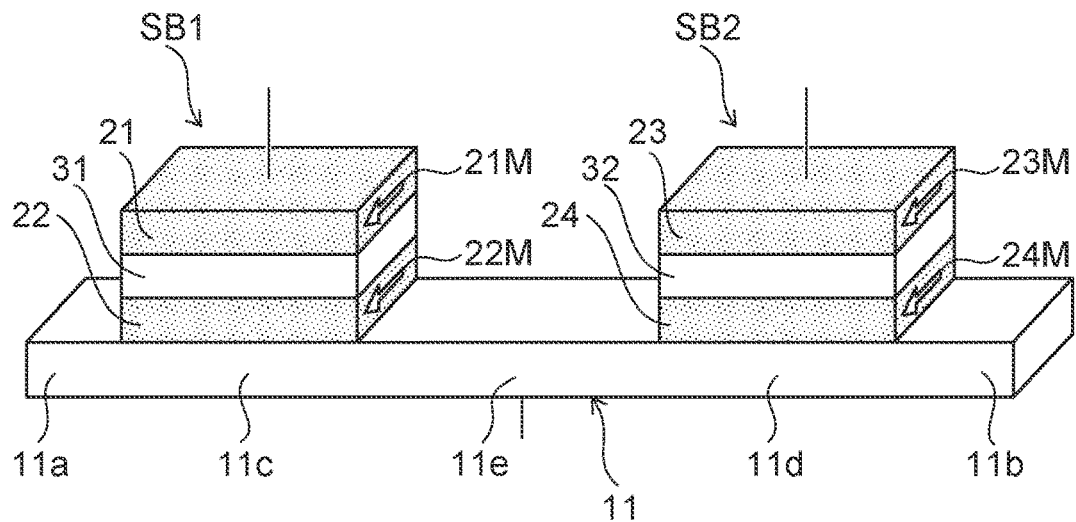
FIGS. 17A to 17C are schematic views showing operations of the magnetic device according to the second embodiment.

As shown in FIG. 17A, in the initialization operation, the controller 90 makes the orientation of the magnetization 21M and the orientation of the magnetization 21M parallel, and makes the orientation of the magnetization 23M and the orientation of the magnetization 24M parallel. In this example, the orientation of the magnetization 23M is the same as the orientation of the magnetization 21M.

Figure 17B:
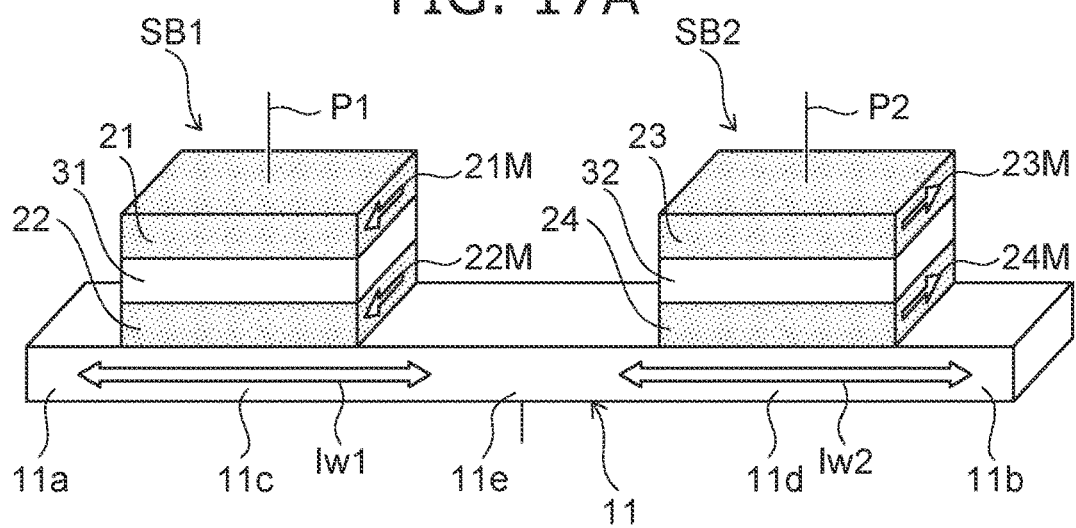
Figure 17C:
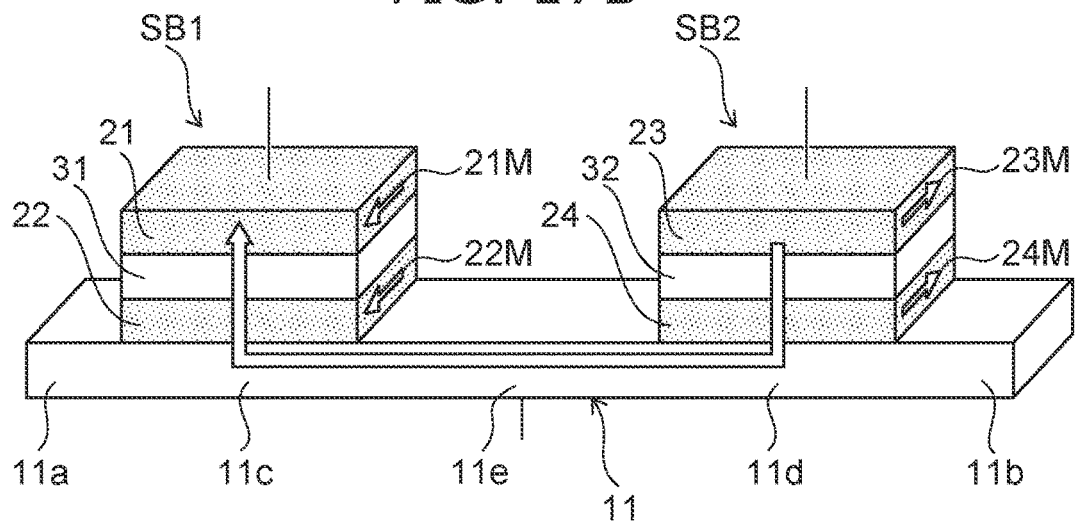

As shown in FIG. 17B, in the first operation, the controller 90 controls the orientation of the current Iw1, the orientation of the current Iw2, the potential P1, and the potential P2 according to the input value. For example, when the first input value is "1", the controller 90 supplies the current Iw1 directed from the first region 11a toward the fifth region 11e and the current Iw2 directed from the second region 11b toward the fifth region 11e to the conductive portion 11. When the first input value is "0", the controller 90 supplies the current Iw1 directed from the fifth region 11e toward the first region 11a and the current Iw2 directed from the fifth region 11e toward the second region 11b to the first conductive portion 11.

When the second input value is "1", the controller 90 sets the potential P1 of the first magnetic layer 21 to the first potential and sets the potential P2 of the third magnetic layer 23 to the fourth potential. When the second input value is "0", the controller 90 sets the potential P1 of the first magnetic layer 21 to the second potential and sets the potential P2 of the third magnetic layer 23 to the third potential.

After setting the potentials P1 and P2 and supplying the currents Iw1 and Iw2, the controller 90 performs the determination operation in the same manner as in the above-mentioned example. As a result, the output value is determined.

Figure 18A:
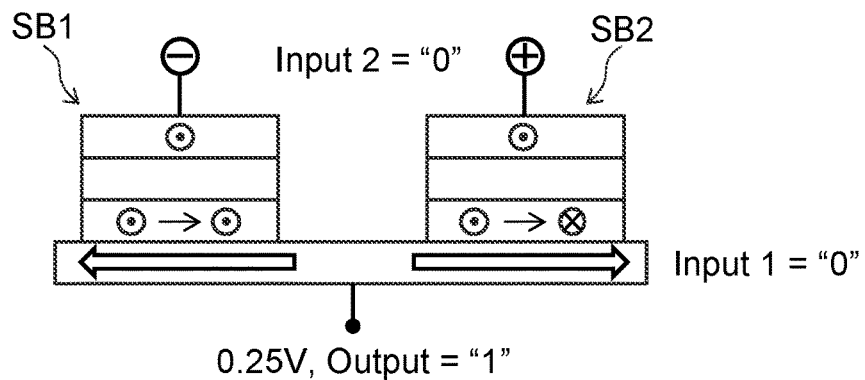
FIGS. 18A to 18D are schematic views showing operations of the magnetic device according to the second embodiment.
Figure 18B:
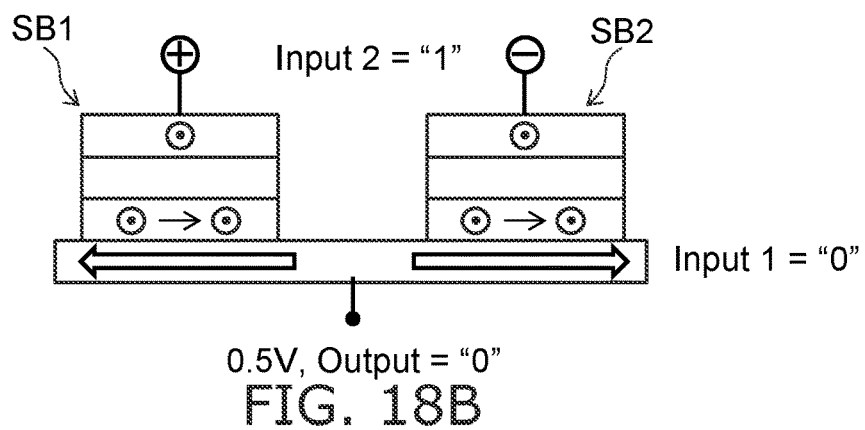
Figure 18C:
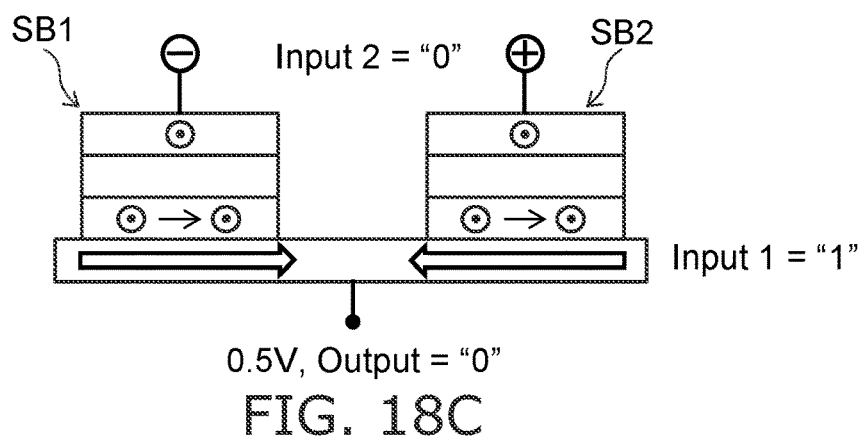
Figure 18D:
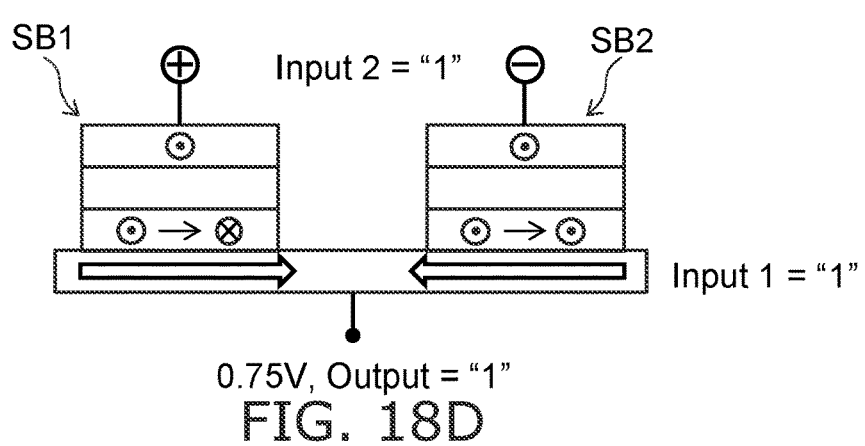

FIGS. 18A to 18D show the relationship between the input and the output. In FIGS. 18A to 18D, for convenience, the first potential or the third potential is indicated by "+", and the second potential or the fourth potential is indicated by "−". When the relationship between the orientation of the magnetization 21M and the orientation of the magnetization 22M is the same as the relationship between the orientation of the magnetization 23M and the orientation of the magnetization 24M, as shown in FIGS. 18B and 18C, the potential of the fifth regions 11e is 0.5 V. When the relationship between the orientation of the magnetization 21M and the orientation of the magnetization 22M is different from the relationship between the orientation of the magnetization 23M and the orientation of the magnetization 24M, as shown in FIGS. 18A and 18D, the of the fifth region 11e is a value deviating from 0.5V. The controller 90 compares the detected potential of the fifth region 11e with a preset range, and determines the output value.

By the above operation, the XNOR operation is performed by the magnetic device 200.

Third Embodiment

Figure 19:
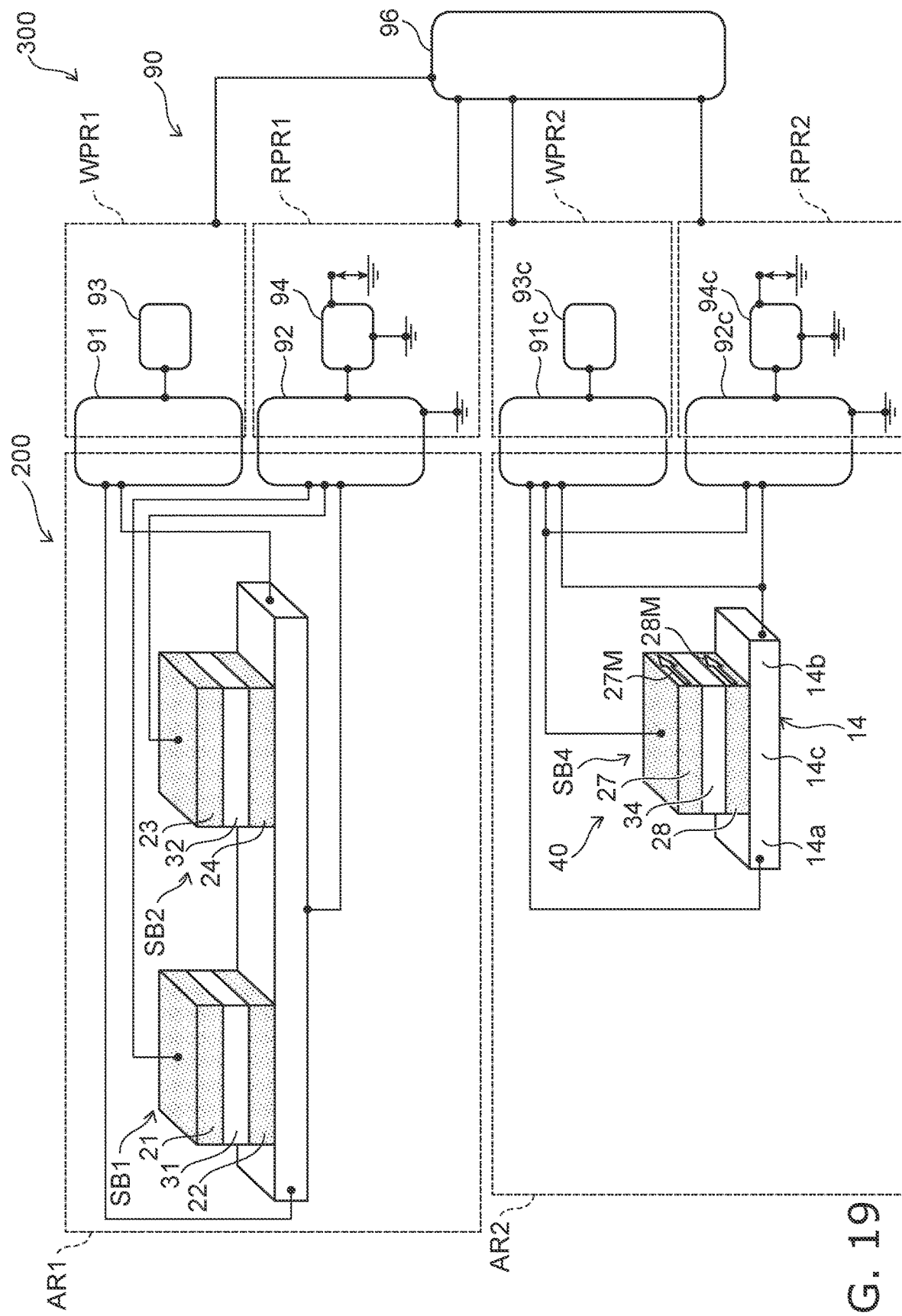
FIG. 19 is a schematic view showing a magnetic device according to a third embodiment.

FIG. 19 is a schematic view showing a magnetic device according to a third embodiment.

A magnetic device 300 according to the third embodiment further includes a memory part 40 as compared with the magnetic device 200 according to the second embodiment. The controller 90 stores the result (output value) of the XNOR operation in the memory part 40.

For example, the memory part 40 includes a seventh magnetic layer 27, an eighth magnetic layer 28, and a fourth non-magnetic layer 34 provided between the seventh magnetic layer 27 and the eighth magnetic layer 28. The same configuration as that of the first magnetic layer 21 can be applied to the seventh magnetic layer 27. The same configuration as that of the second magnetic layer 22 can be applied to the eighth magnetic layer 28. The same configuration as that of the first non-magnetic layer 31 can be applied to the fourth non-magnetic layer 34.

For example, the controller 90 makes the orientation of the magnetization 28M of the eighth magnetic layer 28 correspond to the output value. As a result, the result of the XNOR operation is stored. An electrical resistance of a path including the seventh magnetic layer 27, the fourth non-magnetic layer 34, and the eighth magnetic layer 28 depends on a difference between the orientation of the magnetization 27M and the orientation of the magnetization 28M. The stored output value is read out by detecting the electrical resistance of this path.

A method of storing the value in the eighth magnetic layer 28 is arbitrary. For example, the controller 90 may control the orientation of the magnetization 28M by passing a current between the seventh magnetic layer 27 and the eighth magnetic layer 28 and applying a spin transfer torque to the magnetization 28M. The controller 90 may perform pre-sessional switching in which a voltage is applied between the seventh magnetic layer 27 and the eighth magnetic layer 28 to control the orientation of the magnetization 28M. Alternatively, the orientation of the magnetization 28M may be controlled by using the spin-orbit torque, similarly to the first conductive portion 11 and the first stacked body SB1 of the magnetic device 100.

By using the stacked body SB4 for storage, the power consumption required for storing the output value can be reduced. In addition, the output value can be stored non-volatilely.

For example, the stacked body SB4 including the seventh magnetic layer 27, the fourth non-magnetic layer 34, and the eighth magnetic layer 28 is provided on a fourth conductive portion 14. The fourth conductive portion 14 includes a first connection region 14a, a second connection region 14b, and an intermediate region 14c. The intermediate region 14c is located between the first connection region 14a and the second connection region 14b. For example, the intermediate region 14c is continuous with the first connection region 14a and the second connection region 14b.

The seventh magnetic layer 27 is separated from the intermediate region 14c in a direction crossing a direction connecting the first connection region 14a and the second connection region 14b. The fourth non-magnetic layer 34 is provided between the intermediate region 14c and the seventh magnetic layer 27. The eighth magnetic layer 28 is provided between the intermediate region 14c and the fourth non-magnetic layer 34. Another layer may be provided between the first conductive portion 11 and the eighth magnetic layer 28. Another layer may be provided between the eighth magnetic layer 28 and the fourth non-magnetic layer 34. Another layer may be provided between the fourth non-magnetic layer 34 and the seventh magnetic layer 27.

The controller 90 is electrically connected with the first connection region 14a, the second connection region 14b, and the seventh magnetic layer 27. The controller 90 switches a potential of the seventh magnetic layer 27 between a seventh potential and an eighth potential. The eighth potential is different from the seventh potential. When the potential of the seventh magnetic layer 27 is the seventh potential, the orientation of the magnetization 27M is more likely to change than when the potential of the seventh magnetic layer 27 is the eighth potential. The controller 90 controls the potential of the seventh magnetic layer 27 and an orientation of a current flowing through the fourth conductive portion 14, and makes the orientation of the magnetization 27M correspond to the output value.

For example, the controller 90 further includes a program selector 91c, a read selector 92c, a program driver 93c, a sense amplifier 94c, and a control circuit 96, as compared to the example shown in FIG. The program selector 91c is electrically connected with the first connection region 14a, the second connection region 14b, and the seventh magnetic layer 27. The program selector 91c selects the fourth conductive portion 14 from the multiple conductive portions. Further, the program selector 91c selects the stacked body SB4 from the multiple stacked bodies. The program driver 93c performs the supply of the current to the selected fourth conductive portion 14 and the setting of the potential of the selected seventh magnetic layer 27.

The read selector 92c is electrically connected with the seventh magnetic layer 27 and the second connection region 14b. The read selector 92c selects the first stacked body SB1 from the multiple stacked bodies. The read selector 92c applies a predetermined voltage between the seventh magnetic layer 27 and the second connection region 14b. As a result, a signal (current) corresponding to the electrical resistance flows between the seventh magnetic layer 27 and the fourth conductive portion 14. The sense amplifier 94c amplifies and outputs the flowed signal.

For example, the fourth conductive portion 14, the stacked body SB4, the program selector 91c, the read selector 92c, the program driver 93c, and the sense amplifier 94c are provided on the substrate provided with the first conductive portion 11, the first stacked body SB1, the second stacked body SB2, and the like. As a result, the power consumption when storing the output value can be reduced. The fourth conductive portion 14 and the stacked body SB4 are provided in an array region AR2 in which the multiple conductive portions and the multiple stacked bodies for storing the output value are arranged. The program driver 93c is provided in a program peripheral circuit region WPR2 for programing information to the memory art 40. The sense amplifier 94c is provided in a read peripheral circuit region RPR2 for reading the information of the memory part 40. For example, the program selector 91c is provided so as to straddle the array region AR2 and the program peripheral circuit region WPR2. The read selector 92c is provided so as to straddle the array region AR2 and the read peripheral circuit region RPR2.

The control circuit 96 controls each component of the controller 90 described above. For example, when the magnetic device 200 is made to perform the XNOR operation, the control circuit 96 stores the output value in the memory part 40.

In recent years, inexpensive and ultra-low energy consumption logic gates and memories have been required for the Internet of Things (IoT), artificial intelligence (AI), machine learning, and the like. For example, in the Binary Neural Network (BNN), an XNOR logic gate is used. For this XNOR logic gate, for example, it is required to be able to perform operation with a simpler sequence.

According to each embodiment described above, it is possible to provide a magnetic device capable of further simplifying the structure and sequence of the device required for the XNOR operation. Further, according to the arithmetic device provided with the controller for performing the XNOR operation by using the first conductive portion 11, the first stacked body SB1, the second conductive portion 12, the second stacked body SB2, etc., the XNOR operation can be realized by a further simple sequence.

The embodiment may include the following configurations (e.g., technical proposals).

Configuration A1

A magnetic device, comprising:
a first conductive portion including a first region, a second region, a third region between the first region and the second region;
a first magnetic layer separated from the third region in a second direction crossing a first direction connecting the first region and the second region;
a first non-magnetic layer provided between the third region and the first magnetic layer;
a second magnetic layer provided between the third region and the first non-magnetic layer;
a second conductive portion including a fourth region, a fifth region, and a sixth region between the fourth region and the fifth region;
a third magnetic layer separated from the sixth region in a fourth direction crossing a third direction connecting the fourth region and the fifth region;
a second non-magnetic layer provided between the sixth region and the third magnetic layer;
a fourth magnetic layer provided between the sixth region and the second non-magnetic layer; and
a controller electrically connected with the first region, the second region, the fourth region, the fifth region, the first magnetic layer, and the third magnetic layer,
the controller being configured to implement
an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel,
a first operation detecting a first electrical resistance between the first conductive portion and the first magnetic layer after supplying a first current of an orientation corresponding to a first input value between the first region and the second region and setting a potential of the first magnetic layer according to a second input value, a second operation detecting a second electrical resistance between the second conductive portion and the third magnetic layer after supplying a second current of an orientation corresponding to the first input value the fourth region and the fifth region and setting a potential of the third magnetic layer according to the second input value, and a third operation obtaining an output value of logical sum of a first value corresponding to the first electrical resistance and a second value corresponding to the second electrical resistance.

Configuration A2

The magnetic device according to Configuration A1, wherein an orientation of the second current corresponding to the first value is opposite to an orientation of the first current corresponding to the first input value, or a potential of the third magnetic layer corresponding to the second input value is different from a potential of the first magnetic layer corresponding to the second input value.

Configuration A3

The magnetic device according to Configuration A1 or A2, wherein in the third operation, the controller derives the output value of the logical sum by using a structure, the structure including a third conductive portion, a fifth magnetic layer separated from the third conductive portion, a third non-magnetic layer provided between the third conductive portion and the fifth magnetic layer, and a sixth magnetic layer provided between the third conductive layer and the third non-magnetic layer.

Configuration A4

The magnetic device according to any one of Configurations A1 to A3, wherein the orientation of the magnetization of the first magnetic layer crosses a plane parallel to the first direction and the second direction, and the orientation of the magnetization of the third magnetic layer crosses a plane parallel to the third direction and the fourth direction.

Configuration A5

A magnetic device, comprising:

a first conductive portion including a first region, a second region, a third region between the first region and the second region, a fourth region between the second region and the third region, and a fifth region between the third region and the fourth region;

a first magnetic layer separated from the third region in a second direction crossing a first direction connecting the first region and the second region;

a first non-magnetic layer provided between the third region and the first magnetic layer;

a second magnetic layer provided between the third region and the first non-magnetic layer;

a third magnetic layer separated from the fourth region in the second direction;

a second non-magnetic layer provided between the fourth region and the third magnetic layer;

a fourth magnetic layer provided between the fourth region and the second non-magnetic layer; and a controller electrically connected with the first region, the second region, the fifth region, the first magnetic layer, and the third magnetic layer, the controller being configured to implement an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel, a first operation supplying a first current of an orientation corresponding to a first input value between the first region and the second region, and setting a potential of the first magnetic layer and a potential of the third magnetic layer according to a second input value, respectively, and a determination operation determining an output value from a reference value based on a first electrical resistance between the first conductive portion and the first magnetic layer and a second electrical resistance between the first conductive portion and the third magnetic layer.

Configuration A6

A magnetic device, comprising:

a first conductive portion including a first region, a second region, a third region between the first region and the second region, a fourth region between the second region and the third region, and a fifth region between the third region and the fourth region;

a first magnetic layer separated from the third region in a second direction crossing a first direction connecting the first region and the second region;

a first non-magnetic layer provided between the third region and the first magnetic layer;

a second magnetic layer provided between the third region and the first non-magnetic layer;

a third magnetic layer separated from the fourth region in the second direction;

a second non-magnetic layer provided between the fourth region and the third magnetic layer;

a fourth magnetic layer provided between the fourth region and the second non-magnetic layer; and a controller electrically connected with the first region, the second region, the fifth region, the first magnetic layer, and the third magnetic layer, the controller being configured to perform an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel, a first operation supplying a first current of an orientation corresponding to a first input value between the first region and the fifth region, supplying a second current of an opposite orientation to the first current between the second region and the fifth region, and setting a potential of the first magnetic layer and a potential of the third magnetic layer according to a second input value, respectively, and a determination operation determining an output value from a reference value based on a first electrical resistance between the first conductive portion and a second electrical resistance between the first conductive portion and the third magnetic layer.

Configuration A7

The magnetic device according to Configuration A5 or A6, wherein in the determination operation, the controller determines the output value to be 1, when the reference value shows that one of the first electrical resistance and the second electrical resistance is parallel, and determines the output value to be 0, when the reference value shows that both the first electrical resistance and the second electrical resistance are in parallel.

Configuration A8

The magnetic device according to Configuration A5 or A6, wherein in the determination operation, the controller detects a potential of the fifth region at application of a voltage between the first magnetic layer and the third magnetic layer as the reference value, and determines the output value based on the potential of the fifth region.

Configuration A9

The magnetic device according to any one of Configurations A5 to A8, wherein the potential of the third magnetic layer corresponding to the second input value is different from the potential of the first magnetic layer corresponding to the second input value.

Configuration A10

The magnetic device according to any one of Configurations A5 to A9, wherein the orientation of the magnetization of the first magnetic layer and the orientation of the magnetization of the third magnetic layer cross a plane parallel to the first direction and the second direction.

Configuration A11

The magnetic device according to any one of Configurations A1 to A10, further comprising:

a memory part storing the output value.

Configuration 12

The magnetic device according to Configuration 11, wherein the memory part includes
   a seventh magnetic layer,
   an eighth magnetic layer, and
   a fourth non-magnetic layer provided between the seventh magnetic layer and the eighth magnetic layer,
the controller stores the output value by making an orientation of magnetization of the eighth magnetic layer correspond to the output value.

Configuration A13

An arithmetic device configured to implement operation using a magnetic device, the magnetic device including:
   a first conductive portion including a first region, a second region, a third region between the first region and the second region;
   a first magnetic layer separated from the third region in a second direction crossing a first direction connecting the first region and the second region;
   a first non-magnetic layer provided between the third region and the first magnetic layer;
   a second magnetic layer provided between the third region and the first non-magnetic layer;
   a second conductive portion including a fourth region, a fifth region, and a sixth region between the fourth region and the fifth region;
   a third magnetic layer separated from the sixth region in a fourth direction crossing a third direction connecting the fourth region and the fifth region;
   a second non-magnetic layer provided between the sixth region and the third magnetic layer; and
   a fourth magnetic layer provided between the sixth region and the second non-magnetic layer,
the arithmetic device being configured to implement
   an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel,
   a first operation detecting a first electrical resistance between the first conductive portion and the first magnetic layer after supplying a first current of an orientation corresponding to a first input value between the first region and the second region and setting a potential of the first magnetic layer according to a second input value,
   a second operation detecting a second electrical resistance between the second conductive portion and the third magnetic layer after supplying a second current of an orientation corresponding to the first input value the fourth region and the fifth region and setting a potential of the third magnetic layer according to the second input value, and
   a third operation obtaining an output value of logical sum of a first value corresponding to the first electrical resistance and a second value corresponding to the second electrical resistance.

Configuration A14

An arithmetic device configured to implement operation by using a magnetic device, the magnetic device including:
   a first conductive portion including a first region, a second region, a third region between the first region and the second region, a fourth region between the second region and the third region, and a fifth region between the third region and the fourth region;
   a first magnetic layer separated from the third region in a second direction crossing a first direction connecting the first region and the second region;
   a first non-magnetic layer provided between the third region and the first magnetic layer;
   a second magnetic layer provided between the third region and the first non-magnetic layer;
   a third magnetic layer separated from the fourth region in the second direction;
   a second non-magnetic layer provided between the fourth region and the third magnetic layer;
   a fourth magnetic layer provided between the fourth region and the second non-magnetic layer,
the arithmetic device being configured to implement
   an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel,
   a first operation supplying a first current of an orientation corresponding to a first input value between the first region and the second region, and setting a potential of the first magnetic layer and a potential of the third magnetic layer to a second input value, respectively, and a determination operation determining an output value from a reference value based on a first electrical resistance between the first conductive portion and the first magnetic layer and a second electrical resistance between the first conductive portion and the third magnetic layer.

Configuration A15

An arithmetic device configured to implement operation by using a magnetic device, the magnetic device including:
- a first conductive portion including a first region, a second region, a third region between the first region and the second region, a fourth region between the second region and the third region, and a fifth region between the third region and the fourth region;
- a first magnetic layer separated from the third region in a second direction crossing a first direction connecting the first region and the second region;
- a first non-magnetic layer provided between the third region and the first magnetic layer;
- a second magnetic layer provided between the third region and the first non-magnetic layer;
- a third magnetic layer separated from the fourth region in the second direction;
- a second non-magnetic layer provided between the fourth region and the third magnetic layer;
- a fourth magnetic layer provided between the fourth region and the second non-magnetic layer, the arithmetic device being configured to implement
- an initialization operation making an orientation of magnetization of the first magnetic layer and an orientation of magnetization of the second magnetic layer parallel, and making an orientation of magnetization of the third magnetic layer and an orientation of magnetization of the fourth magnetic layer parallel,
- a first operation supplying a first current of an orientation corresponding to a first input value between the first region and the fifth region, supplying a second current of an opposite orientation to the first current between the second region and the fifth region, and setting a potential of the first magnetic layer and a potential of the third magnetic layer to a second input value, respectively, and
- a determination operation determining an output value from a reference value based on a first electrical resistance between the first conductive portion and a second electrical resistance between the first conductive portion and the third magnetic layer.

Fourth Embodiment

The fourth embodiment relates to a magnetic device. The magnetic device according to the fourth embodiment includes the first conductive portion 11, the first stacked body SB1, the second conductive portion 12, the second stacked body SB2, and the controller 90 similar to the magnetic device 100 according to the first embodiment (see, for example, FIG. 1).

Similar to the first embodiment, the first conductive portion 11 includes the first region 11a, the second region 11b, and the third region 11c between the first region 11a and the second region 11b. The direction from the first region 11a to the second region 11b is along the first direction.

Similar to the first embodiment, the first stacked body SB1 includes the first magnetic layer 21 and the second magnetic layer 22. The second magnetic layer 22 is between the third region 11c and the first magnetic layer 21 in the second direction crossing the first direction.

Similar to the first embodiment, the second conductive portion 12 includes the fourth region 12d, the fifth region 12e, and the sixth region 12f between the fourth region 12d and the fifth region 12e. The direction from the fourth region 12d to the fifth region 12e is along the third direction.

Similar to the first embodiment, the second stacked body SB2 includes the third magnetic layer 23 and the fourth magnetic layer 24. The fourth magnetic layer 24 is between the sixth region 12f and the third magnetic layer 23 in the fourth direction crossing the third direction.

Similar to the first embodiment, the controller 90 is electrically connected with the first conductive portion 11, the first stacked body SB1, the second conductive portion 12, and the second stacked body SB2. For example, the controller 90 is electrically connected with the first region 11a, the second region 11b, the fourth region 12d, the fifth region 12e, the first magnetic layer 21, and the second magnetic layer 22. In the embodiment, the electrically connected state may include a state in which a current flows and a state in which a current substantially flows can be switched by a switch (for example, a transistor or the like).

Similar to the first embodiment, the first stacked body SB1 can be in a first low electrical resistance state or a first high electrical resistance state higher than the first low electrical resistance state. In the first low electrical resistance state, for example, the magnetization 21M of the first magnetic layer 21 and the magnetization 22M of the second magnetic layer 22 are substantially "parallel" to each other. In the first high electrical resistance state, for example, the magnetization 21M of the first magnetic layer 21 and the magnetization 22M of the second magnetic layer 22 are substantially "antiparallel" to each other.

Similar to the first embodiment, the second stacked body SB2 can be in a second low electrical resistance state or a second high electrical resistance state higher than the second low electrical resistance state. In the second low electrical resistance state, for example, the magnetization 23M of the third magnetic layer 23 and the magnetization 24M of the fourth magnetic layer 24 are substantially "parallel" to each other. In the second high electrical resistance state, for example, the magnetization 23M of the third magnetic layer 23 and the magnetization 24M of the fourth magnetic layer 24 are substantially "antiparallel" to each other.

Figure 20:
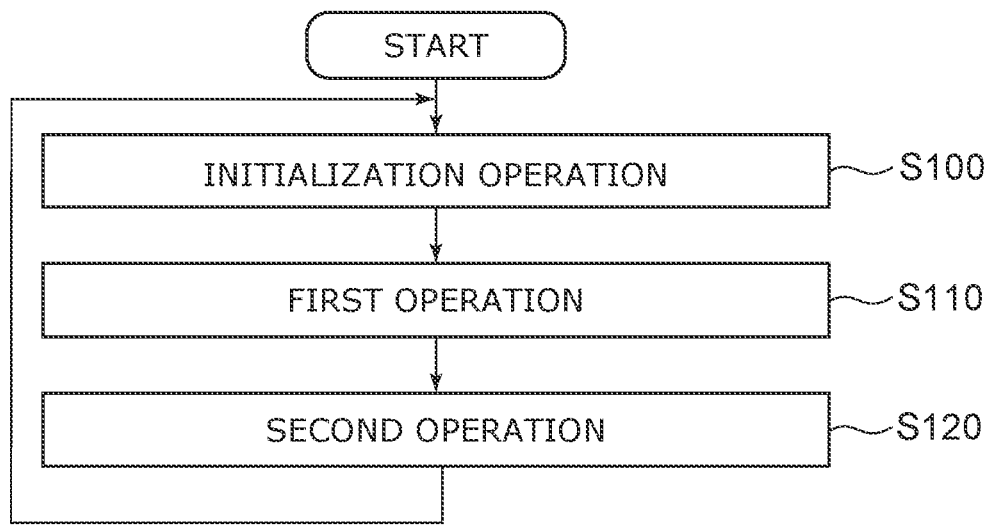
FIG. 20 is a flow chart illustrating an operation of a magnetic device according to a fourth embodiment.

FIG. 20 is a flow chart illustrating an operation of a magnetic device according to a fourth embodiment.

FIG. 20 illustrates an operation performed by the controller 90.

As shown in FIG. 20, the controller 90 performs the initialization operation S100, the first operation S110, and the second operation S120, and is configured to perform the XNOR operation on the first input and the second input. The initialization operation S100, the first operation S110, and the second operation S120 may be repeatedly performed. An example of these operations will be described below.

In the first operation S110, the controller 90 supplies the first current to the first conductive portion 11 while setting the potential of the first magnetic layer 21 to the first potential or the second potential, and supplies the second current to the second conductive portion 12 while setting the potential of the third magnetic layer 23 to the third potential or the fourth potential. The potential of the first magnetic layer 21 is, for example, the potential of the first magnetic layer 21 based on the potential of the first conductive portion 11. The potential of the third magnetic layer 23 is, for example, the potential of the third magnetic layer 23 based on the potential of the second conductive portion 12.

In the fourth embodiment, when the potential of the first magnetic layer 21 is the second potential, the electrical resistance of the first stacked body SB1 is more likely to change than when the potential of the first magnetic layer 21 is the first potential. The second potential is, for example, an Activate voltage (or selective potential). The first potential is, for example, a Deactivate voltage (or non-selective potential). In one example, the second potential is negative and the first potential is positive.

In the fourth embodiment, when the potential of the third magnetic layer 23 is the fourth potential, the electrical resistance of the second stacked body SB2 is more likely to change than when the potential of the third magnetic layer 23 is the third potential. The fourth potential is, for example, an Activate voltage (or selective potential). The third potential is, for example, a Deactivate voltage (or non-selective potential). In one example, the fourth potential is negative and the third potential is positive.

In the first operation S110, the controller 90 supplies the first current to the first conductive portion 11 while setting the potential of the first magnetic layer 21 to the first potential or the second potential, and supplies the second current to the second conductive portion 12 while setting the potential of the third magnetic layer 23 to the third potential or the fourth potential.

In the second operation S120, the controller 90 measures values corresponding to the electrical resistance of the first stacked body SB1 after the first operation S110 and the electrical resistance of the second stacked body SB2 after the first operation S110.

Figure 21:
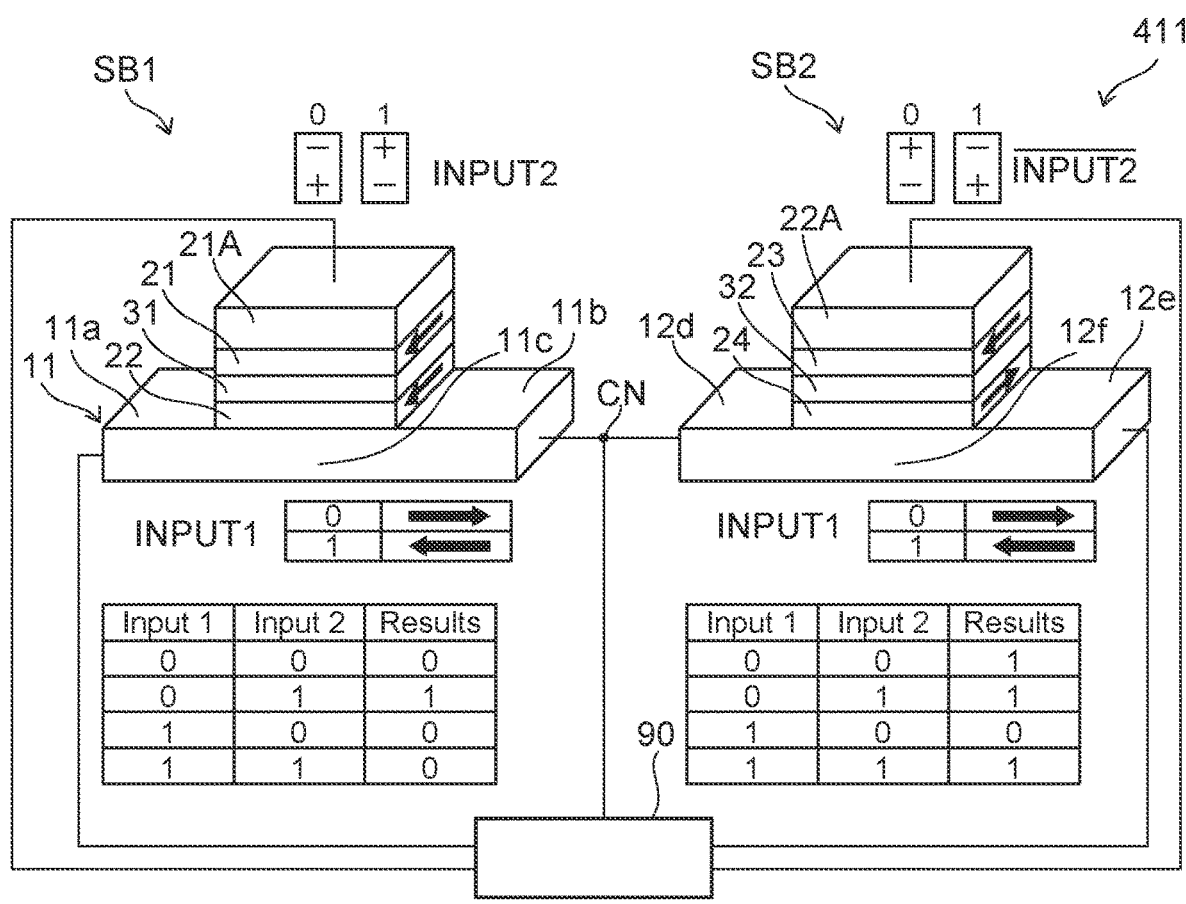
FIG. 21 is a schematic perspective view illustrating the magnetic device according to the fourth embodiment.

FIG. 21 is a schematic perspective view illustrating the magnetic device according to the fourth embodiment.

As shown in FIG. 21, in a magnetic device 411 according to the embodiment, the first stacked body SB1 may include a first magnetic member 21A. There is the first magnetic layer 21 between the third region 11c and the first magnetic member 21A. There is the first non-magnetic layer 31 between the second magnetic layer 22 and the first magnetic layer 21. The second stacked body SB2 may include a second magnetic member 22A. There is the third magnetic layer 23 between the sixth region 12f and the second magnetic member 22A. There is the second non-magnetic layer 32 between the fourth magnetic layer 24 and the third magnetic layer 23. The first magnetic member 21A and the second magnetic member 22A include, for example, at least one selected from the group consisting of IrMn and PtMn. The first magnetic member 21A and the second magnetic member 22A are, for example, antiferromagnetic layers.

As shown in FIG. 21, in this example, the second region 11b is electrically connected with the fourth region 12d. In the second operation S120, the controller 90 applies, for example, a first potential difference between the first magnetic layer 21 and the third magnetic layer 23. For example, the controller 90 is configured to measure the potential at a connection point CN of the second region 11b and the fourth region 12d when the first potential difference is applied to the first magnetic layer 21 with reference to the third magnetic layer 23. The measured result corresponds to the XNOR operation of the first input and the second input.

In the magnetic device 411, for example, the second input "INPUT2" is input to the first magnetic layer 21. For example, the inversion of the second input "INPUT2" is input to the third magnetic layer 23.

FIGS. 22A to 22D are schematic views illustrating the magnetic device according to the fourth embodiment.

FIG. 22A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 411 according to the embodiment.

FIG. 22B illustrates the magnetization configuration MG0 in the initialization operation S100. As shown in FIG. 22B, the controller 90 sets the first stacked body SB1 in the first low electrical resistance state ("P" and "L"), and sets the second stacked body SB2 in the second high electrical resistance state ("AP" and "H") in the initialization operation S100.

As shown in FIG. 22A, when the first input "INPUT1" is "0", in the first operation S110, the first current has an orientation I12 from the first region 11a to the second region 11b, and the second current has an orientation I45 from the fourth region 12d to the fifth region 12e. When the first input "INPUT1" is "1", In the first operation S110, the first current has an orientation I21 from the second region 11b to the first region 11a, and the second current has an orientation I54 from the fifth region 12e to the fourth region 12d.

As shown in FIG. 22A, when the second input "INPUT2" is "0", the potential of the first magnetic layer 21 is set to a first potential Vd1 in the first operation S110, and the potential of the third magnetic layer 23 is set to a fourth potential Va4. When the second input "INPUT2" is "1", in the first operation S110, the potential of the first magnetic layer 21 is set to a second potential Va2, and the potential of the third magnetic layer 23 is set to a third potential Vd3.

FIG. 22C illustrates magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 22D shows a measured value VD of the potential at the connection point CN of the second region 11b and the fourth region 12d as a result RJ of the second operation S120. As shown in FIG. 22D, when the first input is "0" and the second input is "1", or when the first input is "1" and the second input is "0", the measured value VD (for example, the potential at the connection point CN) obtained in the second operation is a first value (Va/2) which is about ½ of the first potential difference Va.

As shown in FIG. 22D, when the first input is "0" and the second input is "0", or when the first input is "1" and the second input is "1", the measured value VD (for example, the potential at the connection point CN) obtained in the second operation is different from the first value (Va/2). In this example, the measured value VD is 0.25 Va.

As shown in FIGS. 22C and 22D, the result RJ of the second operation S120 corresponds to the result of the XNOR operation of the first input and the second input. According to the magnetic device 411 according to the embodiment, a magnetic device having a simple configuration can be provided.

Hereinafter, some examples of the magnetic device according to the fourth embodiment will be described. Hereinafter, the description of at least a part similar to the magnetic device 411 will be omitted.

Figure 23:
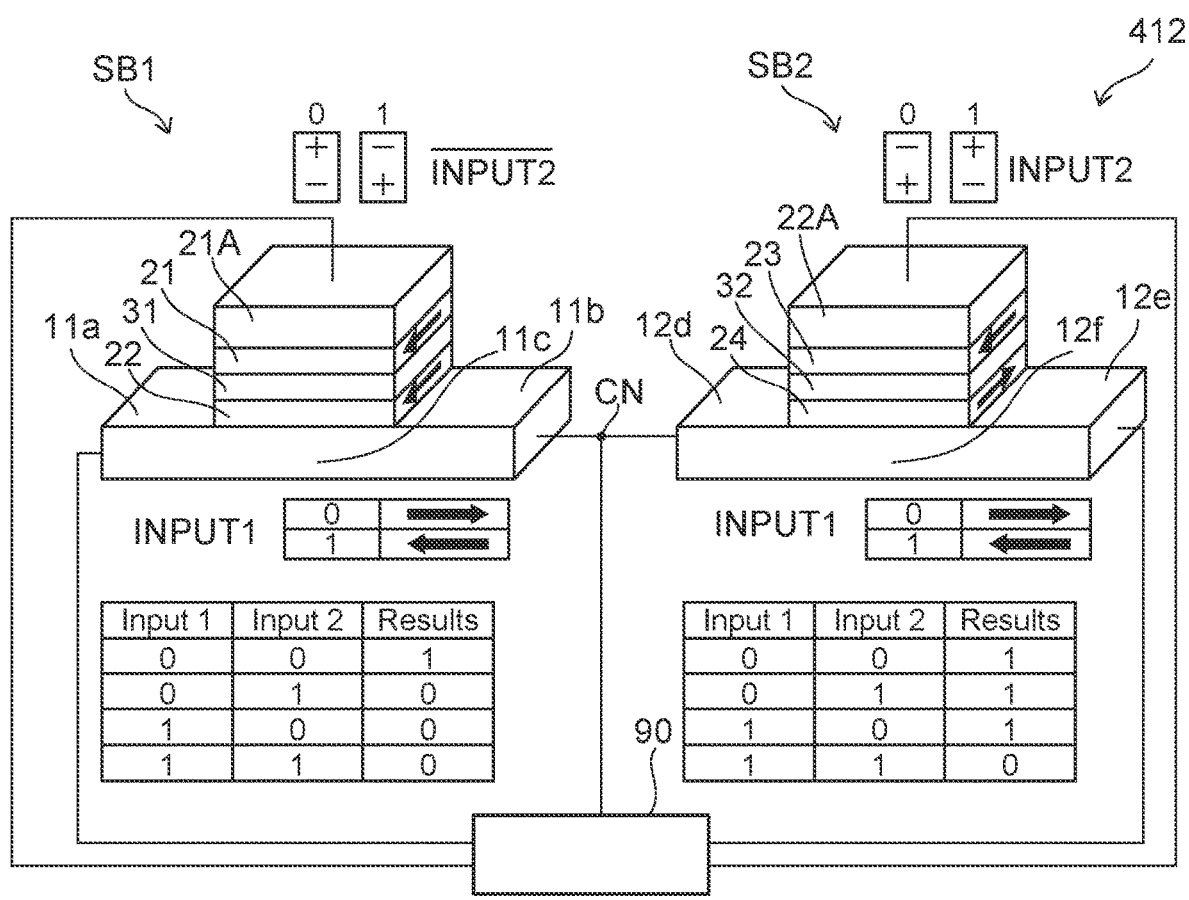
FIG. 23 is a schematic perspective view illustrating a magnetic device according to the fourth embodiment.

FIG. 23 is a schematic perspective view illustrating a magnetic device according to the fourth embodiment.

As shown in FIG. 23, in a magnetic device 412 according to the embodiment, for example, the inversion of the second input "INPUT2" is input to the first magnetic layer 21. For example, the second input "INPUT2" is input to the third magnetic layer 23.

FIGS. 24A to 24D are schematic views illustrating the magnetic device according to the fourth embodiment.

FIG. 24A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 412 according to the embodiment.

FIG. 24B illustrates the magnetization configuration MG0 in the initialization operation S100. As shown in FIG. 24B, the controller 90 sets the first stacked body SB1 in the first low electrical resistance state ("P" and "L"), and sets the second laminated body SB2 in the second high electrical resistance state ("AP" and "H") in the initialization operation S100.

As shown in FIG. 24A, when the first input "INPUT1" is "0", in the first operation S110, the first current has the orientation I12 from the first region 11a to the second region 11b, and the second current has the orientation I45 from the fourth region 12d to the fifth region 12e. When the first input "INPUT1" is "1", in the first operation S110, the first current has the orientation I21 from the second region 11b to the first region 11a, and the second current has an orientation I54 from the fifth region 12e to the fourth region 12d.

As shown in FIG. 24A, when the second input "INPUT2" is "0", In the first operation S110, the potential of the first magnetic layer 21 is set to the second potential Va2 and the third magnetic layer 23 is set to the third potential Vd3. When the second input "INPUT2" is "1", in the first operation S110, the potential of the first magnetic layer 21 is set to the first potential Vd1, and the potential of the third magnetic layer 23 is set to the fourth potential Va4.

FIG. 24C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 24D shows the measured value VD of the potential at the connection point CN of the second region 11b and the fourth region 12d as the result RJ of the second operation S120. As shown in FIG. 24D, when the first input Is "0" and the second input is "0", or when the first input is "1" and the second input is "1", the measured value VD (for example, the potential at the connection point CN) obtained in the second operation is the first value (Va/2) which is about ½ of the first potential difference Va.

As shown in FIG. 24D, when the first input is "0" and the second input Is "1", or when the first input is "1" and the second input is "0", the measured value VD (for example, the potential at the connection point CN) obtained in the second operation is different from the first value (Va/2). In this example, the measured value VD is 0.25 Va.

As shown in FIGS. 24C and 24D, the result RJ of the second operation S120 corresponds to the result of the XNOR operation of the first input and the second input. According to the magnetic device 412 according to the embodiment, a magnetic device having a simple configuration can be provided.

Figure 25:
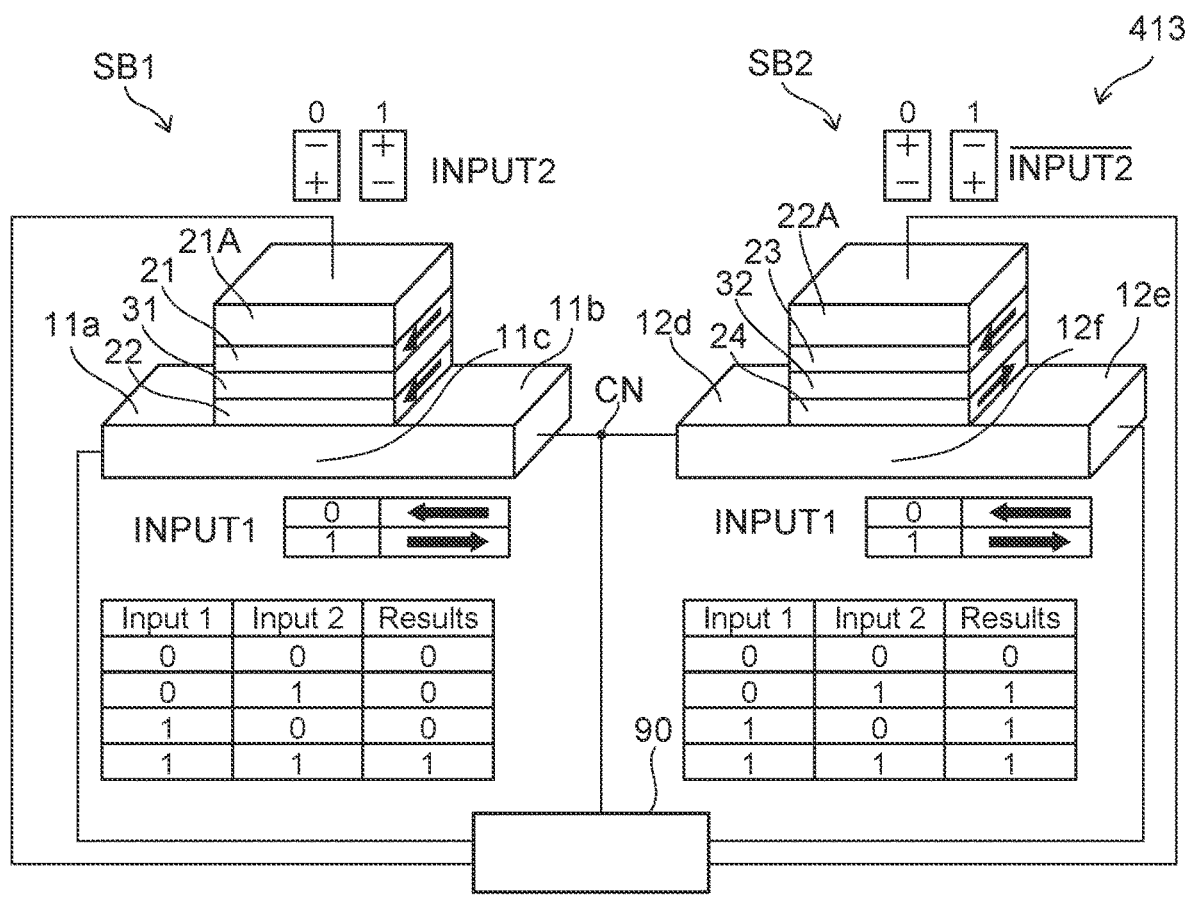
FIG. 25 is a schematic perspective view illustrating a magnetic device according to the fourth embodiment.

FIG. 25 is a schematic perspective view illustrating a magnetic device according to the fourth embodiment.

As shown in FIG. 25, in a magnetic device 413 according to the embodiment, for example, the second input "INPUT2" is input to the first magnetic layer 21. For example, the inversion of the second input "INPUT2" is input to the third magnetic layer 23.

FIGS. 26A to 26D are schematic views illustrating the magnetic device according to the fourth embodiment.

FIG. 26A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 413 according to the embodiment.

FIG. 26B illustrates the magnetization configuration MG0 in the initialization operation S100. As shown in FIG. 26B, the controller 90 sets the first stacked body SB1 in the first low electrical resistance state ("P" and "L"), and sets the second stacked body SB2 in the second high electrical resistance state ("AP" and "H") in the initialization operation S100.

As shown in FIG. 26A, when the first input "INPUT1" is "0", in the first operation S110, the first current has the orientation I21 from the second region 11b to the first region 11a, and the second current has the orientation I54 from the fifth region 12e to the fourth region 12d. When the first input "INPUT1" is "1", in the first operation S110, the first current has the orientation I12 from the first region 11a to the second region 11b, and the second current has the orientation from the fourth region 12d to the fifth region 12e.

As shown in FIG. 26A, when the second input "INPUT2" is "0", in the first operation S110, the potential of the first magnetic layer 21 is set to the first potential Vd1, and the potential of the third magnetic layer 23 is set to the fourth potential Va4. When the second input "INPUT2" is "1", in the first operation S110, the potential of the first magnetic layer 21 is set to the second potential Va2, and the potential of the third magnetic layer 23 is set to the third potential Vd3.

FIG. 26C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 26D shows the measured value VD of the potential at the connection point CN of the second region 11b and the fourth region 12d as the result RJ of the second operation S120. As shown in FIG. 26D, when the first input is "0" and the second input is "0", or when the first input is "1" and the second input is "1", the measured value VD (for example, the potential at the connection point CN) obtained in the second operation is the first value (Va/2) which is about ½ of the first potential difference Va.

As shown in FIG. 26D, when the first input is "0" and the second input is "1", or when the first input is "1" and the second input is "0", the measured value VD (for example, the potential at the connection point CN) obtained in the second operation is different from the first value (Va/2). In this example, the measured value VD is 0.25 Va.

As shown in FIGS. 26C and 26D, the result RJ of the second operation S120 corresponds to the result of the XNOR operation of the first input and the second input. According to the magnetic device 413 according to the embodiment, a magnetic device having a simple configuration can be provided.

Figure 27:
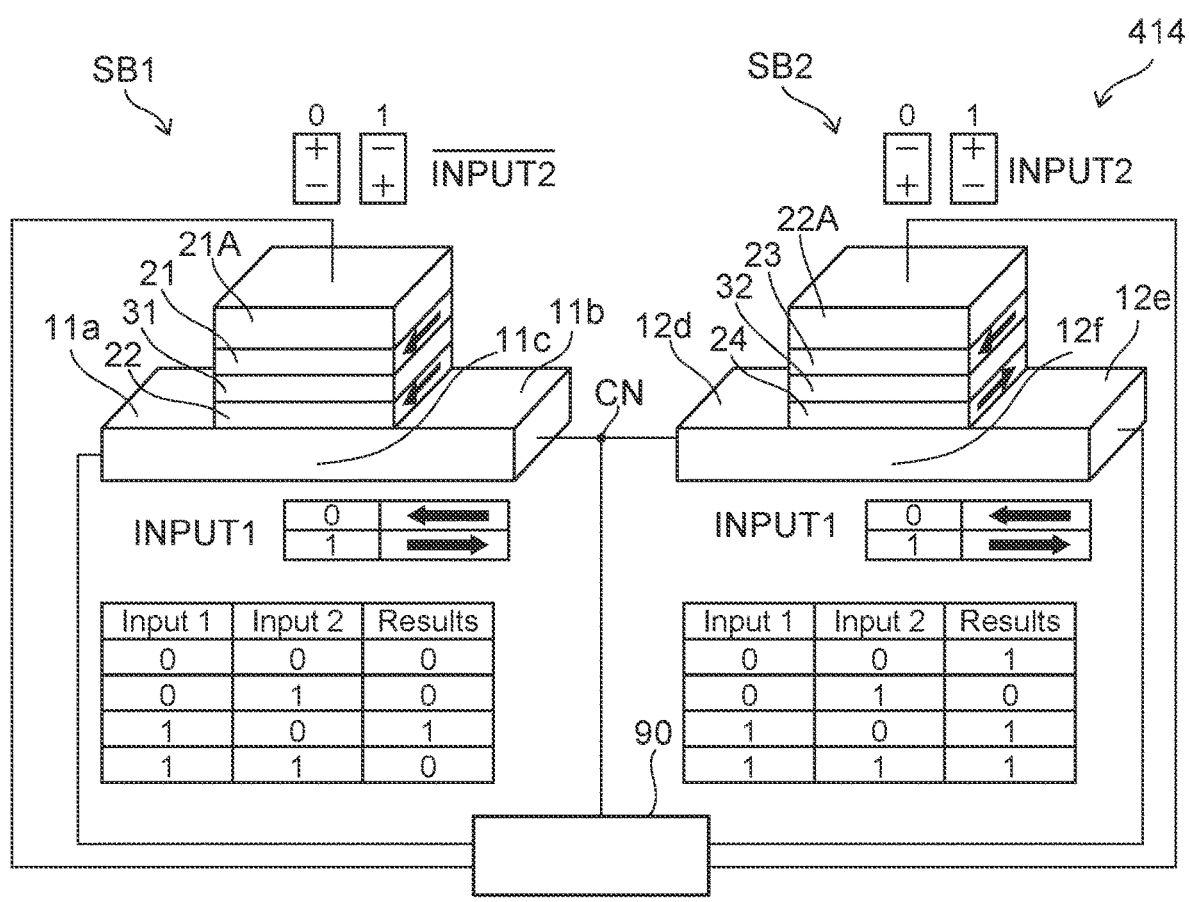
FIG. 27 is a schematic perspective view illustrating a magnetic device according to the fourth embodiment.

FIG. 27 is a schematic perspective view illustrating a magnetic device according to the fourth embodiment.

As shown in FIG. 27, in a magnetic device 414 according to the embodiment, for example, the inversion of the second input "INPUT2" is input to the first magnetic layer 21. For example, the second input "INPUT2" is input to the third magnetic layer 23.

FIGS. 28A to 28D are schematic views illustrating the magnetic device according to the fourth embodiment.

FIG. 28A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 414 according to the embodiment.

FIG. 28S illustrates the magnetization configuration MG0 in the initialization operation S100. As shown in FIG. 28B, the controller 90 sets the first stacked body SB1 in the first low electrical resistance state ("P" and "L"), and sets the second laminated body SB2 to the second high electrical resistance state ("AP" and "H") in the initialization operation S100.

As shown in FIG. 28A, when the first input "INPUT1" is "0", in the first operation S110, the first current has the orientation I21 from the second region 11b to the first region 11a, and the second current has the orientation I54 from the fifth region 12e to the fourth region 12d. When the first input "INPUT1" is "1", in the first operation S110, the first current has the orientation I12 from the first region 11a to the second region 11b, and the second current has the orientation I45 from the fourth region 12d to the fifth region 12e.

As shown in FIG. 28A, when the second input "INPUT2" is "0", in the first operation S110, the potential of the first magnetic layer 21 is set to the second potential Va2 and the potential of the third magnetic layer 23 is set to the third potential Vd3. When the second input "INPUT2" is "1", in the first operation S110, the potential of the first magnetic layer 21 is set to the first potential Vd1, and the potential of the third magnetic layer 23 is set to the fourth potential Va4.

FIG. 28C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 28D shows the measured value VD of the potential at the connection point CN of the second region 11b and the fourth region 12d as the result RJ of the second operation S120. As shown in FIG. 28D, when the first input is "0" and the second input is "1", or when the first input is "1" and the second input is "0", the measured value VD (for example, the potential at the connection point CN) obtained in the second operation is the first value (Va/2) which is about ⅓ of the first potential difference Va.

As shown in FIG. 28D, when the first input is "0" and the second input is "0", or when the first input is "1" and the second input is "1", the measured value VD (for example, the potential at the connection point CN) obtained in the second operation is different from the first value (Va/2). In this example, the measured value VD is 0.25 Va.

As shown in FIGS. 28C and 28D, the result RJ of the second operation S120 corresponds to the result of the XNOR operation of the first input and the second input. According to the magnetic device 414 according to the embodiment, a magnetic device having a simple configuration can be provided.

Figure 29:
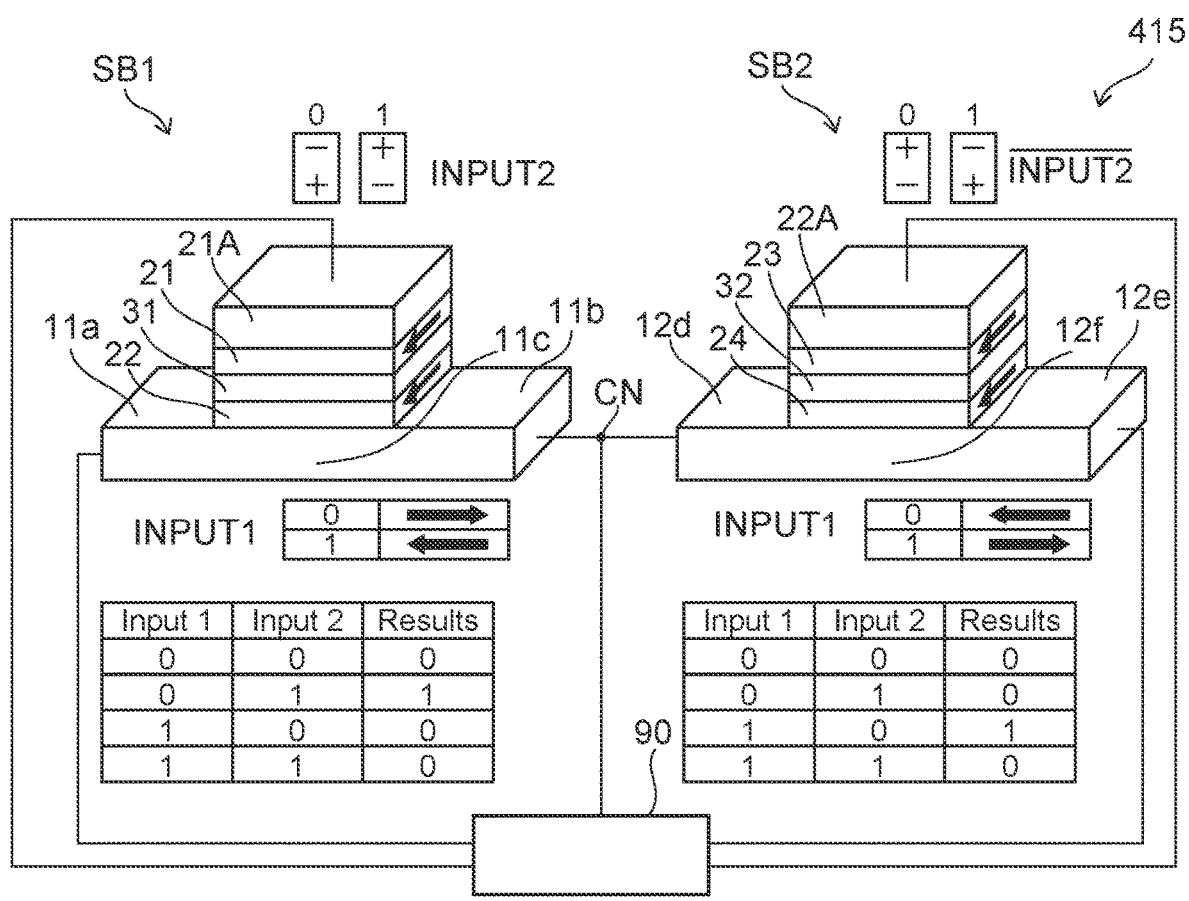
FIG. 29 is a schematic perspective view illustrating a magnetic device according to the fourth embodiment.

FIG. 29 is a schematic perspective view illustrating a magnetic device according to the fourth embodiment.

As shown in FIG. 29, in a magnetic device 415 according to the embodiment, for example, the second input "INPUT2" is input to the first magnetic layer 21. For example, the inversion of the second input "INPUT2" is input to the third magnetic layer 23.

FIGS. 30A to 30D are schematic views illustrating the magnetic device according to the fourth embodiment.

FIG. 30A shows the definition of magnetization MGD, the orientation of the conductive portion, and the bias voltage VSB applied to the magnetic layer, when the first input "INPUT1" and the second input "INPUT2" are "0" or "1" in the magnetic device 415 according to the embodiment.

FIG. 30B illustrates the magnetization configuration MG0 in the initialization operation S100. As shown in FIG. 30B, the controller 90 sets the first stacked body SB1 in the first low electrical resistance state ("P" and "L"), and sets the second laminated body S82 in the second low electrical resistance state ("P" and "L") in the initialization operation S100.

As shown in FIG. 30A, when the first input "INPUT1" is "0", in the first operation S110, the first current has the orientation I12 from the first region 11a to the second region 11b, and the second current has the orientation I54 from the fifth region 12e to the fourth region 12d. When the first input "INPUT1" is "1", in the first operation S110, the first current has the orientation I21 from the second region 11b to the first region 11a, and the second current has the orientation I45 from the fourth region 12d to the fifth region 12e.

As shown in FIG. 30A, when the second input "INPUT2" is "0", in the first operation S110, the potential of the first magnetic layer 21 is set to the first potential Vd1 and the potential of the third magnetic layer 23 is set to the fourth potential Va4. When the second input "INPUT2" is "1", in the first operation S110, the potential of the first magnetic layer 21 is set to the second potential Va2, and the potential of the third magnetic layer 23 is set to the third potential Vd3.

FIG. 30C illustrates the magnetization configuration MG1 of the first input "INPUT1", the second input "INPUT2", and the magnetization configuration MGR after the first operation S110 in the first operation S110. Magnetization configuration The MGR corresponds, for example, to the operation result.

FIG. 30D shows the measured value VD of the potential at the connection point CN of the second region 11b and the fourth region 12d as the result RJ of the second operation S120. As shown in FIG. 30D, when the first input is "0" and the second input is "0", or when the first input is "1" and the second input is "1", the measured value VD (for example, the potential at the connection point CN) obtained in the second operation is the first value (Va/2) which is about ½ of the first potential difference Va.

As shown in FIG. 30D, when the first input is "0" and the second input is "1", or when the first input is "1" and the second input is "0", the measured value VD (for example, the potential at the connection point CN) obtained in the second operation is different from the first value (Va/2). In this example, the measured value VD is 0.75 Va.

As shown in FIGS. 30C and 30D, the result RJ of the second operation S120 corresponds to the result of the XNOR operation of the first input and the second input. According to the magnetic device 415 according to the embodiment, a magnetic device having a simple configuration can be provided.

Figure 31:
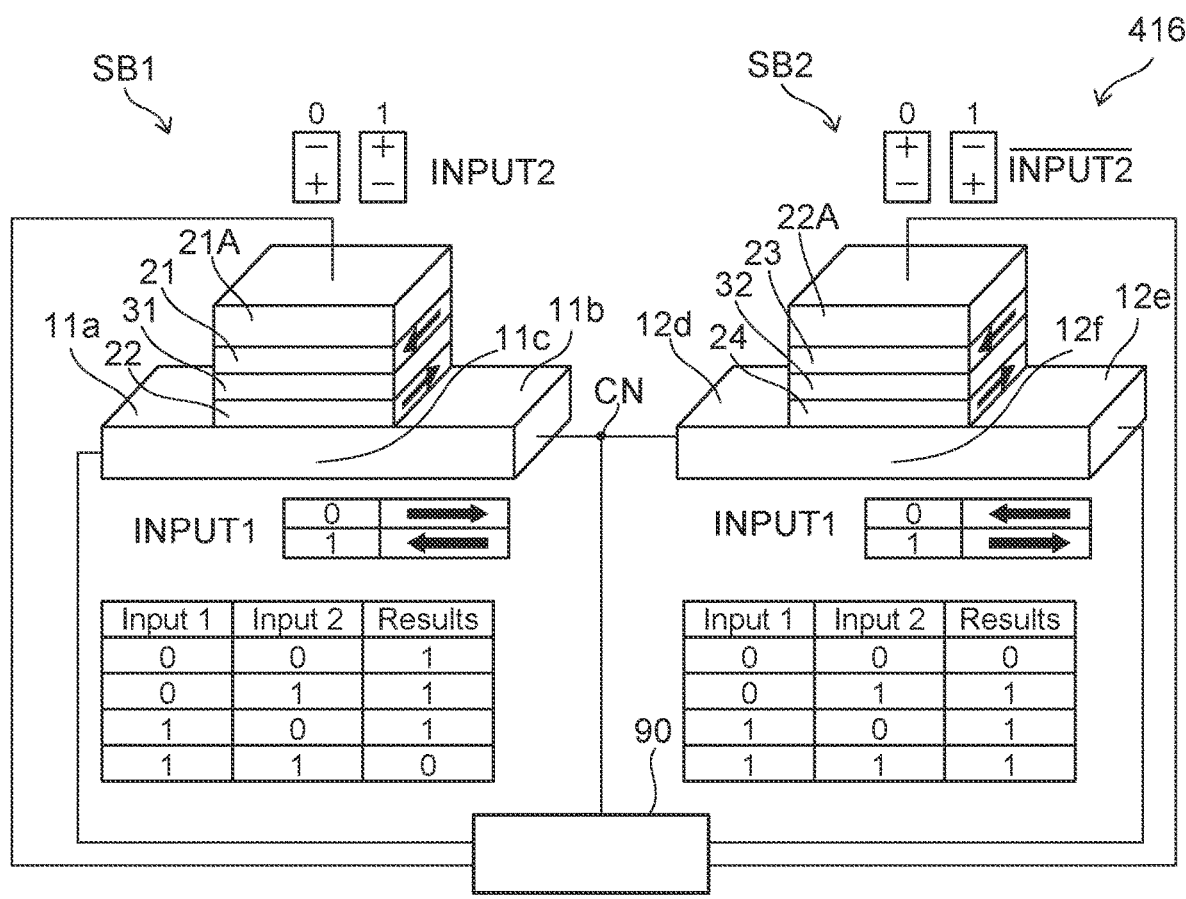
FIG. 31 is a schematic perspective view illustrating a magnetic device according to the fourth embodiment.

FIG. 31 is a schematic perspective view illustrating a magnetic device according to the fourth embodiment.

As shown in FIG. 31, in a magnetic device 416 according to the embodiment, for example, the second input "INPUT2" is input to the first magnetic layer 21. For example, the inversion of the second input "INPUT2" is input to the third magnetic layer 23.

FIGS. 32A to 32D are schematic views illustrating the magnetic device according to the fourth embodiment.

FIG. 32A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 416 according to the embodiment.

FIG. 32B illustrates the magnetization configuration MG0 in the initialization operation S100. As shown in FIG. 32B, the controller 90 sets the first stacked body SB1 in the first high electrical resistance state ("AP" and "H") in the initialization operation S100, and sets the second laminated body SB2 in the second high electrical resistance state ("AP" and "H") in the initialization operation S100.

As shown in FIG. 32A, when the first input "INPUT1" is "0", in the first operation S110, the first current has the orientation I12 from the first region 11a to the second region 11b, and the second current has the orientation I54 from the fifth region 12e to the fourth region 12d. When the first input "INPUT1" is "1", in the first operation S110, the first current has the orientation I21 from the second region 11b to the first region 11a, and the second current has the orientation I45 from the fourth region 12d to the fifth region 12e.

As shown in FIG. 32A, when the second input "INPUT2" is "0", in the first operation S110, the potential of the first magnetic layer 21 is set to the first potential Vd1 and the potential of the third magnetic layer 23 is set to the fourth potential Va4. When the second input "INPUT2" is "1", In the first operation S110, the potential of the first magnetic layer 21 is set to the second potential Va2, and the potential of the third magnetic layer 23 is set to the third potential Vd3.

FIG. 32C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 32D shows the measured value VD of the potential at the connection point CN of the second region 11b and the fourth region 12d as the result RJ of the second operation S120. As shown in FIG. 32D, when the first input is "0" and the second input is "1", or when the first input is "1" and the second input is "0", the measured value VD (for example, the potential at the connection point CN) obtained in the second operation is the first value (Va/2) which is about ½ of the first potential difference Va.

As shown in FIG. 32D, when the first input is "0" and the second input is "0", or when the first input is "1" and the second input is "1", the measured value VD (for example, the potential at the connection point CN) obtained in the second operation is different from the first value (Va/2). In this example, when the first input is "0" and the second input is "0", the measured value VD is 0.75 Va. When the first input is "1" and the second input is "1", the measured value VD obtained in the second operation is 0.25 Va.

As shown in FIGS. 32C and 32D, the result RJ of the second operation S120 corresponds to the result of the XNOR operation of the first input and the second input. According to the magnetic device 416 according to the embodiment, a magnetic device having a simple configuration can be provided.

Figure 33:
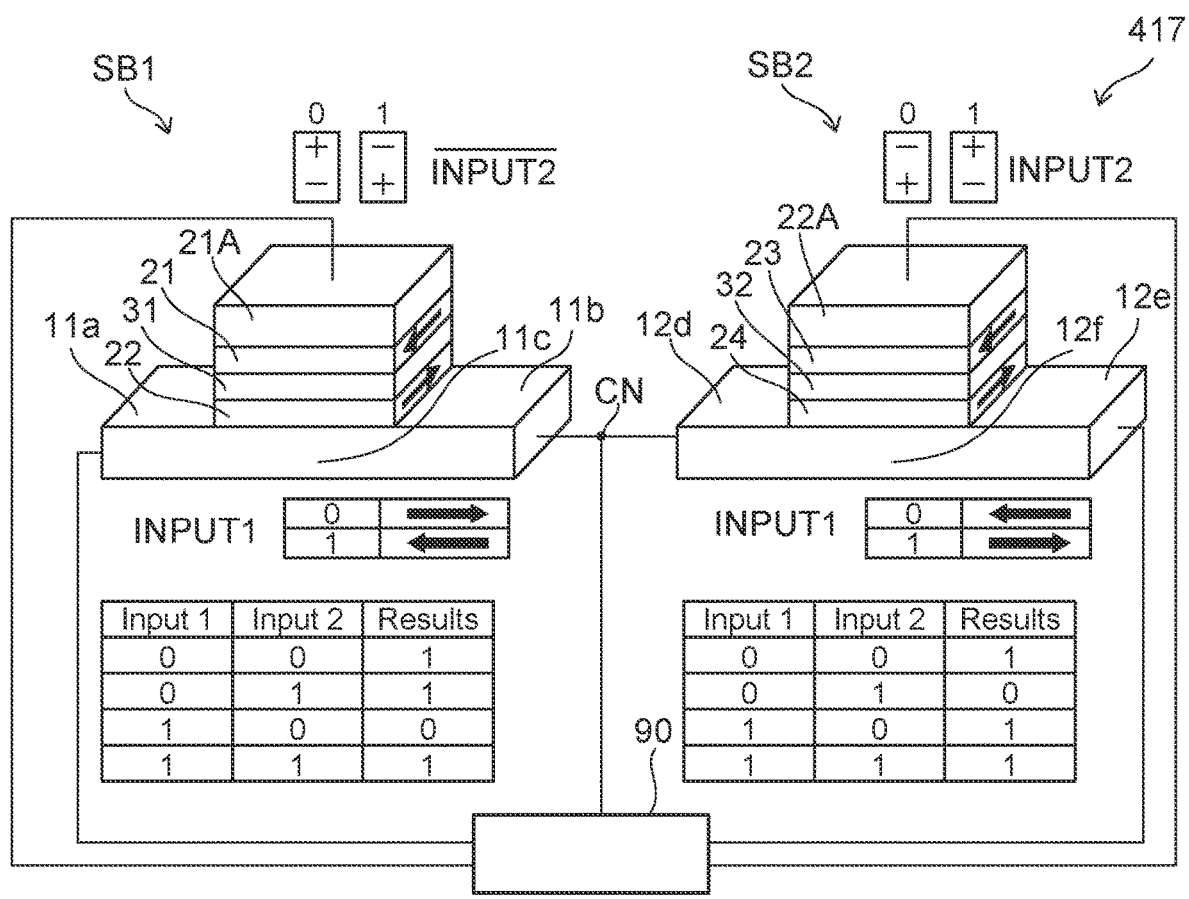
FIG. 33 is a schematic perspective view illustrating a magnetic device according to the fourth embodiment.

FIG. 33 is a schematic perspective view illustrating a magnetic device according to the fourth embodiment.

As shown in FIG. 33, in a magnetic device 417 according to the embodiment, for example, the inversion of the second input "INPUT2" is input to the first magnetic layer 21. For example, the second input "INPUT2" is input to the third magnetic layer 23.

FIGS. 34A to 34D are schematic views illustrating the magnetic device according to the fourth embodiment.

FIG. 34A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 417 according to the embodiment.

FIG. 34B illustrates the magnetization configuration MG0 in the initialization operation S100. As shown in FIG. 34B, the controller 90 sets the first stacked body SB1 in the first high electrical resistance state ("AP" and "H"), and sets the second laminated body SB2 in the second high electrical resistance state ("AP" and "H") in the initialization operation S100.

As shown in FIG. 34A, when the first input "INPUT1" is "0", in the first operation S110, the first current has the orientation I12 from the first region 11a to the second region 11b, and the second current has the orientation I54 from the fifth region 12e to the fourth region 12d. When the first input "INPUT1" is "1", in the first operation S110, the first current has the orientation I21 from the second region 11b to the first region 11a, and the second current has the orientation I45 from the fourth region 12d to the fifth region 12e.

As shown in FIG. 34A, when the second input "INPUT2" is "0", in the first operation S110, the potential of the first magnetic layer 21 is set to the second potential Va2 and the potential of the third magnetic layer 23 is set to the third potential Vd3. When the second input "INPUT2" is "1", in the first operation S110, the potential of the first magnetic layer 21 is set to the first potential Vd1, and the potential of the third magnetic layer 23 is set to the fourth potential Va4.

FIG. 34C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 34D shows the measured value VD of the potential at the connection point CN of the second region 11b and the fourth region 12d as the result RJ of the second operation S120. As shown in FIG. 34D, when the first input is "0" and the second input is "0", or when the first input is "1" and the second input is "1", the measured value VD (for example, the potential at the connection point CN) obtained in the second operation is the first value (Va/2) which is about ½ of the first potential difference Va.

As shown in FIG. 34D, when the first input is "0" and the second input is "1", or when the first input is "1" and the second input is "0", the measured value VD (for example, the potential at the connection point CN) obtained in the second operation is different from the first value (Va/2). In this example, when the first input is "0" and the second input is "1", the measured value VD is 0.75 Va. When the first input is "1" and the second input is "0", the measured value VD obtained in the second operation is 0.25 Va.

As shown in FIGS. 34C and 34D, the result RJ of the second operation S120 corresponds to the result of the XNOR operation of the first input and the second input. According to the magnetic device 417 according to the embodiment, a magnetic device having a simple configuration can be provided.

Figure 35:
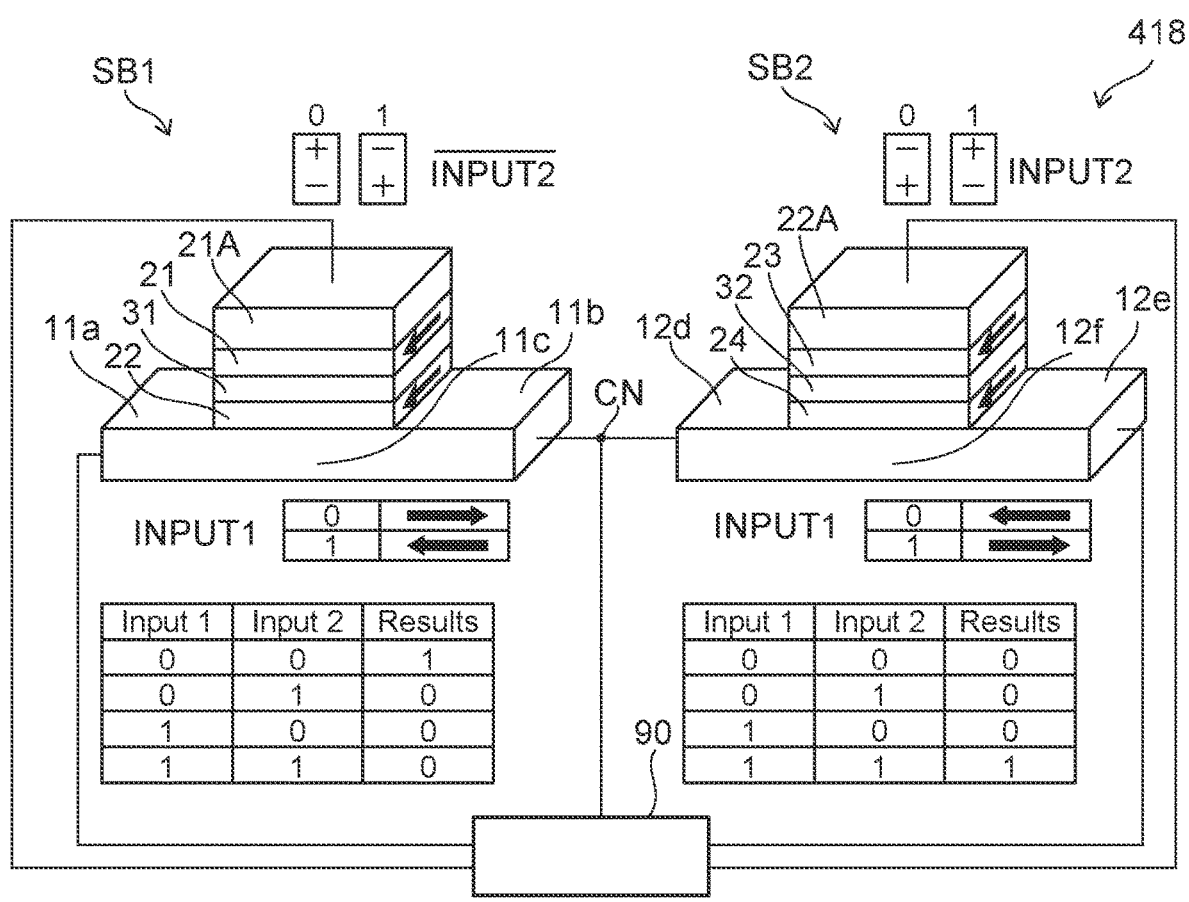
FIG. 35 is a schematic perspective view illustrating a magnetic device according to the fourth embodiment.

FIG. 35 is a schematic perspective view illustrating a magnetic device according to the fourth embodiment.

As shown in FIG. 35, in a magnetic device 418 according to the embodiment, for example, the inversion of the second input "INPUT2" is input to the first magnetic layer 21. For example, the second input "INPUT2" is input to the third magnetic layer 23.

FIGS. 36A to 36D are schematic views illustrating the magnetic device according to the fourth embodiment.

FIG. 36A shows the definition of magnetization MGD, the orientation of the current Iw flowing the conductive portion, and the bias voltage VSB applied to the magnetic layer, when the first input "INPUT1" and the second input "INPUT2" are "0" or "1" in the magnetic device 418 according to the embodiment.

FIG. 36B illustrates the magnetization configuration MG0 in the initialization operation S100. As shown in FIG. 36B, the controller 90 sets the first stacked body SB1 in the first low electrical resistance state ("P" and "L"), and sets the second laminated body SB2 in the second low electrical resistance state ("P" and "L") in the initialization operation S100.

As shown in FIG. 36A, when the first input "INPUT1" is "0", in the first operation S110, the first current has the orientation I12 from the first region 11a to the second region 11b, and the second current has the orientation I54 from the fifth region 12e to the fourth region 12d. When the first input "INPUT1" is "1", in the first operation S110, the first current has the orientation I21 from the second region 11b to the first region 11a, and the second current has the orientation from the fourth region 12d to the fifth region 12e.

As shown in FIG. 36A, when the second input "INPUT2" is "0", in the first operation S110, the potential of the first magnetic layer 21 is set to the second potential Va2 and the potential of the third magnetic layer 23 is set to the third potential Vd3.

When the second input "INPUT2" is "1", in the first operation S110, the potential of the first magnetic layer 21 is set to the first potential Vd1, and the potential of the third magnetic layer 23 is set to the fourth potential Va4.

FIG. 36C illustrates the magnetization configuration MG1 of the first input "INPUT1", the second input "INPUT2", and the magnetization configuration MGR after the first operation S110 in the first operation S110. The magnetization configuration MGR corresponds, for example, to the operation result.

FIG. 36D shows the measured value VD of the potential at the connection point CN of the second region 11b and the fourth region 12d as the result RJ of the second operation S120. As shown in FIG. 36D, when the first input is "0" and the second input is "1", or when the first input is "1" and the second input is "0", the measured value VD (for example, the potential at the connection point CN) obtained in the second operation is the first value (Va/2) which is about ½ of the first potential difference Va.

As shown in FIG. 36D, when the first input is "0" and the second input is "0", or when the first input is "1" and the second input is "1", the measured value VD (for example, the potential at the connection point CN) obtained in the second operation is different from the first value (Va/2). In this example, when the first input is "0" and the second input is "0", the measured value VD is 0.75 Va. When the first input is "1" and the second input is "1", the measured value VD obtained in the second operation is 0.25 Va.

As shown in FIGS. 36C and 36D, the result RJ of the second operation S120 corresponds to the result of the XNOR operation of the first input and the second input.

According to the magnetic device 418 according to the embodiment, a magnetic device having a simple configuration can be provided.

As described above, in the above magnetic devices 411 to 418, the controller 90 performs the initialization operation S100, the first operation S110, and the second operation S120, and is configured to perform the XNOR operation of the first input and the second input. In the initialization operation S100, the controller 90 sets the first stacked body SB1 in the first low electrical resistance state or the first high electrical resistance state, and sets the second stacked body SB2 in the second low electrical resistance state or the second low electrical resistance state.

In the first operation S110, the controller 90 supplies the first current to the first conductive portion 11 while setting the potential of the first magnetic layer 21 to a first set potential, and supplies the second current to the second conductive portion 12 while setting the potential of the third magnetic layer 23 to a second set potential. The first set potential is the first potential or the second potential. The second set potential is the third potential or the fourth potential.

The orientation of the first current in the first operation S110 when the first input is "0" is opposite to the orientation of the first current in the first operation S110 when the first input is "1". The orientation of the second current in the first operation S110 when the first input is "0" is opposite to the orientation of the second current in the first operation S110 when the first input is "1".

The first polarity of the first set potential in the first operation S110 when the second input is "1", with reference to the first set potential in the first operation S110 when the second input is "0" is opposite to the second polarity of the second set potential in the first operation S110 when the second input is "1", with reference to the second set potential in the first operation S110 when the second input is "0".

In the second operation S120, the controller 90 measures values corresponding to the electrical resistance of the first stacked body SB1 after the first operation S110 and the electrical resistance of the second stacked body S82 after the first operation S110.

In the first example relating to the first operation S110, the first set potential in the first operation S110 when the second input is "0" is the first potential, and the first set potential in the first operation when the second input is "1" is the second potential. The second set potential in the first operation S110 when the second input is "0" is the fourth potential, and the second set potential in the first operation S110 when the second input is "1" is the third potential. The absolute value of the difference between the first potential and the second potential is larger than the absolute value of the difference between the first potential and the third potential, and is larger than the absolute value of the difference between the second potential and the fourth potential. The absolute value of the difference between the third potential and the fourth potential is larger than the absolute value of the difference between the first potential and the third potential, and larger than the absolute value of the difference between the second potential and the fourth potential.

In the second example relating to the first operation S110, the first set potential in the first operation S110 when the second input is "0" is the second potential, and the first set potential in the first operation S110 when the second input is "1" is the first potential. Also in this case, the absolute value of the difference between the first potential and the second potential is larger than the absolute value of the difference between the first potential and the third potential, and is larger than the absolute value of the difference between the second potential and the fourth potential. The absolute value of the difference between the third potential and the fourth potential is larger than the absolute value of the difference between the first potential and the third potential, and is larger than the absolute value of the difference between the second potential and the fourth potential.

In the first and second examples relating to the first operation S110, for example, the first potential is higher than the second potential and the third potential is higher than the fourth potential. For example, the first potential is positive, the second potential is negative, the third potential is positive, and the fourth potential is negative. For example, when the potential of the first magnetic layer 21 is the second potential, the electrical resistance of the first stacked body SB1 is more likely to change than when the potential of the first magnetic layer 21 is the first potential. For example, when the potential of the third magnetic layer 23 is the fourth potential, the electrical resistance of the second stacked body SB2 is more likely to change than when the potential of the third magnetic layer 23 is the third potential.

As described above, the second region 11b is electrically connected to the fourth region 12d. The connection points of the second region 11b and the fourth region 12d are defined as connection points CN.

In one example (third example) relating to the second operation S120, in a case where the first input is "0" and the second input is "1", or where the first input is "1" and the second input is "0", when the first potential difference Va is applied to the first magnetic layer 21 with reference to the third magnetic layer 23, the potential at the connection point CN is the first value (Va/2), which is about ½ of the first potential difference Va. In the third example, in a case where the first input is "0" and the second input is "0", or where the first input is "1" and the second input is "1", when the first potential difference Va is applied to the first magnetic layer 21 with reference to the third magnetic layer 23, the potential at the connection point CN is different from the first value (Va/2).

In another example (fourth example) relating to the second operation S120, in a case where the first input is "0" and the second input is "0", or where the first input is "1" and the second input is, when the first potential difference Va is applied to the first magnetic layer 21 with reference to the third magnetic layer 23, the potential at the connection point CN is the first value (Va/2), which is about ½ of the first potential difference Va. In the fourth example, in a case where the first input is "0" and the second input is "1", or where the first input is "1" and the second input is "0", when the first potential difference Va is applied to the first magnetic layer 21 with reference to the layer 23, the potential at the connection point CN is different from the first value (Va/2).

The initialization operation S100, the first operation S110, and the second operation S120 as described above may also be performed in the magnetic device according to the fifth embodiment below.

Fifth Embodiment

Figure 37:
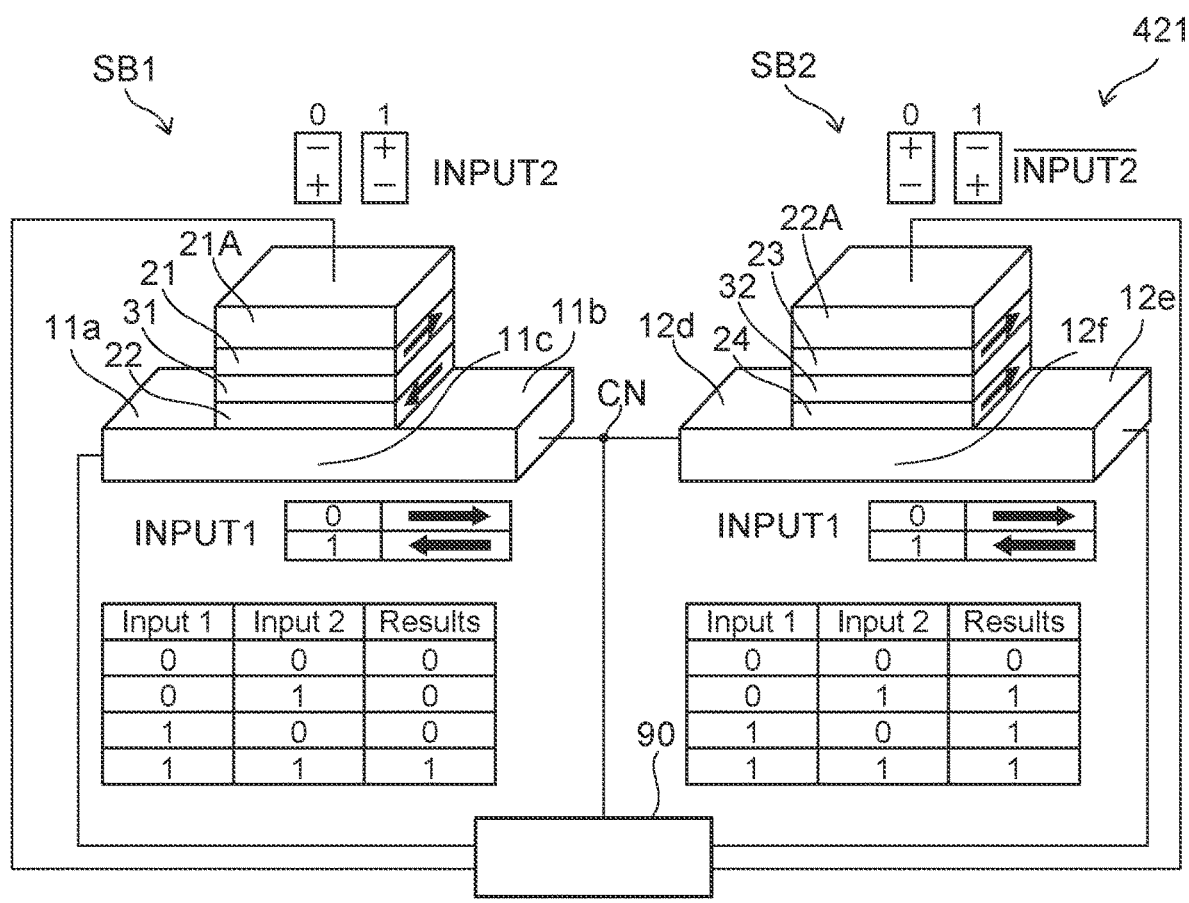
FIG. 37 is a schematic perspective view illustrating a magnetic device according to a fifth embodiment.

FIG. 37 is a schematic perspective view illustrating a magnetic device according to a fifth embodiment.

FIGS. 38A to 38D are schematic views illustrating the magnetic device according to the fifth embodiment.

In a magnetic illustrated in FIGS. 37 and 38A to 38D, the first example relating to the first operation S110 is per-formed. In the magnetic device 421, the controller 90 sets the first stacked body SB1 in the first high electrical resistance state ("AP" and "H") and the second stacked body SB2 in the second low electrical resistance state ("P" and "L") in the initialization operation S100. When the first input is "0", in the first operation S110, the first current has the orientation I12 from the first region 11a to the second region 11b, and the second current has the orientation I45 from the fourth region 12d to the fifth region 12e, and when the first input is "1", in the first operation S110, the first current has the orientation I21 from the second region 11b to the first region 11a, and the second current has the orientation I54 from the fifth region 12e to the fourth region 12d.

The fourth example relating to the second operation S120 is performed.

Figure 39:
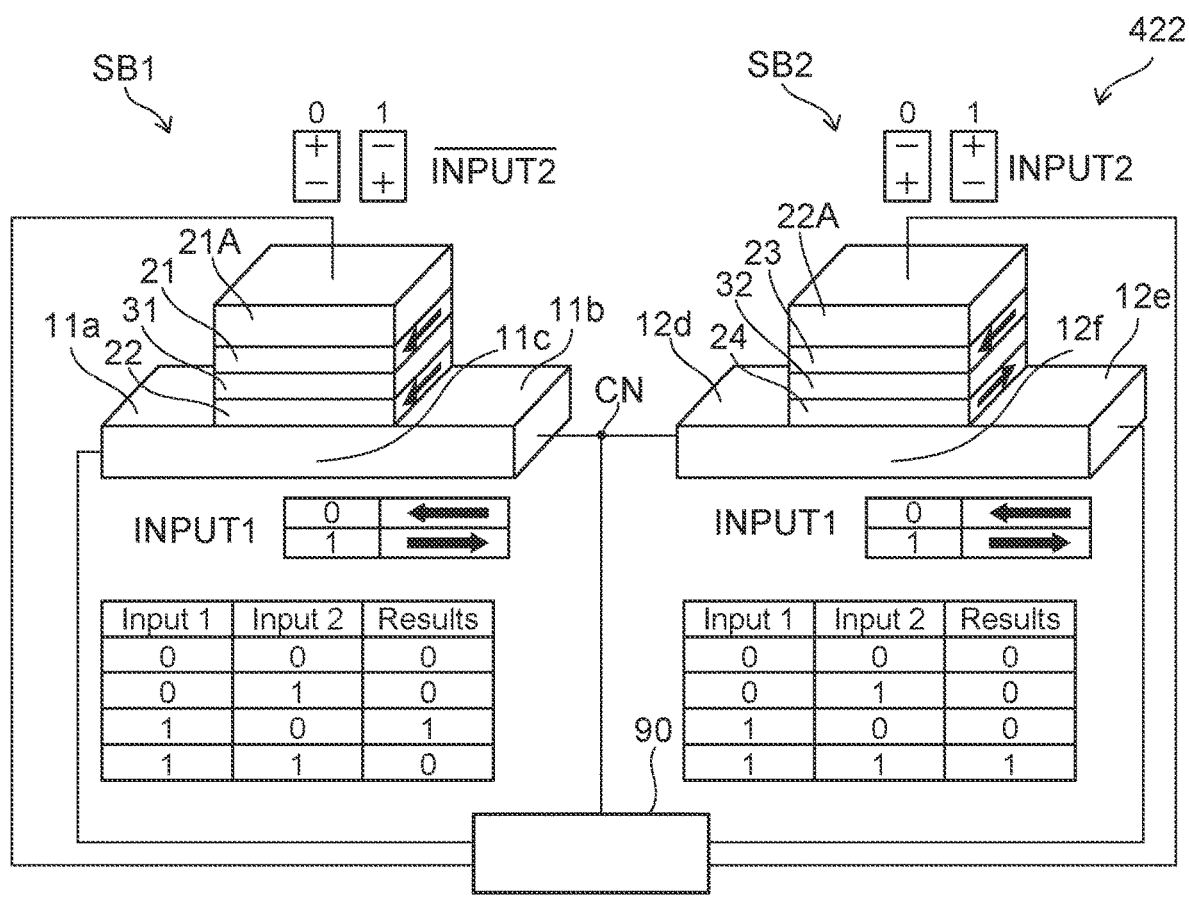
FIG. 39 is a schematic perspective view illustrating a magnetic device according to the fifth embodiment.

FIG. 39 is a schematic perspective view illustrating a magnetic device according to the fifth embodiment.

FIGS. 40A to 40D are schematic views illustrating the magnetic device according to the fifth embodiment.

In a magnetic device 422 illustrated in FIGS. 39 and 40A to 40D, the second example relating to the first operation S110 is performed. In the magnetic device 422, the controller 90 sets the first stacked body SB1 in the first low electrical resistance state and the second stacked body SB2 in the second high electrical resistance state in the initialization operation S100. When the first input is "0", in the first operation S110, the first current has the orientation I21 from the second region 11b to the first region 11a, and the second current has the orientation I54 from the fifth region 12e to the fourth region 12d. When the first input is "1", in the first operation S110, the first current has the orientation I12 from the first region 11a to the second region 11b, and the second current has the orientation I45 from the fourth region 12d to the fifth region 12e. The third example relating to the second operation S120 is performed.

Figure 41:
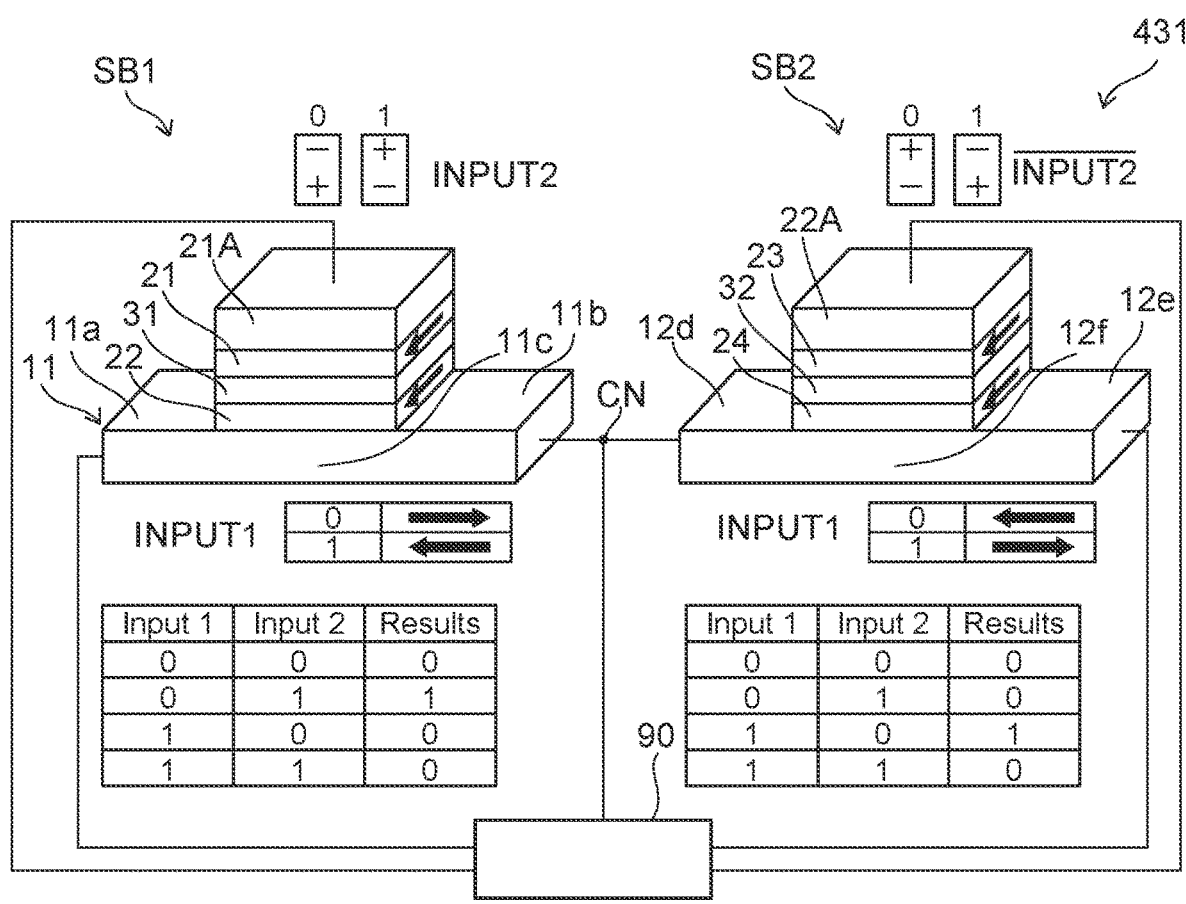
FIG. 41 is a schematic perspective view illustrating a magnetic device according to the fifth embodiment.

FIG. 41 is a schematic perspective view illustrating a magnetic device according to the fifth embodiment.

FIGS. 42A to 42D are schematic views illustrating the magnetic device according to the fifth embodiment.

In a magnetic device 431 exemplified in FIGS. 41 and 42A to 42D, the first example relating to the first operation S110 is performed. In the magnetic device 431, the controller 90 sets the first stacked body SB1 in the first low electrical resistance state and the second stacked body SB2 in the second high electrical resistance state in the initialization operation S100. When the first input is "0", in the first operation S110, the first current has the orientation I12 from the first region 11a to the second region 11b, and the second current has orientation I54 from the fifth region 12e to the fourth region 12d. When the first input is "1", in the first operation S110, the first current has the orientation I21 from the second region 11b to the first region 11a, and the second current has the orientation I45 from the fourth region 12d to the fifth region 12e. The fourth example relating to the second operation S120 is performed.

Figure 43:
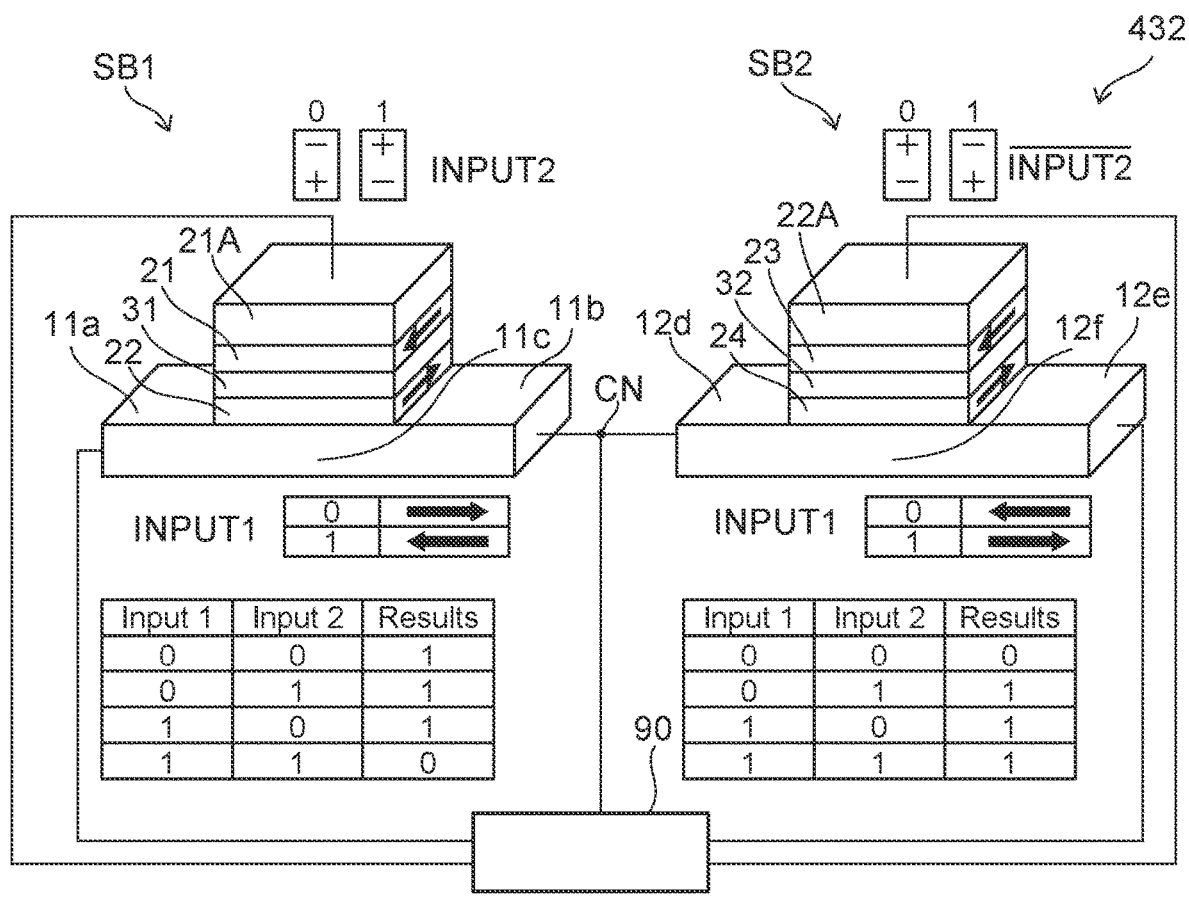
FIG. 43 is a schematic perspective view illustrating a magnetic device according to the fifth embodiment.

FIG. 43 is a schematic perspective view illustrating a magnetic device according to the fifth embodiment.

FIGS. 44A to 44D are schematic views illustrating the magnetic device according to the fifth embodiment.

In a magnetic device 432 illustrated by FIGS. 43 and 44A to 44D, the first example relating to the first operation S110 is performed. In the magnetic device 432, the controller 90 sets the first stacked body SB1 in the first high electrical resistance state and the second stacked body SB2 in the second high electrical resistance state in the initialization operation S100. When the first input is "0", in the first operation S110, the first current has the orientation I12 from the first region 11a to the second region 11b, and the second current has the orientation I54 from the fifth region 12e to the fourth region 12d. When the first input is "1", in the first operation S110, the first current has the orientation I21 from the second region 11b to the first region 11a, and the second current has the orientation I45 from the fourth region 12d to the fifth region 12e. The third example relating to the second operation S120 is performed.

Figure 45:
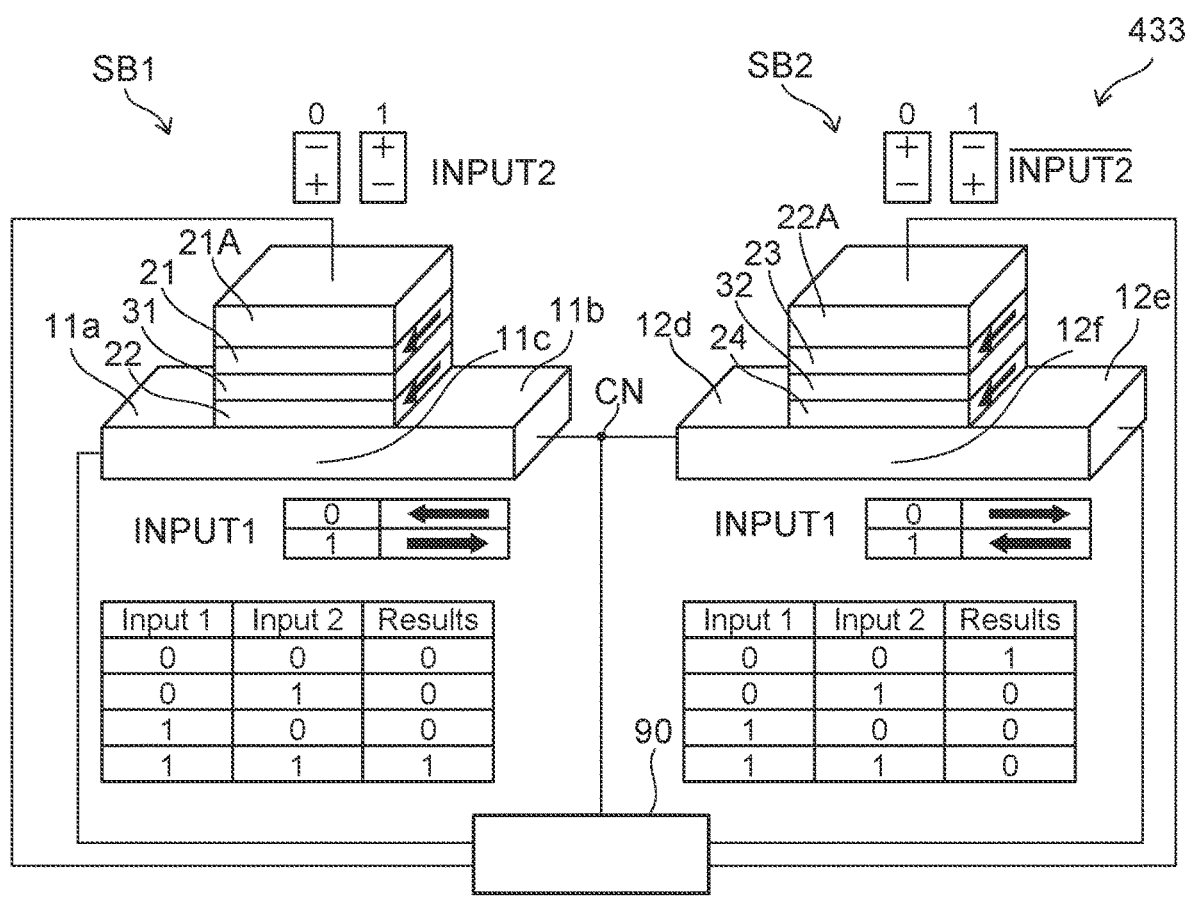
FIG. 45 is a schematic perspective view illustrating a magnetic device according to the fifth embodiment.

FIG. 45 is a schematic perspective view illustrating a magnetic device according to the fifth embodiment.

FIGS. 46A to 46D are schematic views illustrating the magnetic device according to the fifth embodiment.

In a magnetic device 433 illustrated in FIGS. 45 and 46A to 46D, the first example relating to the first operation S110 is performed. In the magnetic device 433, the controller 90 sets the first stacked body SB1 in the first low electrical resistance state and the second stacked body SB2 in the second low electrical resistance state in the initialization operation S100. When the first input is "0", in the first operation S110, the first current has the orientation I21 from the second region 11b to the first region 11a, and the second current has the orientation I45 from the fourth region 12d to the fifth region 12e. When the first input is "1", in the first operation S110, the first current has the orientation I12 from the first region 11a to the second region 11b, and the second current has the orientation I54 from the fifth region 12e to the fourth region 12d. The third example relating to the second operation S120 is performed.

Figure 47:
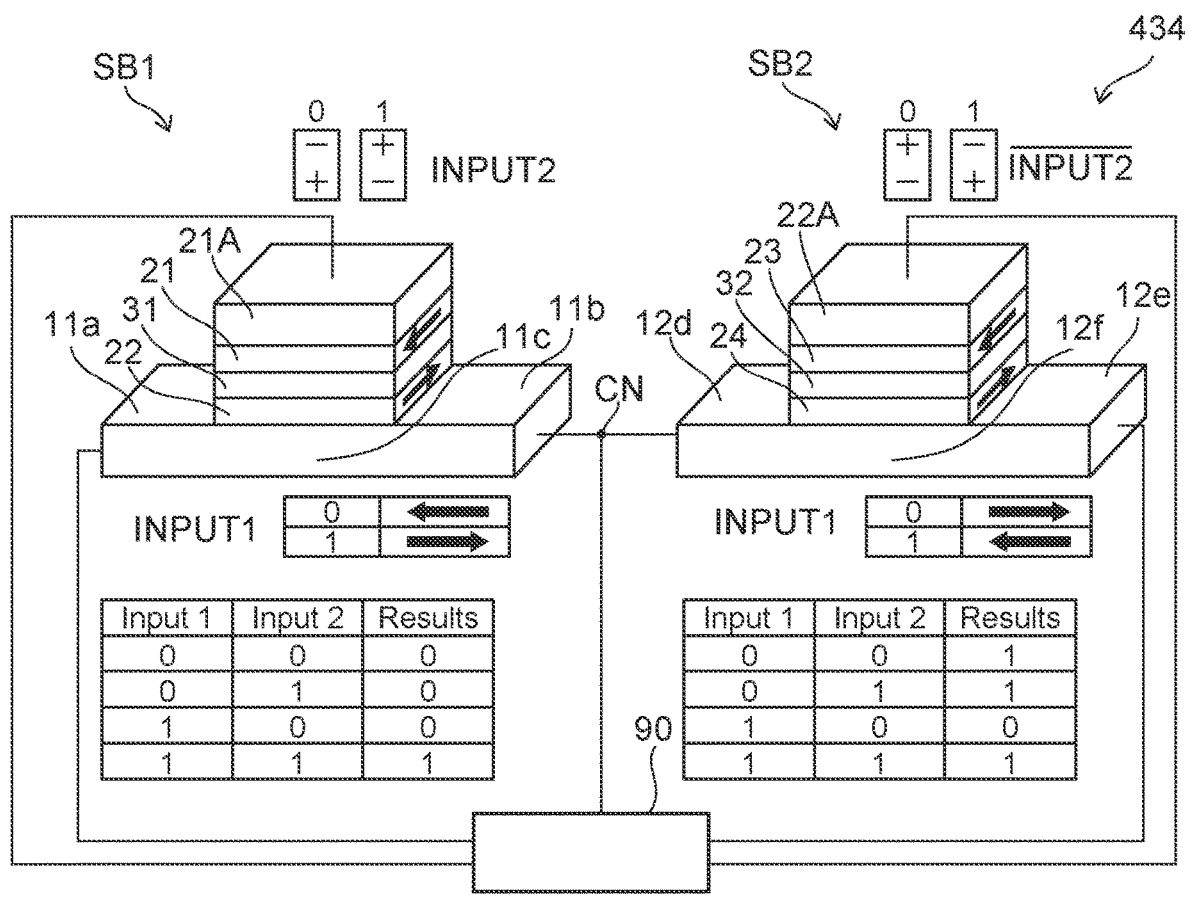
FIG. 47 is a schematic perspective view illustrating a magnetic device according to the fifth embodiment.

FIG. 47 is a schematic perspective view illustrating a magnetic device according to the fifth embodiment.

FIGS. 48A to 48D are schematic views illustrating the magnetic device according to the fifth embodiment, In a magnetic device 434 illustrated in FIGS. 47 and 48A to 48D, the first example relating to the first operation S110 is performed. In the magnetic device 434, the controller 90 sets the first stacked body SB1 in the first high electrical resistance state and the second stacked body SB2 in the second high electrical resistance state in the initialization operation S100. When the first input is "0", in the first operation S110, the first current has the orientation I21 from the second region 11b to the first region 11a, and the second current has the orientation I45 from the fourth region 12d to the fifth region 12e. When the first input is "1", in the first operation S110, the first current has the orientation I12 from the first region 11a to the second region 11b, and the second current has the orientation I54 from the fifth region 12e to the fourth region 12d. The fourth example relating to the second operation S120 is performed.

Figure 49:
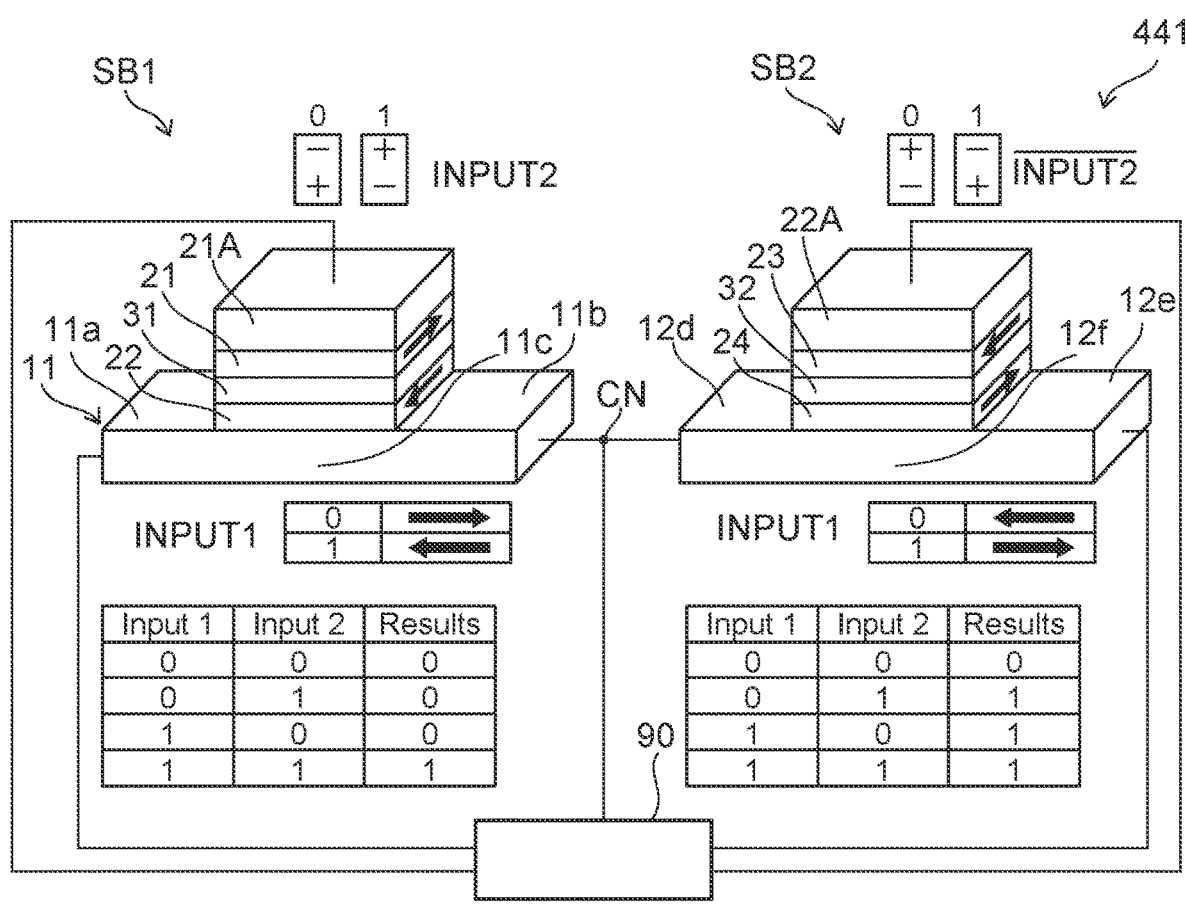
FIG. 49 is a schematic perspective view illustrating a magnetic device according to the fifth embodiment.

FIG. 49 is a schematic perspective view illustrating a magnetic device according to the fifth embodiment.

FIGS. 50A to 50D are schematic views illustrating the magnetic device according to the fifth embodiment.

In a magnetic device 441 illustrated in FIGS. 49 and 50A to 50D, the first example relating to the first operation S110 is performed. In the magnetic device 441, the controller 90 sets the first stacked body SB1 in the first high electrical resistance state and the second stacked body SB2 in the second high electrical resistance state in the initialization operation S100. When the first input is "0", in the first operation S110, the first current has the orientation I12 from the first region 11a to the second region 11b, and the second current has the orientation I54 from the fifth region 12e to the fourth region 12d. When the first input is "1", in the first operation S110, the first current has the orientation I21 from the second region 11b to the first region 11a, and the second current has the orientation I45 from the fourth region 12d to the fifth region 12e. The fourth example relating to the second operation S120 is performed.

Figure 51:
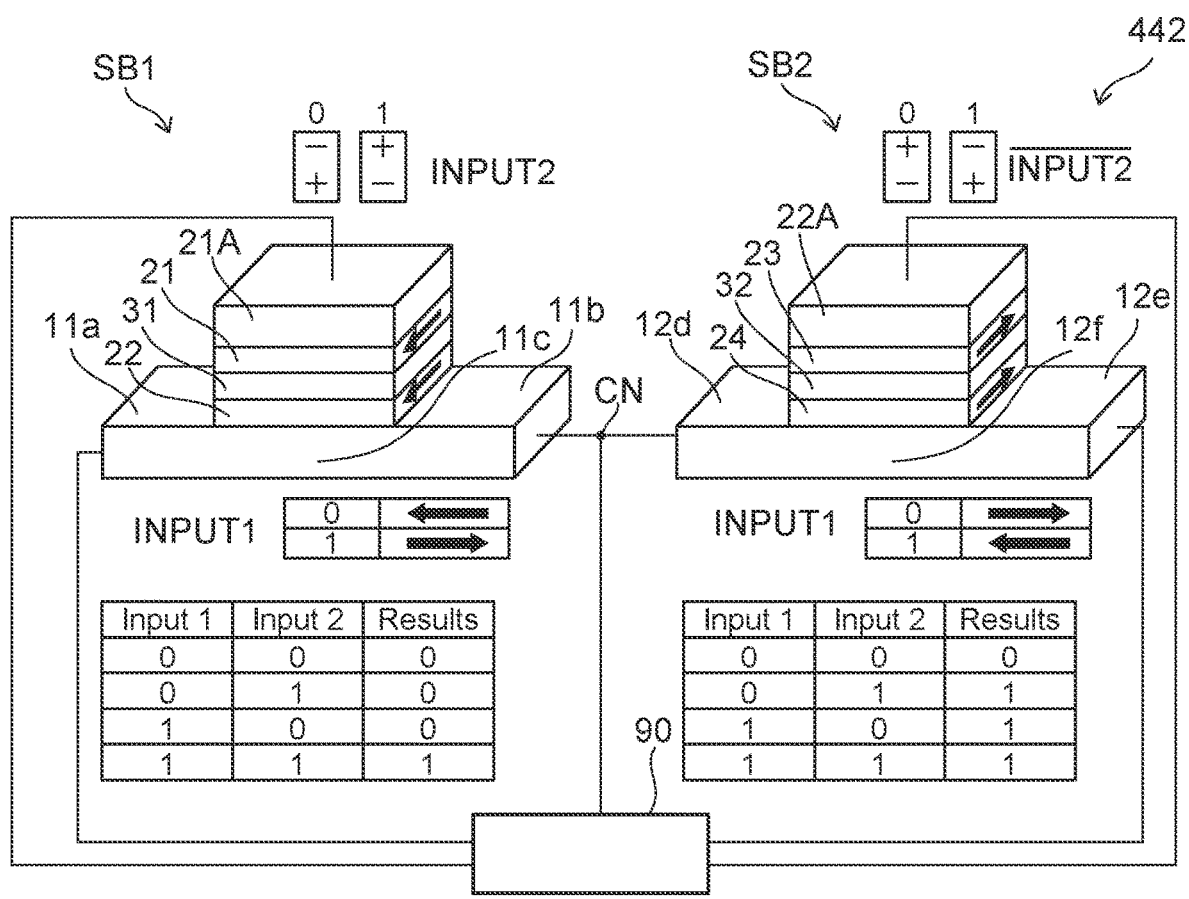
FIG. 51 is a schematic perspective view illustrating a magnetic device according to the fifth embodiment.

FIG. 51 is a schematic perspective view illustrating a magnetic device according to the fifth embodiment.

FIGS. 52A to 52D are schematic views illustrating the magnetic device according to the fifth embodiment.

In the magnetic device 442 illustrated in FIGS. 51 and 52A to 52D, the first example relating to the first operation S110 is performed. In the magnetic device 442, the controller 90 sets the first stacked body SB1 in the first low electrical resistance state and the second stacked body SB2 in the second low electrical resistance state in the initialization operation S100. When the first input is "0", in the first operation S110, the first current has the orientation I21 from the second region 11b to the first region 11a, and the second current has the orientation I45 from the fourth region 12d to the fifth region 12e. When the first input is "1", in the first operation S110, the first current has the orientation I12 from the first region 11a to the second region 11b, and the second current has the orientation I54 from the fifth region 12e to the fourth region 12d. The fourth example relating to the second operation S120 is performed.

Figure 53:
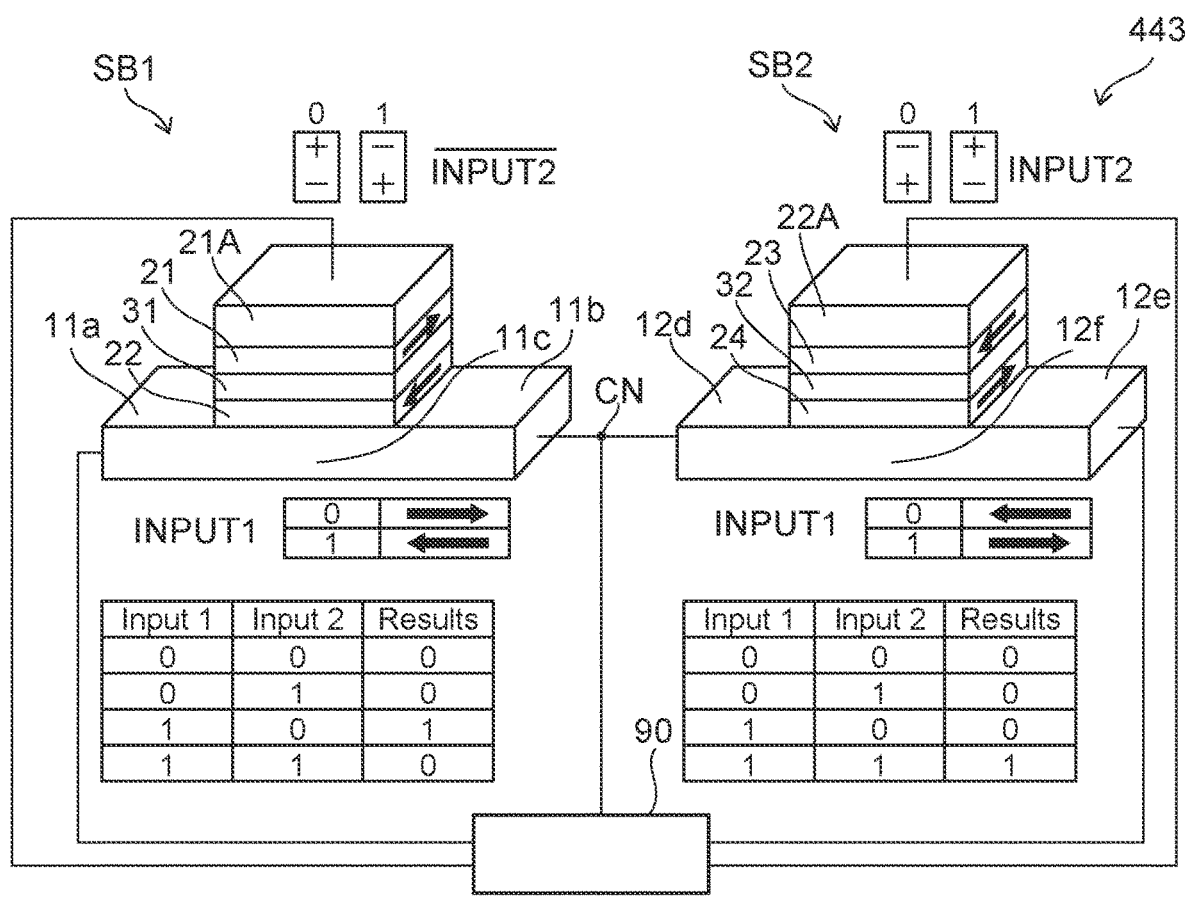
FIG. 53 is a schematic perspective view illustrating a magnetic device according to the fifth embodiment.

FIG. 53 is a schematic perspective view illustrating a magnetic device according to the fifth embodiment.

FIGS. 54A to 54D are schematic views illustrating the magnetic device according to the fifth embodiment.

In a magnetic device 443 illustrated in FIGS. 53 and 54A to 54D, the second example relating to the first operation S110 is performed. In the magnetic device 443, the controller 90 sets the first stacked body SB1 in the first high electrical resistance state and the second stacked body SB2 in the second high electrical resistance state in the initialization operation S100. When the first input is "0", in the first operation S110, the first current has the orientation I12 from the first region 11a to the second region 11b, and the second current has the orientation I54 from the fifth region 12e to the fourth region 12d. When the first input is "1", in the first operation S110, the first current has the orientation I21 from the second region 11b to the first region 11a, and the second current has the orientation I45 from the fourth region 12d to the fifth region 12e. The third example relating to the second operation S120 is performed.

Figure 55:
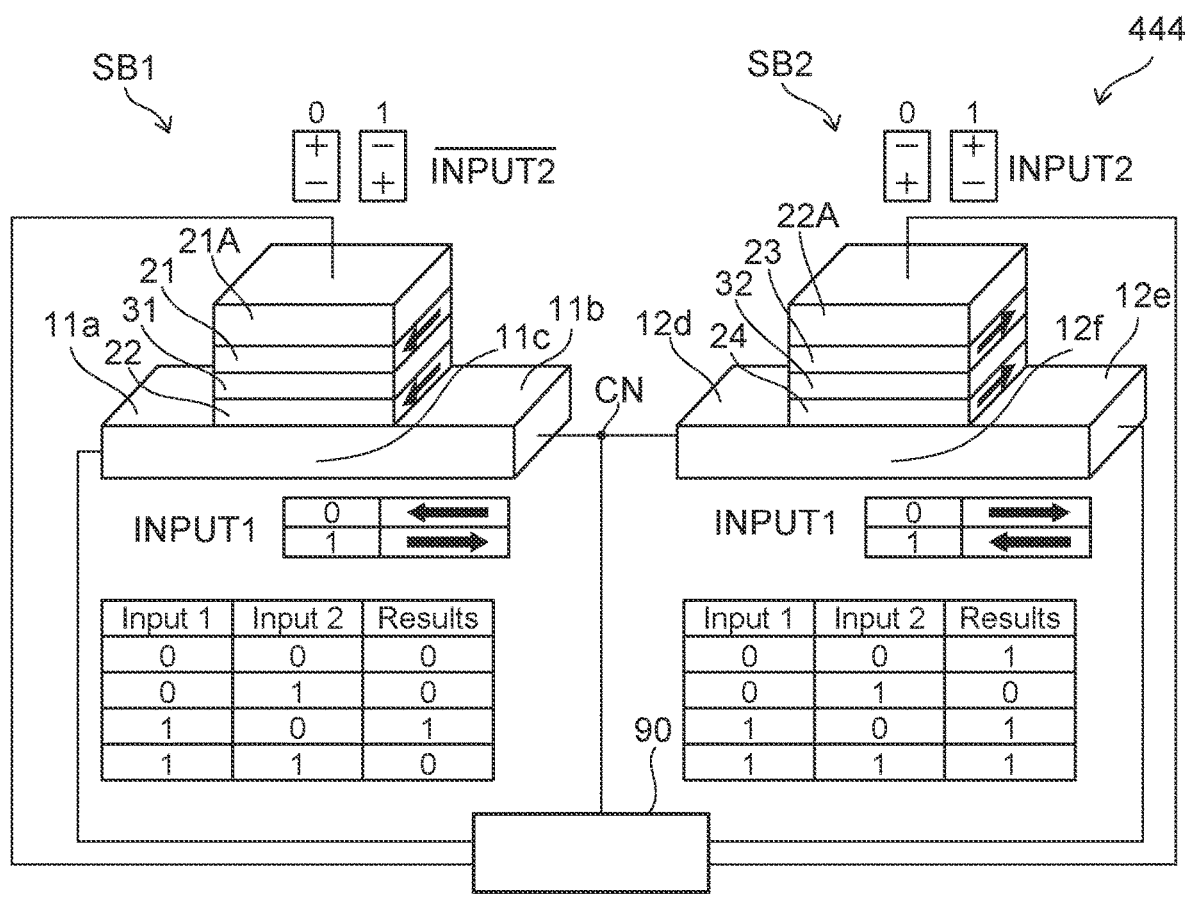
FIG. 55 is a schematic perspective view illustrating a magnetic device according to the fifth embodiment.

FIG. 55 is a schematic perspective view illustrating a magnetic device according to the fifth embodiment.

FIGS. 56A to 56D are schematic views illustrating the magnetic device according to the fifth embodiment.

In a magnetic device 444 illustrated in FIGS. 56 and 56A to 56D, the second example relating to the first operation S110 is performed. In the magnetic device 444, the controller 90 sets the first stacked body in the first low electrical resistance state and the second stacked body in the second low electrical resistance state in the initialization operation S100. When the first input is "0", in the first operation S110, the first current has the orientation I21 from the second region 11b to the first region 11a, and the second current has the orientation I45 from the fourth region 12d to the fifth region 12e. When the first input is "1", in the first operation S110, the first current has the orientation I12 from the first region 11a to the second region 11b, and the second current has the orientation I54 from the fifth region 12e to the fourth region 12d. The fourth example relating to the second operation S120 is performed.

Also in the magnetic devices 421, 422, 431 to 434, and 441 to 444, the results of the XNOR operation of the first input and the second input can be obtained. According to the magnetic device according to the fifth embodiment, a magnetic device having a simple configuration can be provided.

In the magnetic devices 411 to 418, 421, 422, 431 to 434, and 441 to 444, the configurations of the first stacked body SB1 and the second stacked body SB2 (left and right elements) can be interchanged with each other.

The embodiment may include the following configurations (e.g., technical proposals).

Configuration 1

A magnetic device, comprising:
a first conductive portion including a first region, a second region, a third region between the first region and the second region, a direction from the first region to the second region being along a first direction;
a first stacked body including a first magnetic layer and a second magnetic layer, the second magnetic layer being between the third region and the first magnetic layer in a second direction crossing the first direction;
a second conductive portion including a fourth region, a fifth region, and a sixth region between the fourth region and the fifth region, a direction from the fourth region to the fifth region being along a third direction;
a second stacked body including a third magnetic layer and a fourth magnetic layer, the fourth magnetic layer being between the sixth region and the third magnetic layer in a fourth direction crossing the third direction; and
a controller,
the first stacked body being configured to be in a first low electrical resistance state or in a first high electrical resistance state higher than the first low electrical resistance state,
the second stacked body being configured to be in a second low electrical resistance state or in a second high electrical resistance state higher than the second low electrical resistance state,
the controller being configured to implement an initialization operation, a first operation, and a second operation, and implement an XNOR operation of a first input and a second input,
the controller being configured to set the first stacked body in a first resistance state of the first low electrical resistance state or the first high electrical resistance state, and set the second stacked body in a second resistance state of the second low electrical resistance state or the second high electrical resistance state in the first initialization operation,
the controller being configured to supply a first current to the first conductive portion while setting a potential of the first magnetic layer to a first set potential, and supply a second current to the second conductive portion while setting a potential of the third magnetic layer to a second set potential in the first operation,
an orientation of the first current in the first operation when the first input is "0" being opposite to an orientation of the first current in the first operation when the first input Is "1",
an orientation of the second current in the first operation when the first input is "0" being opposite to an orientation of the second current in the first operation when the first input is "1",
a first polarity of the first set potential in the first operation when the second input is "1", with reference to the first set potential in the first operation when the second input is "0" being opposite to a second polarity of the second set potential in the first operation when the second input is "1", with reference to the second set potential in the first operation when the second input is "0", and
the controller being configured to measure values corresponding to an electrical resistance of the first stacked body after the first operation and an electrical resistance of the second stacked body after the first operation in the second operation.

Configuration 2

The magnetic device according to Configuration 1, wherein
the first set potential in the first operation when the second input is "0" is a first potential,
the first set potential in the first operation when the second input is "1" is a second potential,
the second set potential in the first operation when the second input is "0" is a fourth potential,
the second set potential in the first operation when the second input is "1" is a third potential,
an absolute value of a difference between the first potential and the second potential is larger than an absolute value of a difference between the first potential and the third potential, and larger than an absolute value of a difference between the second potential and the fourth potential, and
an absolute value of a difference between the third potential and the fourth potential is larger than the absolute value of the difference between the first potential and the third potential, and larger than the absolute value of the difference between the second potential and the fourth potential.

Configuration 3

The magnetic device according to Configuration 2, wherein
the controller is configured to set the first stacked body in the first low electrical resistance state and set the second stacked body in the second high electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the second region to the first region, and the second current has an orientation from the fifth region to the fourth region.

Configuration 4

The magnetic device according to Configuration 2, wherein
the controller is configured to set the first stacked body in the first low electrical resistance state and set the second stacked body in the second high electrical resistance state in the initialization operation,
when the first input is "0", in the first operation, the first current has an orientation from the second region to the first region, and the second current has an orientation from the fifth region to the fourth region, and
when the first input is "1", in the first operation, the first current has an orientation from the first region to the second region, and the second current has an orientation from the fourth region to the fifth region.

Configuration 5

The magnetic device according to Configuration 2, wherein
the controller is configured to set the first stacked body in the first low electrical resistance state and set the second stacked body in the second low electrical resistance state in the initialization operation,
when the first input is "0", in the first operation, the first current has an orientation from the first region to the second region, and the second current has an orientation from the fifth region to the fourth region, and when the first input is "1", in the first operation, the first current has an orientation from the first region to the second region, and the second current has an orientation from the fourth region to the fifth region.

Configuration 6

The magnetic device according to Configuration 2, wherein
- the controller is configured to set the first stacked body in the first high electrical resistance state and set the second stacked body in the second high electrical resistance state in the initialization operation,
- when the first input is "0", in the first operation, the first current has an orientation from the first region to the second region, and the second current has an orientation from the fifth region to the fourth region, and
- when the first input is "1", in the first operation, the first current has an orientation from the second region to the first region, and the second current has an orientation from the fourth region to the fifth region.

Configuration 7

The magnetic device according to Configuration 2, wherein
- the controller is configured to set the first stacked body in the first high electrical resistance state and set the second stacked body in the second low electrical resistance state in the initialization operation,
- when the first input is "0", in the first operation, the first current has an orientation from the first region to the second region, and the second current has an orientation from the fourth region to the fifth region, and
- when the first input is "1", In the first operation, the first current has an orientation from the second region to the first region, and the second current has an orientation from the fifth region to the fourth region.

Configuration 8

The magnetic device according to Configuration 2, wherein
- the controller is configured to set the first stacked body in the first low electrical resistance state and set the second stacked body in the second high electrical resistance state in the initialization operation,
- when the first input is "0", in the first operation, the first current has an orientation from the first region to the second region, and the second current has an orientation from the fifth region to the fourth region, and
- when the first input is "1", in the first operation, the first current has an orientation from the second region to the first region, and the second current has an orientation from the fourth region to the fifth region.

Configuration 9

The magnetic device according to Configuration 2, wherein
- the controller is configured to set the first stacked body in the first high electrical resistance state and set the second stacked body in the second high electrical resistance state in the initialization operation,
- when the first input is "0", in the first operation, the first current has an orientation from the first region to the second region, and the second current has an orientation from the fifth region to the fourth region, and
- when the first input is "1", in the first operation, the first current has an orientation from the second region to the first region, and the second current has an orientation from the fourth region to the fifth region.

Configuration 10

The magnetic device according to Configuration 2, wherein
- the controller is configured to set the first stacked body in the first low electrical resistance state and set the second stacked body in the second low electrical resistance state in the initialization operation,
- when the first input is "0", in the first operation, the first current has an orientation from the second region to the first region, and the second current has an orientation from the fourth region to the fifth region, and
- when the first input is "1", In the first operation, the first current has an orientation from the first region to the second region, and the second current has an orientation from the fifth region to the fourth region.

Configuration 11

The magnetic device according to Configuration 2, wherein
- the controller is configured to set the first stacked body in the first high electrical resistance state and set the second stacked body in the second high electrical resistance state in the initialization operation,
- when the first input is "0", in the first operation, the first current has an orientation from the second region to the first region, and the second current has an orientation from the fourth region to the fifth region, and
- when the first input is "1", in the first operation, the first current has an orientation from the first region to the second region, and the second current has an orientation from the fifth region to the fourth region.

Configuration 12

The magnetic device according to Configuration 2, wherein
- the controller is configured to set the first stacked body in the first high electrical resistance state and set the second stacked body in the second high electrical resistance state in the initialization operation,
- when the first input is "0", in the first operation, the first current has an orientation from the first region to the second region, and the second current has an orientation from the fifth region to the fourth region, and
- when the first input is "1", in the first operation, the first current has an orientation from the second region to the first region, and the second current has an orientation from the fourth region to the fifth region.

Configuration 13

The magnetic device according to Configuration 2, wherein
- the controller is configured to set the first stacked body in the first low electrical resistance state and set the second stacked body in the second low electrical resistance state in the initialization operation,
- when the first input is "0", in the first operation, the first current has an orientation from the second region to the first region, and the second current has an orientation from the fourth region to the fifth region, and
- when the first input is "1", in the first operation, the first current has an orientation from the first region to the second region, and the second current has an orientation from the fifth region to the fourth region.

Configuration 14

The magnetic device according to Configuration 1, wherein
- the first set potential in the first operation when the second input is "0" is a second potential,
- the first set potential in the first operation when the second input is "1" is a first potential, the second set potential in the first operation when the second input is "0" is a third potential, the second set potential in the first operation when the second input is "1" is a fourth potential, an absolute value of a difference between the first potential and the second potential is larger than an absolute value of a difference between the first potential and the third potential, and larger than an absolute value of a difference between the second potential and the fourth potential, and an absolute value of a difference between the third potential and the fourth potential is larger than the absolute value of the difference between the first potential and the third potential, and larger than the absolute value of the difference between the second potential and the fourth potential.

Configuration 15

The magnetic device according to Configuration 14, wherein the controller is configured to set the first stacked body in the first low electrical resistance state and set the second stacked body in the second high electrical resistance state in the initialization operation, when the first input is "0", in the first operation, the first current has an orientation from the first region to the second region, and the second current has an orientation from the fourth region to the fifth region, and when the first input is "1", in the first operation, the first current has an orientation from the second region to the first region, and the second current has an orientation from the fifth region to the fourth region.

Configuration 16

The magnetic device according to Configuration 14, wherein the controller is configured to set the first stacked body in the first low electrical resistance state and set the second stacked body in the second high electrical resistance state in the initialization operation, when the first input is "0", in the first operation, the first current has an orientation from the second region to the first region, and the second current has an orientation from the fifth region to the fourth region, and when the first input is "1", in the first operation, the first current has an orientation from the first region to the second region, and the second current has an orientation from the fourth region to the fifth region.

Configuration 17

The magnetic device according to Configuration 14, wherein the controller is configured to set the first stacked body in the first high electrical resistance state and set the second stacked body in the second high electrical resistance state in the initialization operation, when the first input is "0", in the first operation, the first current has an orientation from the first region to the second region, and the second current has an orientation from the fifth region to the fourth region, and when the first input is "1", in the first operation, the first current has an orientation from the second region to the first region, and the second current has an orientation from the fourth region to the fifth region.

Configuration 18

The magnetic device according to Configuration 14, wherein the controller is configured to set the first stacked body in the first low electrical resistance state and set the second stacked body in the second low electrical resistance state in the initialization operation, when the first input is "0", in the first operation, the first current has an orientation from the first region to the second region, and the second current has an orientation from the fifth region to the fourth region, and when the first input is "1", in the first operation, the first current has an orientation from the first region to the second region, and the second current has an orientation from the fourth region to the fifth region.

Configuration 19

The magnetic device according to Configuration 14, wherein the controller is configured to set the first stacked body in the first low electrical resistance state and set the second stacked body in the second high electrical resistance state in the initialization operation, when the first input is "0", in the first operation, the first current has an orientation from the second region to the first region, and the second current has an orientation from the fifth region to the fourth region, and when the first input is "1", in the first operation, the first current has an orientation from the first region to the second region, and the second current has an orientation from the fourth region to the fifth region.

Configuration 20

The magnetic device according to Configuration 14, wherein the controller is configured to set the first stacked body in the first high electrical resistance state and set the second stacked body in the second high electrical resistance state in the initialization operation, when the first input is "0", in the first operation, the first current has an orientation from the first region to the second region, and the second current has an orientation from the fifth region to the fourth region, and when the first input is "1", in the first operation, the first current has an orientation from the second region to the first region, and the second current has an orientation from the fourth region to the fifth region.

Configuration 21

The magnetic device according to Configuration 14, wherein the controller is configured to set the first stacked body in the first low electrical resistance state and set the second stacked body in the second low electrical resistance state in the initialization operation, when the first input is "0", in the first operation, the first current has an orientation from the second region to the first region, and the second current has an orientation from the fourth region to the fifth region, and when the first input is "1", in the first operation, the first current has an orientation from the first region to the second region, and the second current has an orientation from the fifth region to the fourth region.

Configuration 22

The magnetic device according to any one of Configurations 3, 6, 9, 10, 16, 18, 19, and 20, wherein the second region is electrically connected with the fourth region, in a case where the first input is "0" and the second input is "1", or where the first input is "1" and the second input is "0", in the second operation, when the first potential difference is applied to the first magnetic layer with reference to the third magnetic layer, a potential at a connection point of the second region and the fourth region is a first value which is about ½ of the first potential difference, and in a case where the first input is "0" and the second input is "0", or where the first input is "1" and the second input is "1", in the second operation, when the first potential difference is applied to the first magnetic layer with reference to the third magnetic layer, the potential at the connection point is different from the first value.

Configuration 23

The magnetic device according to any one of Configurations 4, 5, 7, 8, 11, 12, 13, 15, 17, and 21, wherein the second region is electrically connected with the fourth region, in a case where the first input is "0" and the second input is "0", or where the first input is "1" and the second input is "1", In the second operation, when the first potential difference is applied to the first magnetic layer with reference to the third magnetic layer, a potential at a connection point of the second region and the fourth region is a first value which is about ½ of the first potential difference, and in a case where the first input is "0" and the second input is "1", or where the first input is "1" and the second input is "0", in the second operation, when the first potential difference is applied to the first magnetic layer with reference to the third magnetic layer, the potential at the connection point is different from the first value.

According to the embodiment, a magnetic device and an arithmetic device having a simple configuration can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic devices such as conductive portions, magnetic layers, non-magnetic layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic devices, and arithmetic devices practicable by an appropriate design modification by one skilled in the art based on the magnetic devices, and the arithmetic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic device, comprising:
a first conductive portion including a first region, a second region, a third region between the first region and the second region, a direction from the first region to the second region being along a first direction;
a first stacked body including a first magnetic layer and a second magnetic layer, the second magnetic layer being between the third region and the first magnetic layer in a second direction crossing the first direction;
a second conductive portion including a fourth region, a fifth region, and a sixth region between the fourth region and the fifth region, a direction from the fourth region to the fifth region being along a third direction;
a second stacked body including a third magnetic layer and a fourth magnetic layer, the fourth magnetic layer being between the sixth region and the third magnetic layer in a fourth direction crossing the third direction; and
a controller,
the first stacked body being configured to be either in a first low electrical resistance state or in a first high electrical resistance state, the first high electrical resistance state having an electrical resistance higher than an electrical resistance of the first low electrical resistance state,
the second stacked body being configured to be either in a second low electrical resistance state or in a second high electrical resistance state, the second high electrical resistance state having an electrical resistance higher than an electrical resistance of the second low electrical resistance state,
the controller being configured to implement an initialization operation, a first operation, and a second operation, and implement an XNOR operation of a first input and a second input,
the controller being configured to set the first stacked body in a first resistance state of the first low electrical resistance state or the first high electrical resistance state, and set the second stacked body in a second resistance state of the second low electrical resistance state or the second high electrical resistance state in the first initialization operation,
the controller being configured to supply a first current to the first conductive portion while setting a potential of the first magnetic layer to a first set potential, and supply a second current to the second conductive portion while setting a potential of the third magnetic layer to a second set potential in the first operation,
an orientation of the first current in the first operation when the first input is "0" being opposite to an orientation of the first current in the first operation when the first input is "1",
an orientation of the second current in the first operation when the first input is "0" being opposite to an orientation of the second current in the first operation when the first input is "1",
a first polarity of the first set potential in the first operation when the second input is "1", with reference to the first set potential in the first operation when the second input is "0" being opposite to a second polarity of the second set potential in the first operation when the second input is "1", with reference to the second set potential in the first operation when the second input is "0", and the controller being configured to measure values corresponding to an electrical resistance of the first stacked body after the first operation and an electrical resistance of the second stacked body after the first operation in the second operation.

2. The magnetic device according to claim 1, wherein
the first set potential in the first operation when the second input is "0" is a first potential,
the first set potential in the first operation when the second input is "1" is a second potential,
the second set potential in the first operation when the second input is "0" is a fourth potential,
the second set potential in the first operation when the second input is "1" is a third potential,
an absolute value of a difference between the first potential and the second potential is larger than an absolute value of a difference between the first potential and the third potential, and larger than an absolute value of a difference between the second potential and the fourth potential, and
an absolute value of a difference between the third potential and the fourth potential is larger than the absolute value of the difference between the first potential and the third potential, and larger than the absolute value of the difference between the second potential and the fourth potential.

3. The magnetic device according to claim 2, wherein
the controller is configured to set the first stacked body in the first low electrical resistance state and set the second stacked body in the second high electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the second region to the first region, and the second current has an orientation from the fifth region to the fourth region.

4. The magnetic device according to claim 2, wherein
the controller is configured to set the first stacked body in the first low electrical resistance state and set the second stacked body in the second high electrical resistance state in the initialization operation,
when the first input is "0", in the first operation, the first current has an orientation from the second region to the first region, and the second current has an orientation from the fifth region to the fourth region, and
when the first input is "1", in the first operation, the first current has an orientation from the first region to the second region, and the second current has an orientation from the fourth region to the fifth region.

5. The magnetic device according to claim 2, wherein
the controller is configured to set the first stacked body in the first low electrical resistance state and set the second stacked body in the second low electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the first region to the second region, and the second current has an orientation from the fifth region to the fourth region.

6. The magnetic device according to claim 2, wherein
the controller is configured to set the first stacked body in the first high electrical resistance state and set the second stacked body in the second high electrical resistance state in the initialization operation,
when the first input is "0", in the first operation, the first current has an orientation from the first region to the second region, and the second current has an orientation from the fifth region to the fourth region, and
when the first input is "1", in the first operation, the first current has an orientation from the second region to the first region, and the second current has an orientation from the fourth region to the fifth region.

7. The magnetic device according to claim 2, wherein
the controller is configured to set the first stacked body in the first high electrical resistance state and set the second stacked body in the second low electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the second region to the first region, and the second current has an orientation from the fifth region to the fourth region.

8. The magnetic device according to claim 2, wherein
the controller is configured to set the first stacked body in the first low electrical resistance state and set the second stacked body in the second high electrical resistance state in the initialization operation,
when the first input is "0", in the first operation, the first current has an orientation from the first region to the second region, and the second current has an orientation from the fifth region to the fourth region, and
when the first input is "1", in the first operation, the first current has an orientation from the second region to the first region, and the second current has an orientation from the fourth region to the fifth region.

9. The magnetic device according to claim 2, wherein
the controller is configured to set the first stacked body in the first high electrical resistance state and set the second stacked body in the second high electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the second region to the first region, and the second current has an orientation from the fourth region to the fifth region.

10. The magnetic device according to claim 2, wherein
the controller is configured to set the first stacked body in the first low electrical resistance state and set the second stacked body in the second low electrical resistance state in the initialization operation,
when the first input is "0", in the first operation, the first current has an orientation from the second region to the first region, and the second current has an orientation from the fourth region to the fifth region, and
when the first input is "1", in the first operation, the first current has an orientation from the first region to the second region, and the second current has an orientation from the fifth region to the fourth region.

11. The magnetic device according to claim 2, wherein
the controller is configured to set the first stacked body in the first high electrical resistance state and set the second stacked body in the second high electrical resistance state in the initialization operation,
when the first input is "0", in the first operation, the first current has an orientation from the second region to the first region, and the second current has an orientation from the fourth region to the fifth region, and
when the first input is "1", in the first operation, the first current has an orientation from the first region to the second region, and the second current has an orientation from the fifth region to the fourth region.

12. The magnetic device according to claim 2, wherein
the controller is configured to set the first stacked body in the first high electrical resistance state and set the second stacked body in the second high electrical resistance state in the initialization operation,
when the first input is "0", in the first operation, the first current has an orientation from the first region to the second region, and the second current has an orientation from the fifth region to the fourth region, and
when the first input is "1", in the first operation, the first current has an orientation from the second region to the first region, and the second current has an orientation from the fourth region to the fifth region.

13. The magnetic device according to claim 2, wherein
the controller is configured to set the first stacked body in the first low electrical resistance state and set the second stacked body in the second low electrical resistance state in the initialization operation,
when the first input is "0", in the first operation, the first current has an orientation from the second region to the first region, and the second current has an orientation from the fourth region to the fifth region, and
when the first input is "1", in the first operation, the first current has an orientation from the first region to the second region, and the second current has an orientation from the fifth region to the fourth region.

14. The magnetic device according to claim 1, wherein
the first set potential in the first operation when the second input is "0" is a second potential,
the first set potential in the first operation when the second input is "1" is a first potential,
the second set potential in the first operation when the second input is "0" is a third potential,
the second set potential in the first operation when the second input is "1" is a fourth potential,
an absolute value of a difference between the first potential and the second potential is larger than an absolute value of a difference between the first potential and the third potential, and larger than an absolute value of a difference between the second potential and the fourth potential, and
an absolute value of a difference between the third potential and the fourth potential is larger than the absolute value of the difference between the first potential and the third potential, and larger than the absolute value of the difference between the second potential and the fourth potential.

15. The magnetic device according to claim 14, wherein
the controller is configured to set the first stacked body in the first low electrical resistance state and set the second stacked body in the second high electrical resistance state in the initialization operation,
when the first input is "0", in the first operation, the first current has an orientation from the first region to the second region, and the second current has an orientation from the fourth region to the fifth region, and
when the first input is "1", in the first operation, the first current has an orientation from the second region to the first region, and the second current has an orientation from the fifth region to the fourth region.

16. The magnetic device according to claim 14, wherein
the controller is configured to set the first stacked body in the first low electrical resistance state and set the second stacked body in the second high electrical resistance state in the initialization operation,
when the first input is "0", in the first operation, the first current has an orientation from the second region to the first region, and the second current has an orientation from the fifth region to the fourth region, and
when the first input is "1", in the first operation, the first current has an orientation from the first region to the second region, and the second current has an orientation from the fourth region to the fifth region.

17. The magnetic device according to claim 14, wherein
the controller is configured to set the first stacked body in the first high electrical resistance state and set the second stacked body in the second high electrical resistance state in the initialization operation,
when the first input is "0", in the first operation, the first current has an orientation from the first region to the second region, and the second current has an orientation from the fifth region to the fourth region, and
when the first input is "1", in the first operation, the first current has an orientation from the second region to the first region, and the second current has an orientation from the fourth region to the fifth region.

18. The magnetic device according to claim 14, wherein
the controller is configured to set the first stacked body in the first low electrical resistance state and set the second stacked body in the second low electrical resistance state in the initialization operation,
when the first input is "0", in the first operation, the first current has an orientation from the first region to the second region, and the second current has an orientation from the fifth region to the fourth region, and
when the first input is "1", in the first operation, the first current has an orientation from the first region to the second region, and the second current has an orientation from the fourth region to the fifth region.

19. The magnetic device according to claim 14, wherein
the controller is configured to set the first stacked body in the first low electrical resistance state and set the second stacked body in the second high electrical resistance state in the initialization operation,
when the first input is "0", in the first operation, the first current has an orientation from the second region to the first region, and the second current has an orientation from the fifth region to the fourth region, and
when the first input is "1", in the first operation, the first current has an orientation from the first region to the second region, and the second current has an orientation from the fourth region to the fifth region.

20. The magnetic device according to claim 14, wherein
the controller is configured to set the first stacked body in the first high electrical resistance state and set the second stacked body in the second high electrical resistance state in the initialization operation,
when the first input is "0", in the first operation, the first current has an orientation from the first region to the second region, and the second current has an orientation from the fifth region to the fourth region, and when the first input is "1", in the first operation, the first current has an orientation from the second region to the first region, and the second current has an orientation from the fourth region to the fifth region.

\* \* \* \* \*